United States Patent [19]
Yoshimura et al.

[11] Patent Number: 6,081,632
[45] Date of Patent: *Jun. 27, 2000

[54] METHOD OF PRODUCING OPTICAL WAVEGUIDE SYSTEM, OPTICAL DEVICE AND OPTICAL COUPLER EMPLOYING THE SAME, OPTICAL NETWORK AND OPTICAL CIRCUIT BOARD

[75] Inventors: Tetsuzo Yoshimura; Wataru Sotoyama; Katsusada Motoyoshi; Takeshi Ishitsuka; Koji Tsukamoto; Shigenori Aoki; Yasuhiro Yoneda; Satoshi Tatsuura; Haruhisa Soda; Tsuyoshi Yamamoto, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/951,576

[22] Filed: Oct. 16, 1997

Related U.S. Application Data

[63] Continuation of application No. 08/493,751, Jun. 22, 1995, abandoned.

[30] Foreign Application Priority Data

| Jun. 22, 1994 | [JP] | Japan | 6-140502 |
| Aug. 25, 1994 | [JP] | Japan | 6-200974 |
| Aug. 30, 1994 | [JP] | Japan | 6-204922 |
| Mar. 17, 1995 | [JP] | Japan | 7-059240 |
| Mar. 20, 1995 | [JP] | Japan | 7-061092 |

[51] Int. Cl.[7] .................................................. G02B 1/04
[52] U.S. Cl. ............................ 385/5; 385/50; 385/122; 385/143; 430/290; 430/321
[58] Field of Search .................................. 385/5, 39, 50, 385/122, 129–132, 141–143, 145; 430/290, 321, 945

[56] References Cited

U.S. PATENT DOCUMENTS

| 4,087,159 | 5/1978 | Ulrich | 385/129 |
| 4,571,080 | 2/1986 | Papuchon et al. | 356/345 |
| 4,571,377 | 2/1986 | McGinniss et al. | 430/281.1 |
| 4,666,236 | 5/1987 | Mikami et al. | 385/51 |
| 5,028,105 | 7/1991 | Drexhage et al. | 385/33 |
| 5,292,620 | 3/1994 | Booth et al. | 430/290 |
| 5,460,907 | 10/1995 | Ducharme et al. | 385/5 X |

FOREIGN PATENT DOCUMENTS

| 0 262 409 A2 | 4/1988 | European Pat. Off. . |
| 0 358 476 | 3/1990 | European Pat. Off. . |
| 0 386 958 A2 | 9/1990 | European Pat. Off. . |

(List continued on next page.)

OTHER PUBLICATIONS

Frisken, S. J., Optics Letters, *Optical Society of America*, vol. 18, No. 13, Jul. 1, 1993, pp. 1035–1037.

"Two–wavelength photorefractive dynamic optical interconnect"; R. McRuer et al.; Optics Letters; Nov. 1, 1989; 1, No. 21, Washington, DC; pp. 1174–1176.

(List continued on next page.)

*Primary Examiner*—John D. Lee
*Attorney, Agent, or Firm*—Armstrong, Westerman, Hattori, McLeland & Naughton

[57] ABSTRACT

A method of forming waveguides, refractive index distributions and optical couplings automatically by light incidence, and devices obtained thereby. A non-linear optical material which has excellent properties of a large degree of freedom for an optical circuit substrate composition, etc. is used for optical circuit devices and optical circuit substrates. A photoelectric device containing an organic conjugated polymer film is deposited on a substrate by vapor deposition polymerization as at least one function layer. An optical network is provided with optical wiring for exchanging signals between processing elements selected from electronic elements, electronic apparatuses, electrooptical elements and electrooptical apparatuses.

25 Claims, 99 Drawing Sheets

FOREIGN PATENT DOCUMENTS

| | | |
|---|---|---|
| 0 449 125 A2 | 10/1991 | European Pat. Off. . |
| 0 452 895 A1 | 10/1991 | European Pat. Off. . |
| 0461719 | 12/1991 | European Pat. Off. ............... 385/5 |
| 0 472 296 A1 | 2/1992 | European Pat. Off. . |
| 0 506 368 A2 | 9/1992 | European Pat. Off. . |
| 0 541 303 A2 | 5/1993 | European Pat. Off. . |
| 0 617 314 A1 | 9/1994 | European Pat. Off. . |
| 59-222820 | 12/1984 | Japan . |
| 2281047 | 11/1990 | Japan . |
| 4204423 | 7/1992 | Japan . |
| 5142599 | 6/1993 | Japan . |
| 5265063 | 10/1993 | Japan . |
| 2 272 306 | 5/1994 | United Kingdom . |
| WO91/10149 | 7/1991 | WIPO . |

OTHER PUBLICATIONS

Quantum Well and Superlattice Physics V, Los Angeles, CA, USA, 24–25 Jan. 1994, vol. 2139, ISSN 0277–786X, Proceedings of the SPIE—The International Society for Optical Engineering, 1994, USA, pp. 309–320, XP000603602.

Zayats A V et al: "Optical transitions and nonlinearities in amorphous Si/SiO/sub 2/quantum structures" chapters I & II *pp. 309–310*, *SPIE*, vol. 2139, 1994.

WO 93/08574 A (British Telecommunications Public Limited Company). "Optical Memory", Apr. 1993.

WO 93/07179 A (Institut Fur Neue Materialien Gemeinnutzige). "Composite Materials Containing Nanoscalar Particles, Process For Producing Them And Their Use For Optical Components", Apr. 1993.

WO 90/10884 A (Pacific Bell). "Improved Fiber Optic Distribution System", Sep. 1990.

Applied Physics Letters, vol. 62, No. 24, Jun. 14, 1993, pp. 3068–3070, XP000380957 Tumolillo Jr. T A et al: "Multi-level Registered Polymeric Mach–Zehnder Intensity Modulator Array".

Thin Solid Films, vol. 244, No. 1/02, May 15, 1994, pp. 1007–1011, XP000468018 Hodge P et al: "Efficient Second–Harmonic Generation From All–Polymeric Langmuir–Blodgett "AB" FIlms Containing Up To 600 Layers".

Proceedings of the European Conference on Optical Communication (EC, Amsterdam, Sep. 16–20, 1990 Post Deadline Papers, vol. 3, Sep. 16, 1990, PTT Nederland and Philips Research Laboratories, pp. 1015–1018, XP000436529 Erman M et al: "INP Monolithically Integrated Passive Access Node Switches For Very High Speed Optical Loop".

Japanese Journal of Applied Physics, vol. 32, No. 12a, Dec. 1993, Tokyo JP, pp. L1746–L1749, XP002015570 K. Tajima: "All–Optical Switch With Switch–Off Time . . . ".

One World Through Communications, Florence, May 4,–8, 1992, vol. 1 of 3, Jan. 1, 1992, Institute of Electrical and Electronics Engineers, pp. 459–467, XP000300076 Jun Nishikido et al: "Optical Routing Control Using Coherent Pattern–Matching Circuit For Photonic Self–Routing Switch".

Proceedings of the 5th Toyota Conference on Nonlinear Optical Materials, Oct. 6–9, 1991, Aichi–Ken Japan, pp. 317–322, XP002016713 Tetsuzo Yoshimura et al: "One–Dimensional Conjugated Polymer Film And Quantum Well Fabrication By Molecular Layer Deposition (MLD) And Chemical Vapor Deposition".

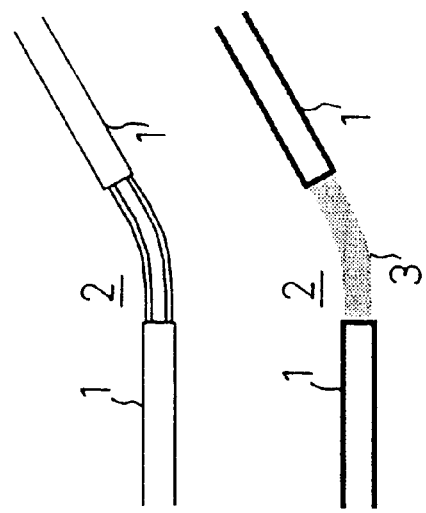
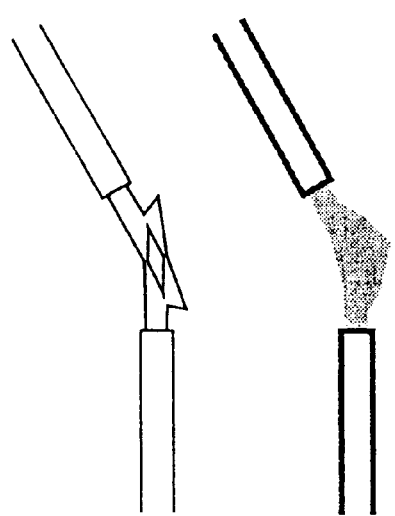
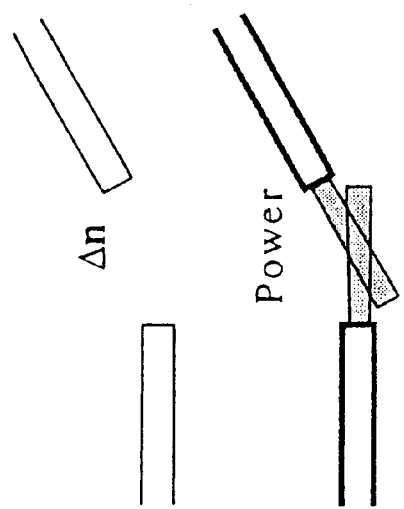
Fig. 3

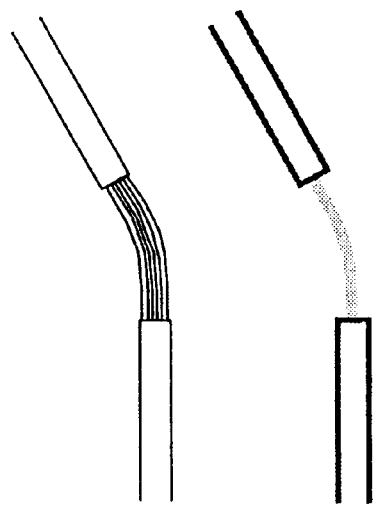
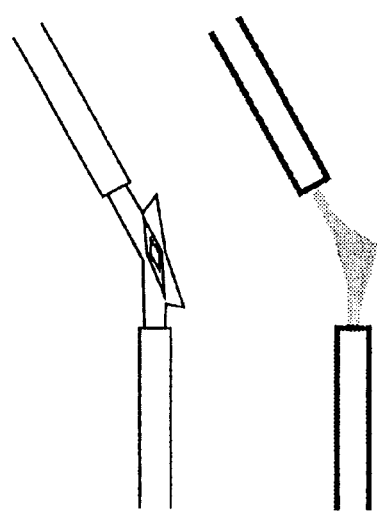
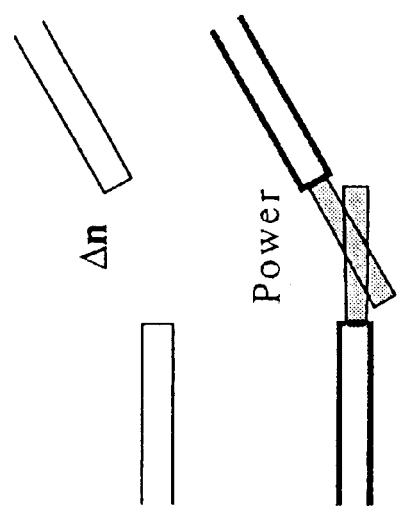
Fig. 4

HIGH REFRACTIVE INDEX MONOMER

LOW REFRACTIVE INDEX HOST MATRIX

MIGRATION OF HIGH REFRACTIVE INDEX MONOMER TO RHOTOPOLYMERIZED SECTION

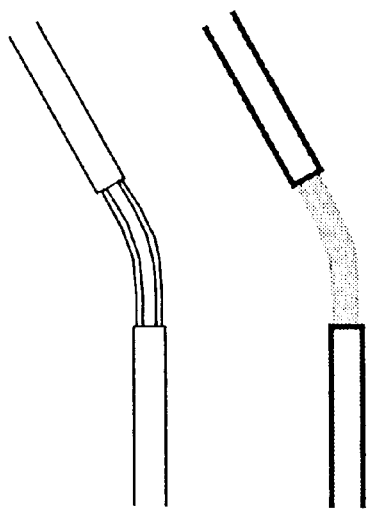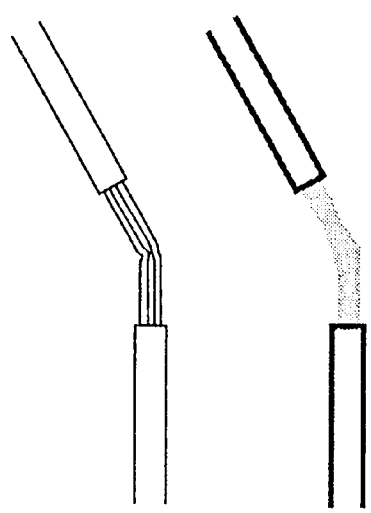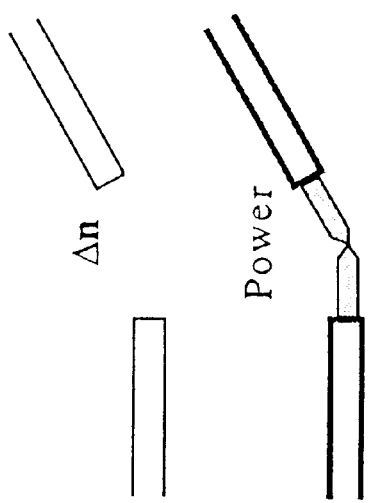
Fig. 6

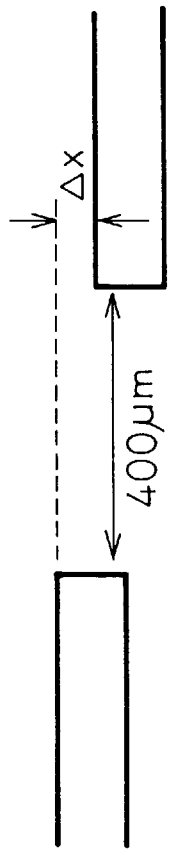
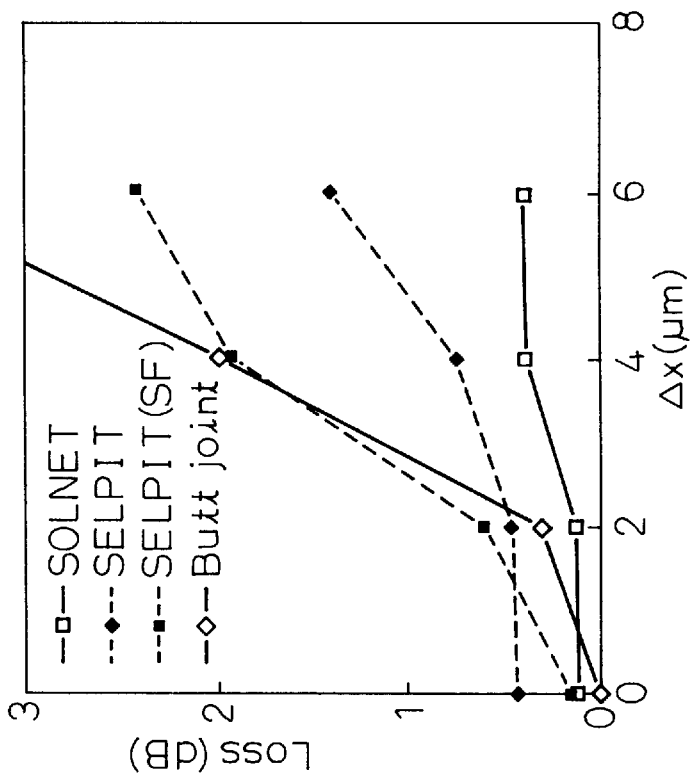
Fig. 13A
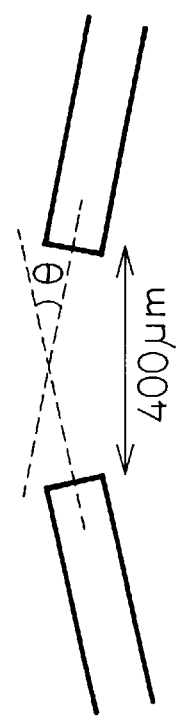
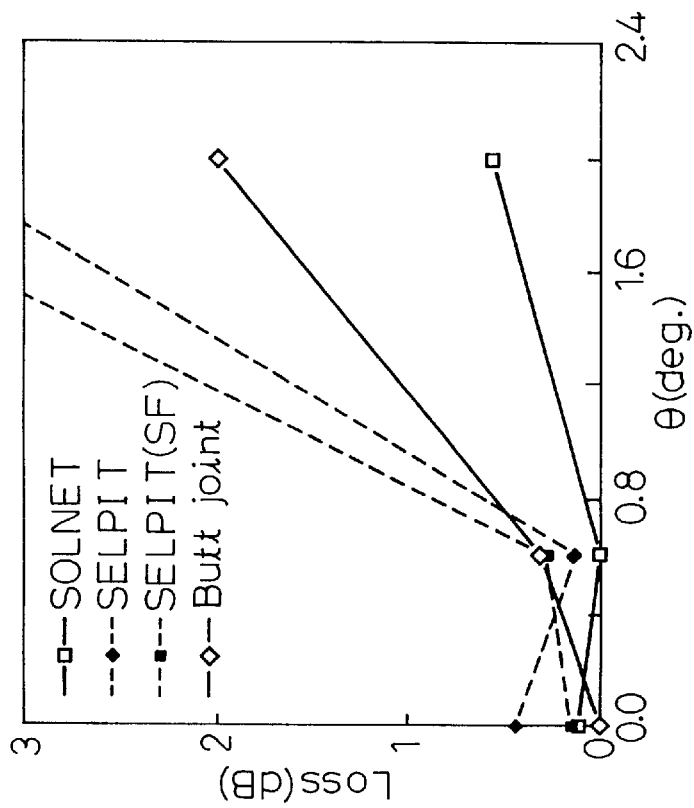
Fig. 13B

Fig.21
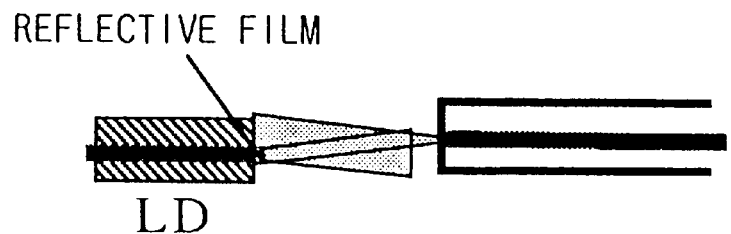
Fig.22
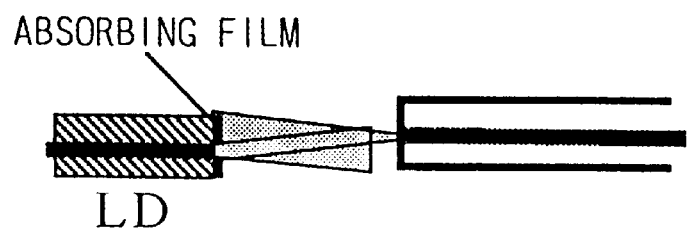

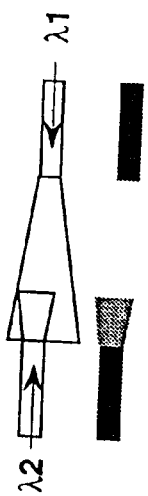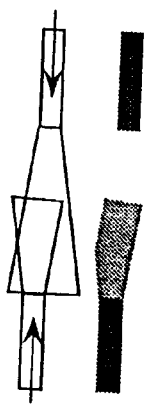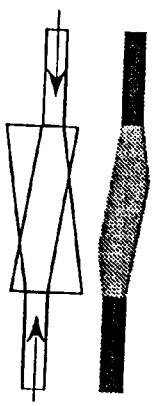
Fig. 31

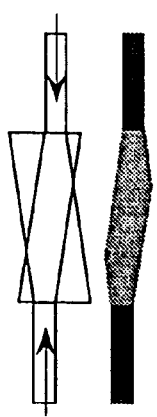
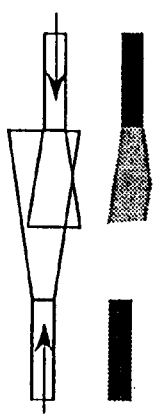
Fig. 32
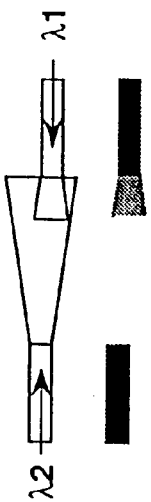

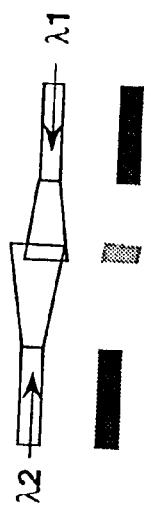
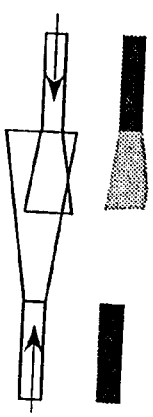
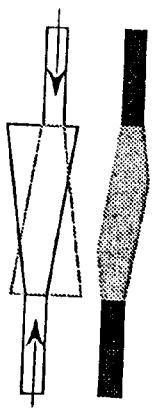
Fig. 33

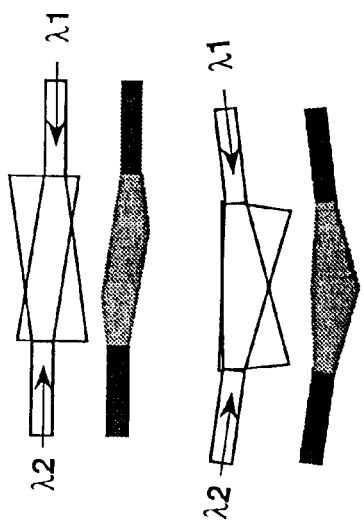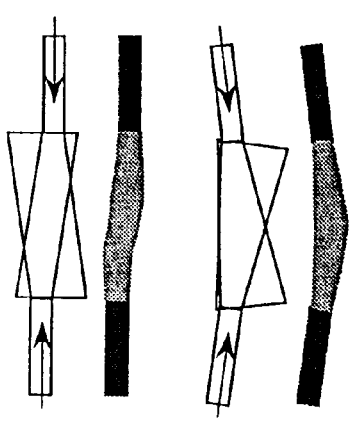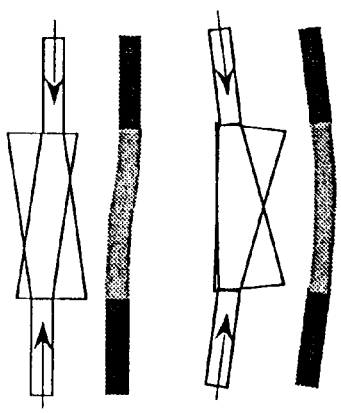
Fig. 34

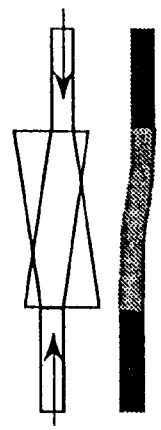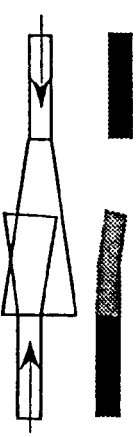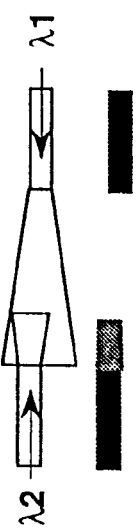
Fig. 35

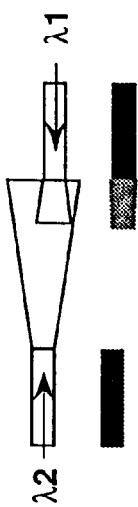
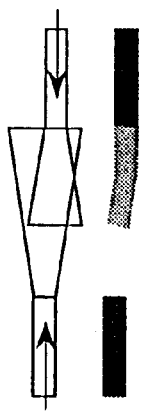
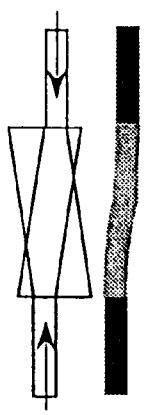
Fig. 36

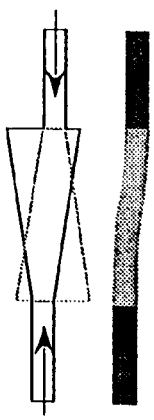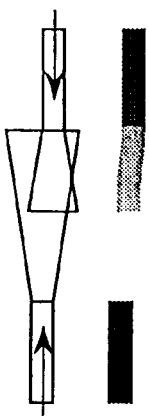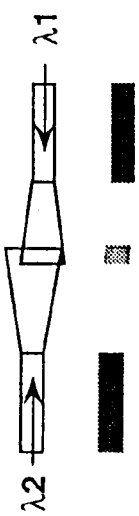
Fig. 37

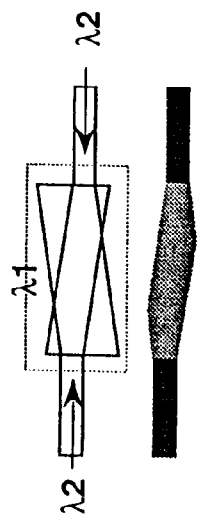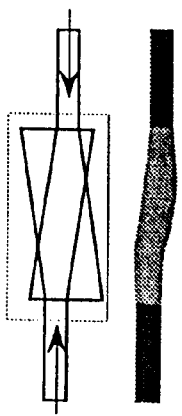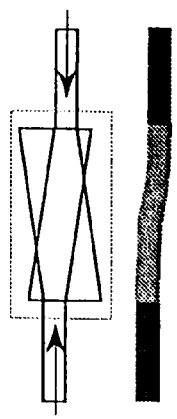
Fig. 39

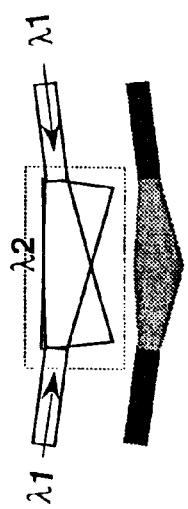
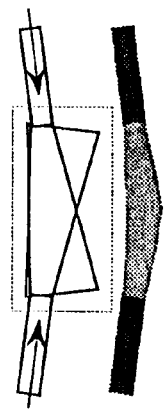
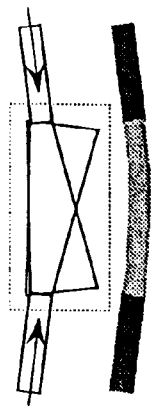
Fig. 40

Fig.45
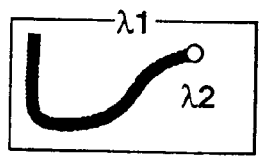 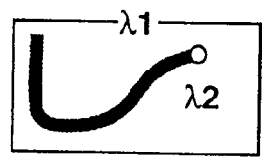 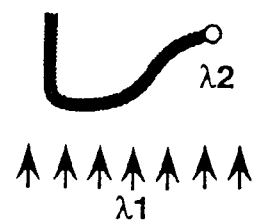

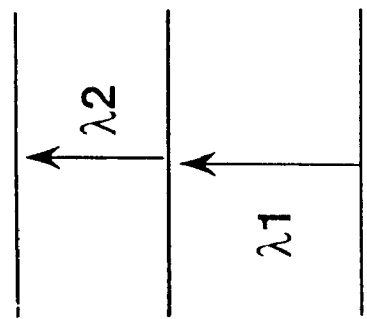
Fig. 47
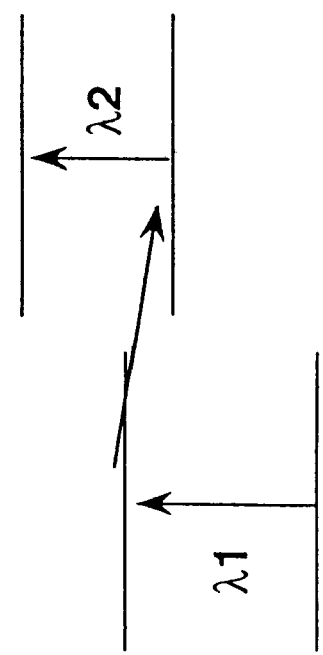

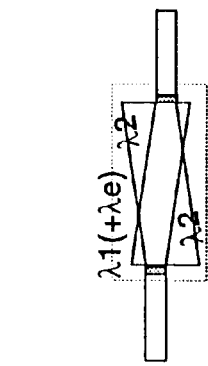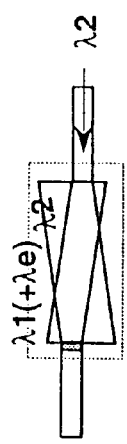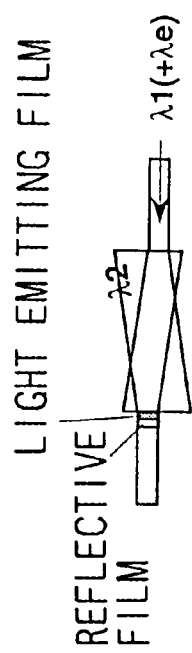
Fig. 49

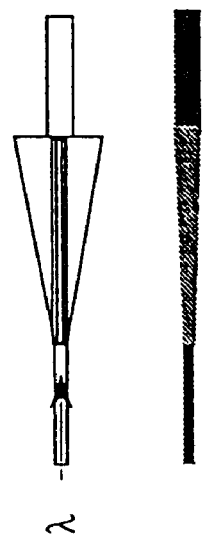
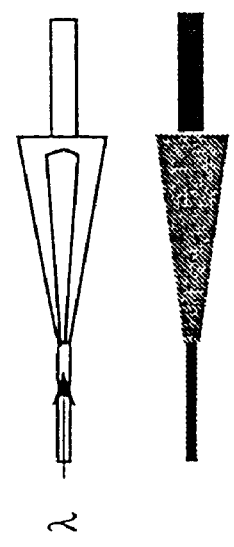
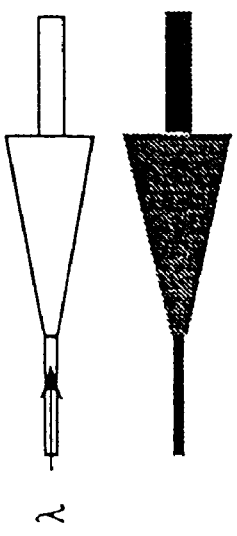
Fig. 53

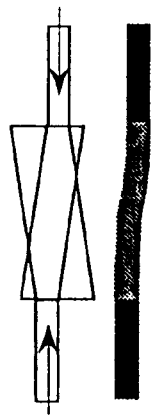
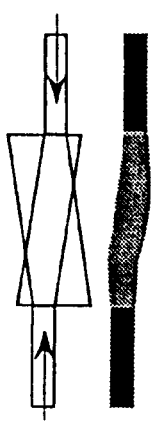
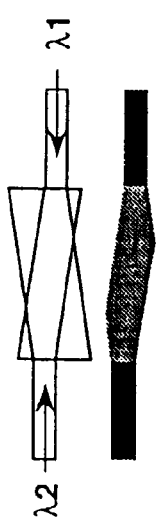
Fig. 54
SENSITIZATION DYE IS SENSITIVE TO BOTH $\lambda 1$ AND $\lambda 2$

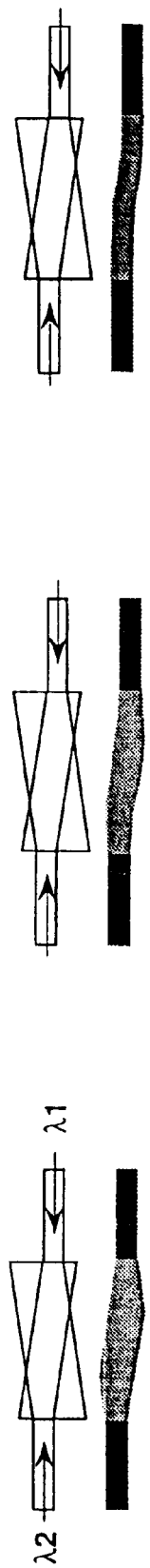

Fig.58
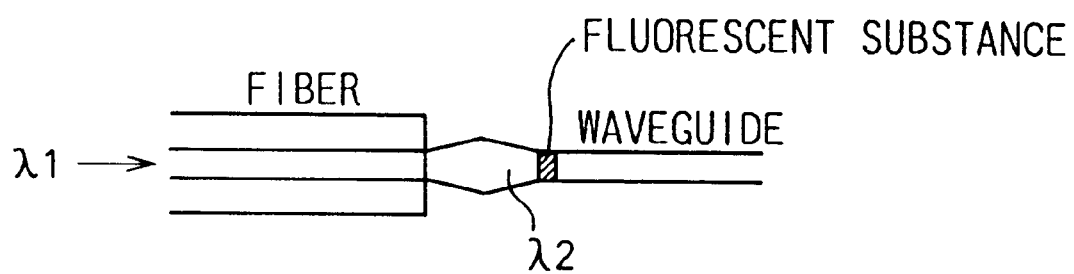
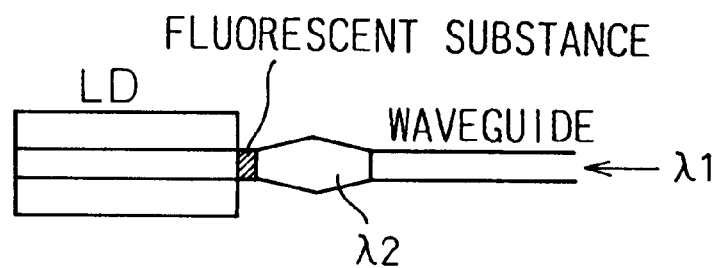
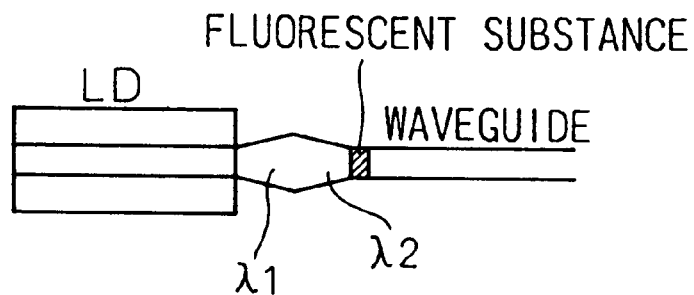

PHOTOREFRACTIVE POLYMER

OPTICAL DEVICE

WRITING

OPTICAL COUPLING

WRITING

OPTICAL COUPLING

Fig. 71

| SUBSTRATE |
|---|
| LHG5:Nd |
| IrO$_x$ |
| WO$_y$ |
| LHG5:Nd |
| IrO$_x$ |
| WO$_y$ |
| LHG5:Nd |

Fig. 72

| SUBSTRATE |
|---|
| Nd$_2$O$_3$ |
| Li$_2$O |
| Nb$_2$O$_5$ |
| Nd$_2$O$_3$ |
| Li$_2$O |
| Nb$_2$O$_5$ |
| Nd$_2$O$_3$ |

Fig. 73

| SUBSTRATE |
|---|
| $SiN_x$ |
| $SiN_y$ |
| $SiN_z$ |
| $SiN_x$ |
| $SiN_y$ |
| $SiN_z$ |
| $SiN_x$ |

Fig. 74

| SUBSTRATE |
|---|
| $Ir_a Ta_{a'} W_{1-a-a'} O_x$ |
| $Ir_b Ta_{b'} W_{1-b-b'} O_x$ |
| $Ir_c Ta_{c'} W_{1-c-c'} O_x$ |
| $Ir_a Ta_{a'} W_{1-a-a'} O_x$ |
| $Ir_b Ta_{b'} W_{1-b-b'} O_x$ |
| $Ir_c Ta_{c'} W_{1-c-c'} O_x$ |
| $Ir_a Ta_{a'} W_{1-a-a'} O_x$ |

Fig. 75

| SUBSTRATE |
|---|
| $Ir_a Ta_{a'} W_{1-a-a'} O_x : Nd$ |
| $Ir_b Ta_{b'} W_{1-b-b'} O_x : Nd$ |
| $Ir_c Ta_{c'} W_{1-c-c'} O_x : Nd$ |
| $Ir_a Ta_{a'} W_{1-a-a'} O_x : Nd$ |
| $Ir_b Ta_{b'} W_{1-b-b'} O_x : Nd$ |
| $Ir_c Ta_{c'} W_{1-c-c'} O_x : Nd$ |
| $Ir_a Ta_{a'} W_{1-a-a'} O_x : Nd$ |

Fig. 76

| SUBSTRATE |
|---|
| $Si:H$ |
| $Si:H:B$ |
| $Si:H:P$ |
| $Si:H$ |
| $Si:H:B$ |
| $Si:H:P$ |
| $Si:H$ |

Fig. 77

SUBSTRATE

| $SiO_x$:Ta |
| $SiO_x$:Ir |
| $SiO_x$:W |
| $SiO_x$:Ta |
| $SiO_x$:Ir |
| $SiO_x$:W |
| $SiO_x$:Ta |

Fig. 78

SUBSTRATE

| LHG5:$Nd_x$ |
| LHG5:$Nd_y$ |
| LHG5:$Nd_z$ |
| LHG5:$Nd_x$ |
| LHG5:$Nd_y$ |
| LHG5:$Nd_z$ |
| LHG5:$Nd_x$ |

SiN_y
Si:H $Ir_a Ta_{a'} W_{1-a-a'} O_x$
$Ir_b Ta_{b'} W_{1-b-b'} O_x$

SUBSTRATE
LHG5:Nd$_x$
LHG5:Nd$_y$

MOLECULE     RING-SHAPED MOLECULE     SPHERICAL MOLECULE

NLO MOLECULE

Fig. 88A
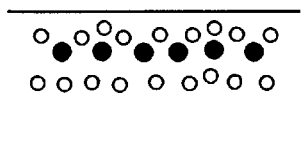
Fig. 88B
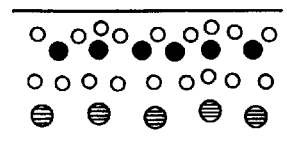
Fig. 88C
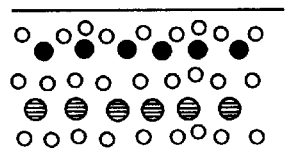
Fig. 88D
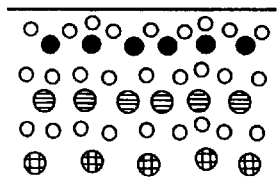
Fig. 88E
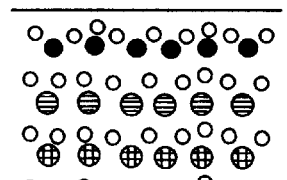
Fig. 88F
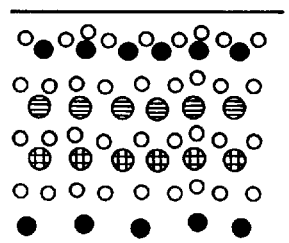
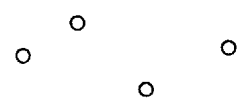
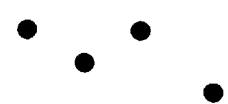

Fig.89A 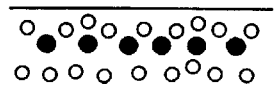 
Fig.89B 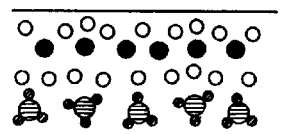 
Fig.89C 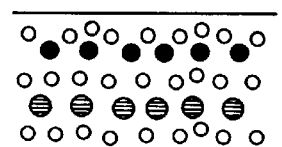 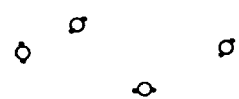
Fig.89D 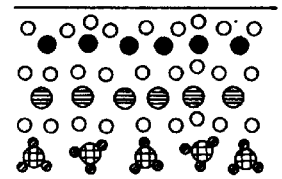 
Fig.89E 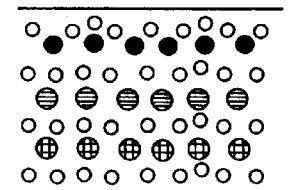 
Fig.89F 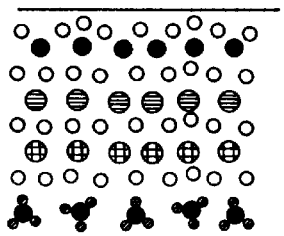 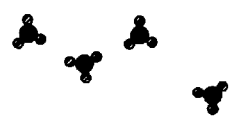

Fig. 90A
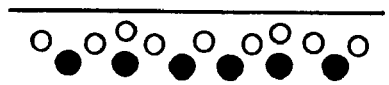
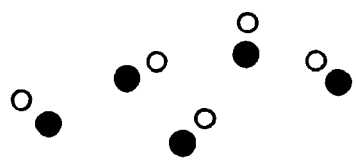
Fig. 90B
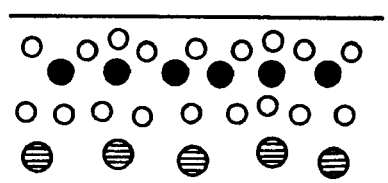
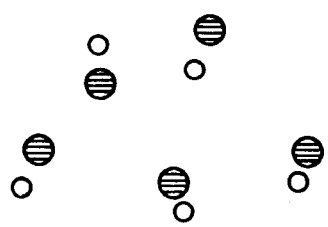
Fig. 90C
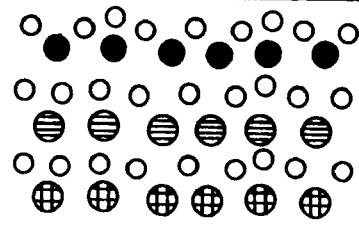
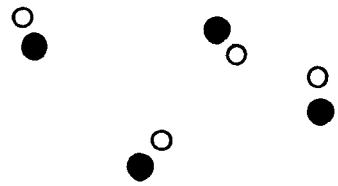
Fig. 90D
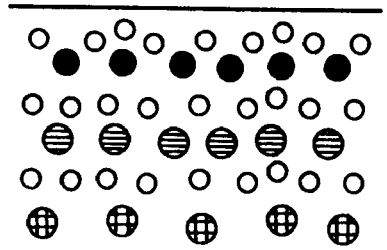
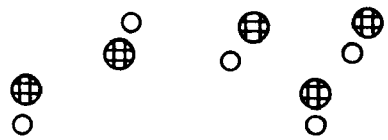

NON-LINEAR OPTICAL WAVEGUIDE

NON-LINEAR OPTICAL WAVEGUIDE

NON-LINEAR OPTICAL WAVEGUIDE

METHOD OF PRODUCING OPTICAL WAVEGUIDE SYSTEM, OPTICAL DEVICE AND OPTICAL COUPLER EMPLOYING THE SAME, OPTICAL NETWORK AND OPTICAL CIRCUIT BOARD

This application is a continuation of application Ser. No. 08/493,751 filed Jun. 22, 1995, now abandoned.

BACKGROUND AND SUMMARY OF THE INVENTION

The present invention relates to a method of producing an optical waveguide system, an optical device and optical coupler employing the optical waveguide system, an optical network and an optical circuit board.

In one aspect, present invention relates to a method of producing optical waveguide systems. To be more specific, the present invention relates to a method of producing optical waveguide systems, refractive index distributions and optical coupling paths by self-organization. The method of the present invention may be used with advantages for the production of optical waveguide systems, particularly bend waveguides, space beam couplers, Z-axis waveguides, waveguide couplers, LD couplers, branch waveguides, star couplers, cross waveguides, space waveguides, wavelength filters and mode converters.

The fields of data processing and communication have seen dramatic progress in the area of optical wiring and interconnection, and the diffusion of optical technology such as optical parallel processors and "fiber to the home" is expected to continue in the future. This will require various types of optical integrated circuits such as waveguide devices, while it will also be necessary to simplify and render more efficient optical coupling between various optical devices, including fibers.

Although there have been conventionally known methods such as etching as methods of forming waveguides, a disadvantage of this method is the low positioning precision and low degree of freedom of shape.

Nevertheless, the following problems remain.

(1) Although improvement in positioning precision has been attempted by the V-groove method, performance which sufficiently satisfies the demands for high efficiency and high tolerance has not yet been achieved.

(2) The angles of divergence of emitted light from the different optical devices sometimes differ.

(3) The mode sizes of the emitting ends of the different optical devices sometimes differ.

Furthermore, in Japanese Unexamined Patent Publication Nos. 55-43538 and 60-173508, there have been proposed methods of improving optical coupling efficiency by irradiating light from a waveguide on a substance whose refractive index changes with light irradiation, to form a lens-like refractive index distribution or waveguide. However, since these methods do not employ a self-focusing effect, a self-organizing effect of the waveguide itself is not obtained, and therefore the degree of efficiency improvement, safety and the degree of freedom of the device structure is less than sufficient.

The present invention is aimed at solving the above-mentioned problems of the prior art, by realizing a method of producing a waveguide or refractive index distribution which is self-organized using a substance whose optical refractive index changes with light irradiation (hereunder referred to as "photorefractive" or a substance which insolubilizes (cures) as its optical refractive index changes with light irradiation (hereunder referred to as "photosensitive material"), as well as a device which employs the same.

It is an object of the present invention, therefore, to provide a method of automatically burrowing out a waveguide by light incidence and a device formed thereby; a method of forming a waveguide circuit network by automatically combining a few waveguides created by light incidence and a method of producing tapered and other refractive index distributions formed by a self-focusing effect and a device formed thereby; and a self-aligned optical coupler employing a waveguide or refractive index distribution obtained in such a manner.

It is another object of the present invention to overcome the above-mentioned problems (1)–(3) by forming refractive index distributions in photorefractive materials and photosensitive materials by light emission from emitting ends of optical devices, and to provide structures and methods of production which may be applied to various devices and modules.

It will be convenient according to the present invention to refer to these devices and optical couplers collectively as self-organized lightwave networks (SOLNET).

According to the present invention, in order to overcome the above-mentioned problems, there is provided a method of producing an optical waveguide or refractive index distribution which is characterized by irradiating a photorefractive material with light of a wavelength which changes its refractive index, and forming an optical waveguide or refractive index distribution while inducing self-focusing.

There is also provided according to the present invention a method of producing an optical waveguide or refractive index distribution which is characterized by irradiating a photosensitive material with light of a wavelength which changes its refractive index and insolubilizes the material, and forming an optical waveguide or refractive index distribution while inducing self-focusing and insolubilizing the photosensitive material.

There is also provided according to the present invention a self-aligned optical coupling method which is characterized by situating an a photorefractive material in the entirety or part of the area between a plurality of optical devices, irradiating the photorefractive material with light from one or a plurality of optical devices of a wavelength at which its refractive index changes, and using the optical waveguide or refractive index distribution formed while inducing self-focusing, to accomplish optical coupling between the optical devices.

There is also provided according to the present invention a self-aligned optical coupling method which is characterized by situating a photosensitive material in the entirety or part of the area between a plurality of optical devices, irradiating the photosensitive material with light from one or a plurality of optical devices of a wavelength at which its refractive index changes and the material is insolubilized, and using the optical waveguide or refractive index distribution formed while inducing self-focusing and insolubilizing the photosensitive material, to accomplish optical coupling between the optical devices.

There is also provided according to the present invention a method of forming a waveguide, refractive index distribution or optical coupling path as described above using light of a plurality of wavelengths, either with or without self-focusing.

In another aspect, the present invention relates to a non-linear optical material, and an optical circuit device and optical circuit substrate in which it is used.

Optical circuits are predicted to play an important role in the optical interconnections of parallel computers and in various optical systems such as optical switching systems in the future. Non-linear optical devices, and particularly electro-optical (EO) devices, optical waveguide amplifiers and optical waveguide lasers, are indispensable elementary technologies for the function of these optical circuits.

Although LN (LiNbO$_3$) single crystals and compound semiconductor superlattices were used as EO materials in the past, these materials have problems including a low degree of freedom for the substrate composition, requiring considerable labor for lamination, having a high dielectric constant, not facilitating low power and high-speed driving, being difficult to apply to a large surface area, and being difficult to combine with other devices.

In contrast, since organic polymer materials have the characteristics of a large degree of freedom for substrate composition, easy lamination, low dielectric constant, being suited for low power and high-speed driving, easy application over a large surface area and being able to be easily combined with other devices, they are suitable for increasing the functions and degree of integration of optical circuits. At present, however, there is apprehension concerning the reliability of these materials due to the occurrence of relaxation deterioration.

In addition, we previously proposed a process using an optical power source as a useful optical wiring process (such as in Japanese Patent Application No. 6-5009231). This process consisted of allowing pump light to enter a waveguide optical amplifier and waveguide laser, forming an optical power source, picking up the light by an EO switch and then transmitting optical signals. In this case, since the optical power source itself does not have remarkable EO effects, it was necessary to laminate or insert an EO layer.

In the second aspect of the present invention, it is an object to further improve on the above-mentioned proposed technology and provide a non-linear optical material, optical power source, optical waveguide laser and optical waveguide amplifier that have EO effects, as well as non-linear optical devices, non-linear optical amplifier, optical waveguide laser and optical circuit substrate that use the above, that have a large degree of freedom for the substrate composition, facilitate easy lamination, have a low dielectric constant, are suited to low power and high-speed driving, are easily applied to large surface areas, and can be easily combined with other devices.

In order to solve the above-mentioned problems, the present invention provides a non-linear optical material comprising a multi-layer film that contains an amorphous or polycrystalline inorganic substance; wherein, centro-symmetry in the direction of film thickness is eliminated by laminating different substances, centro-symmetry is eliminated by changing the composition of the same type of substance, changing the type of doping substance and/or amount of doping, or changing layer thickness and/or the amount of doping, or centro-symmetry is eliminated by combining either of the above two methods.

The present invention also provides a non-linear optical material comprising a multi-layer film containing an organic crystal material, an amorphous material, a polycrystalline material or a single crystal material; wherein, centro-symmetry in the direction of film thickness is eliminated by laminating different substances, centro-symmetry is eliminated by changing the composition of the same type of substance, changing the type of doping substance and/or amount of doping, or changing layer thickness and/or the amount of doping, or central symmetry is eliminated by combining either of the above two methods.

The present invention also provides a non-linear optical material wherein rare earth ions or molecules containing rare earth ions are contained in a non-linear optical polymer.

Moreover, the present invention provides a non-linear optical device, non-linear optical amplifier, optical waveguide laser and optical circuit substrate that use the above-mentioned material.

In the above-mentioned first non-linear optical material as claimed in the present invention, the multi-layer film preferably has for its main component a material selected from the group consisting of a-Si:H, a-SiNy, a-SiOx, a-SiCz and a-Ge:H, or a mixed crystal of two or more types of said materials. Alternatively, this multi-layer film may have for its main component a transition metal compound, a glass material, or these materials may contain rare earth ions as desired.

In the above-mentioned second non-linear optical material as claimed in the present invention, the multi-layer film preferably has for its main component an organic polymer, and said organic polymer may contain rare earth ions and/or molecules containing rare earth ions as desired.

In a further aspect, the present invention relates to an opto-electronic device and a method of preparing it. More specifically, the present invention particularly uses an organic conjugated polymer film formed by vapor deposition polymerization as a functional layer of an opto-electronic device. Examples of said opto-electronic device include useful light emitting devices such as a light emitting display, laser and interior lighting, light receiving devices such as a photodiode, as well as solar cells.

EL (electro-luminescent) devices using inorganic materials were known as examples of light emitting devices of the prior art. Although these devices emitted red to blue light by adding Mn or Tb and so forth to ZnS and ZnSe, since the emission efficiency at a driving voltage of 20 V and above was a maximum of roughly only 1%, it was difficult to obtain devices having large surface areas such as displays.

As examples of devices such as LED that use organic materials, high-luminance light emitting devices are known to be able to manufactured by forming an organic monomer film by vapor deposition. However, monomer films have the problems of decreased emission efficiency due to crystallization, inadequate film strength and insufficient durability. In addition, devices able to emit red to blue light are also known to be able to be manufactured by forming an organic polymer film by spin coating or dip coating. In this case, however, there was the problem of solvent remaining in the resulting film since the organic polymer had to be dissolved in solvent during coating. In addition, since the polymer had to be given a soluble portion for solubilization of the polymer, there was also the problem of decreased emission efficiency.

On the other hand, in the case of lasers, photodiodes, solar cells and so forth, it is still difficult to produce these devices at the practical level using organic polymers.

In the third aspect, in order to solve the problems of the prior art as described above, the object of the present invention is to realize a sufficiently practical opto-electronic device by using an organic polymer.

In order to solve the above-mentioned problems, the present invention provides an opto-electronic device containing an organic conjugated polymer film deposited on a substrate by vapor deposition polymerization as at least one functional layer.

Examples of opto-electronic devices obtained by the present invention include useful light emitting devices such as light emitting displays, lasers and interior lighting, light receiving devices such as photodiodes, as well as solar cells.

In a further aspect of the present invention relates to optical networks and optical circuit boards. Particularly, it relates to an optical network and optical circuit board capable of increasing the speed of computers.

The most effective method of speeding up computers is to make them parallel. In order to achieve this, it is important to raise the wiring switching (exchange) efficiency. Conventional electrical exchange has required large switching apparatuses and massive consumption of power, thus frustrating efforts to realize compact systems.

In the fourth aspect, the main object of the present invention, therefore, is to improve this condition by forming a loop-shaped optical waveguide in an optical circuit board for packet exchange.

In order to overcome the above-mentioned problems, the present invention provides an optical network provided with optical wiring for exchanging signals between processing elements selected from electronic elements, electronic apparatuses, electro-optical elements and electro-optical apparatuses, which is characterized in that the optical paths form loops passing near all or some of the processing elements, and there are provided at least one each of an optical transmitter which sends optical signals to all or some of the processing elements and a receiver which converts the optical signals to electrical signals, which are coupled with the optical path loops.

BRIEF DESCRIPTION OF THE DRAWINGS

FIG. 3 is an illustrative view of other embodiments of the method of the present invention.

FIG. 4 is an illustrative view of other inappropriate examples.

FIG. 6 is an illustrative view of still another embodiment of the method of the present invention.

FIGS. 13A and 13B are graphs showing the light coupling Efficiency of FIGS. 11 and 12 in terms of dB.

FIG. 21 is an illustrative view of still another embodiment of the method of the present invention.

FIG. 22 is an illustrative view of still another embodiment of the method of the present invention.

FIG. 31 is an illustrative view for explanation of other examples of multiple wavelength writing.

FIG. 32 is an illustrative view for explanation of other examples of multiple wavelength writing.

FIG. 33 is an illustrative view for explanation of other examples of multiple wavelength writing.

FIG. 34 is an illustrative view for explanation of other examples of multiple wavelength writing.

FIG. 35 is an illustrative view for explanation of other examples of multiple wavelength writing.

FIG. 36 is an illustrative view for explanation of other examples of multiple wavelength writing.

FIG. 37 is an illustrative view for explanation of other examples of multiple wavelength writing.

FIG. 39 is an illustrative view for explanation of other examples of multiple wavelength writing.

FIG. 40 is an illustrative view for explanation of other examples of multiple wavelength writing.

FIG. 45 is an illustrative view for explanation of other examples of multiple wavelength writing.

FIG. 47 is an illustrative view for explanation of an example of a method using multi-level excitation.

FIG. 49 is an illustrative view of cases using luminescent radiation of light of a writing wavelength by optical excitation.

FIG. 53 is an illustrative view showing another example of a method of writing emitted light from an LD alone.

FIG. 54 is an illustrative view showing an example of adjusting the sensitivity range with a sensitizing agent.

FIG. 55 is an illustrative view showing another example of adjusting the sensitivity range with a sensitizing agent.

FIG. 58 is an illustrative view showing examples where fluorescent substances are placed to utilize the excited light therefrom.

FIG. 71 is a schematic drawing showing another example of a substance-modulated non-linear optical material.

FIG. 72 is a schematic drawing showing another example of a substance-modulated non-linear optical material.

FIG. 73 is a schematic drawing showing an example of a composition-modulated non-linear optical material.

FIG. 74 is a schematic drawing showing another example of a composition-modulated non-linear optical material.

FIG. 75 is a schematic drawing showing another example of a composition-modulated non-linear optical material.

FIG. 76 is a schematic drawing showing an example of a doping-modulated non-linear optical material.

FIG. 77 is a schematic drawing showing another example of a doping-modulated non-linear optical material.

FIG. 78 is a schematic drawing showing another example of a doping-modulated non-linear optical material.

FIG. 85 is a schematic drawing showing an example of a non-linear optical material containing a single atomic layer or single molecular layer.

FIG. 86 is a schematic drawing showing another example of a non-linear optical material containing a single atomic layer or single molecular layer.

FIG. 87 is a schematic drawing showing another example of a non-linear optical material containing a single atomic layer or single molecular layer.

FIGS. 88A–88F are schematic drawings showing a deposition process controlled at the atomic level.

FIGS. 89A–89F are schematic drawings showing a deposition process using a chemical reaction between reactive gases.

FIGS. 90A–90D are schematic drawings showing a deposition process performed by vapor deposition and CVD of the compounds.

FIG. 120 is an illustrative view showing an example of a crossbar-type optical network.

FIG. 121 is an illustrative view showing an example of a crossbar-type optical network.

FIG. 122 is an illustrative view showing an example of a crossbar-type optical network.

FIG. 123 is an illustrative view showing an example of a crossbar-type optical network.

FIG. 124 is an illustrative view showing an example of a loop-type optical network.

FIG. 125 is an illustrative view showing an example of a loop-type optical network.

FIG. 126 is an illustrative view showing an example of a loop-type optical network.

FIG. 127 is an illustrative view showing an example of a loop-type optical network.

FIG. 128 is an illustrative view showing an example of a loop-type optical network.

FIG. 129 is an illustrative view showing an example of a loop-type optical network.

FIG. 130 is an illustrative view showing an example of a loop-type optical network.

FIG. 131 is an illustrative view showing an example of a loop-type optical network.

Figure 132:
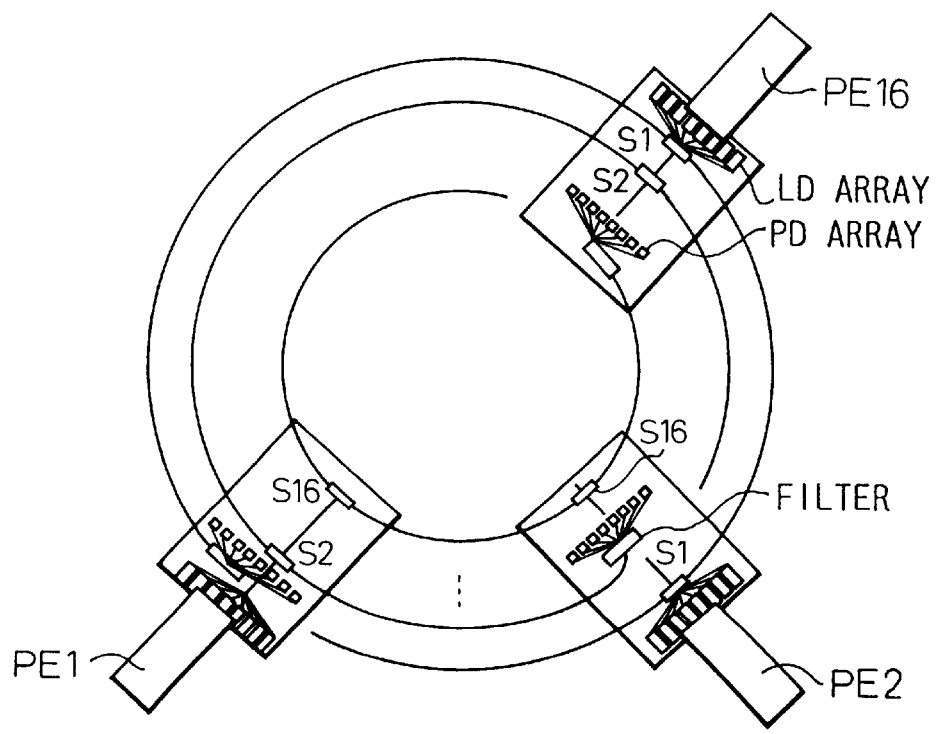

FIG. 132 is an illustrative view showing an example of a loop-type optical network.

Figure 133:
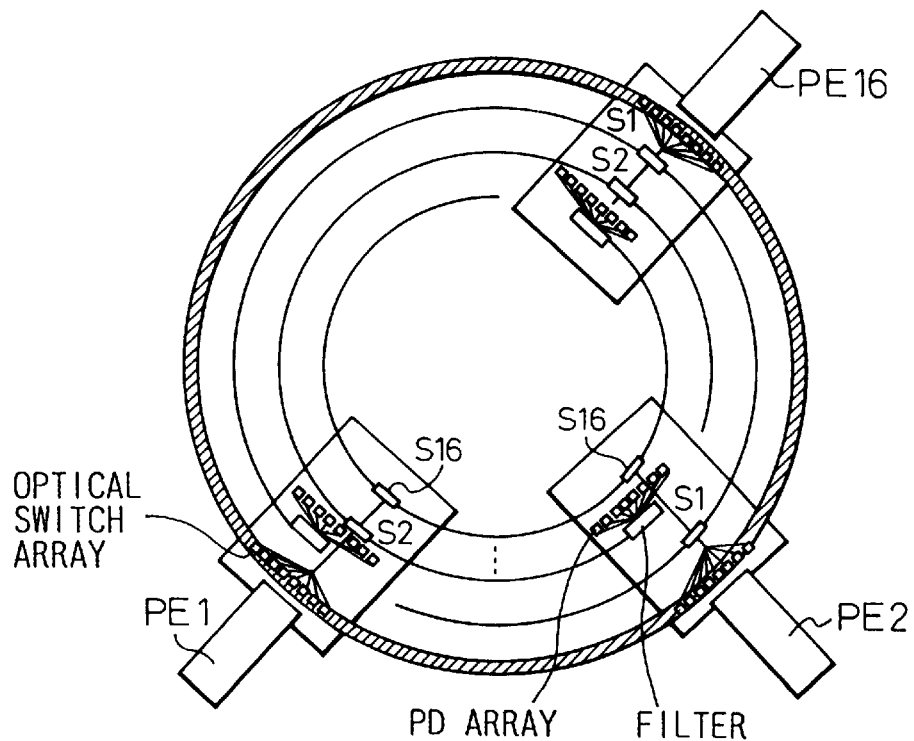

FIG. 133 is an illustrative view showing an example of a loop-type optical network.

Figure 134:
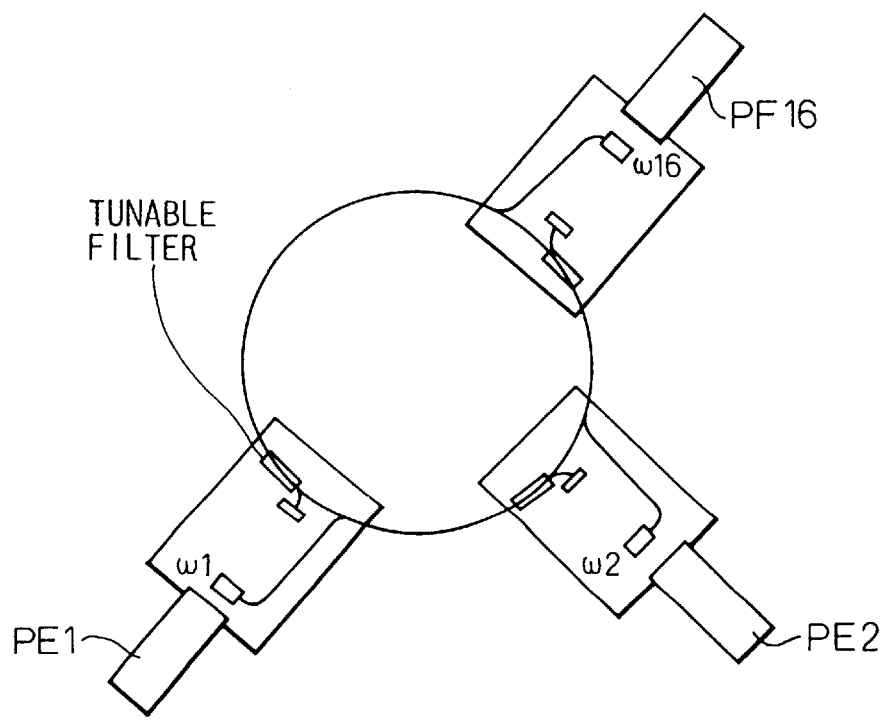

FIG. 134 is an illustrative view showing an example of a loop-type optical network.

Figure 135:
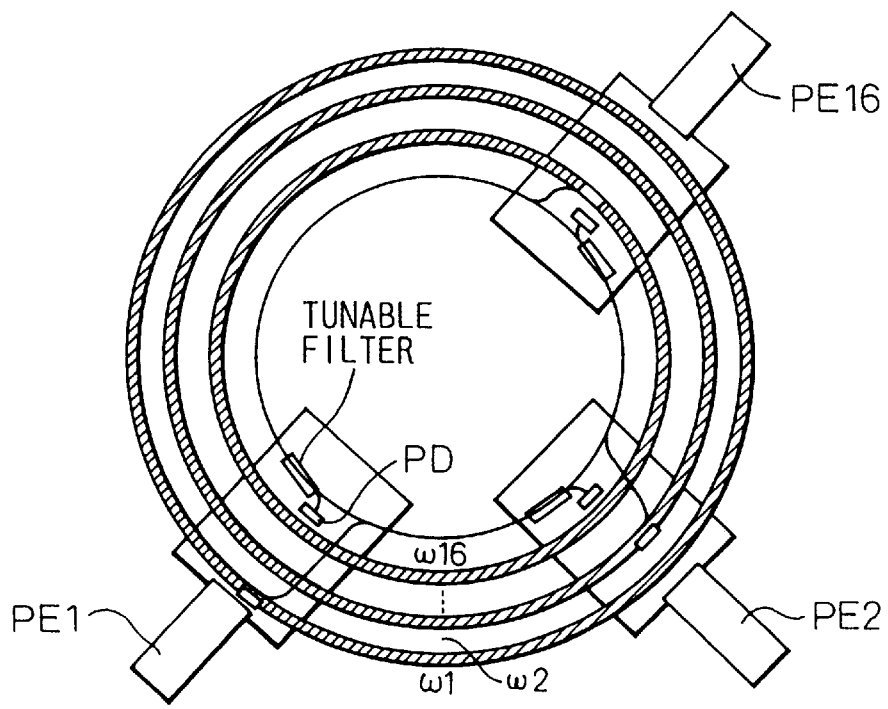

FIG. 135 is an illustrative view showing an example of a loop-type optical network.

Figure 136:
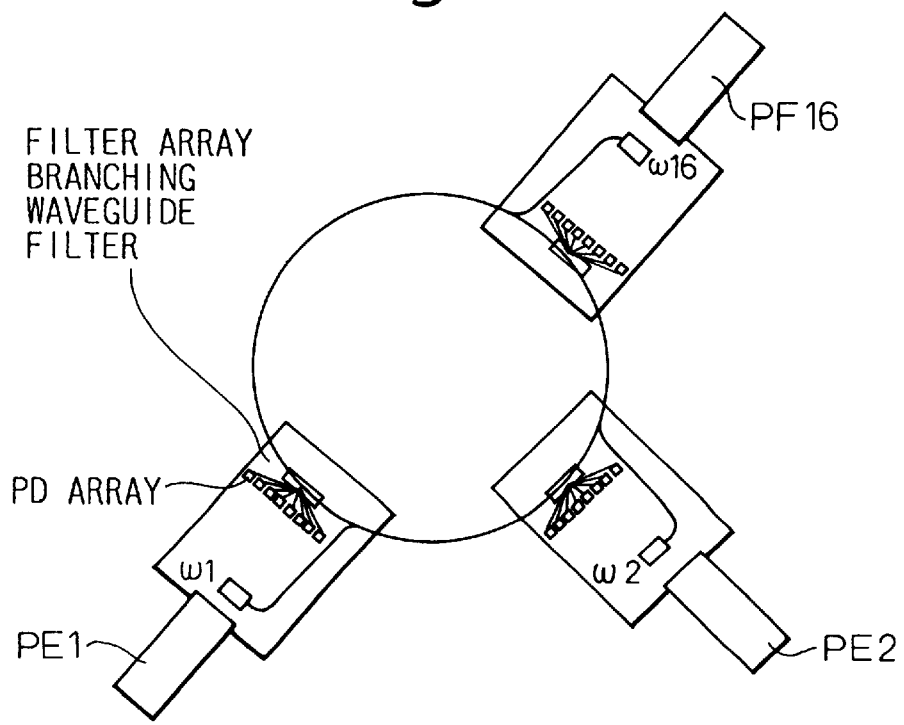

FIG. 136 is an illustrative view showing an example of a loop-type optical network.

Figure 137:
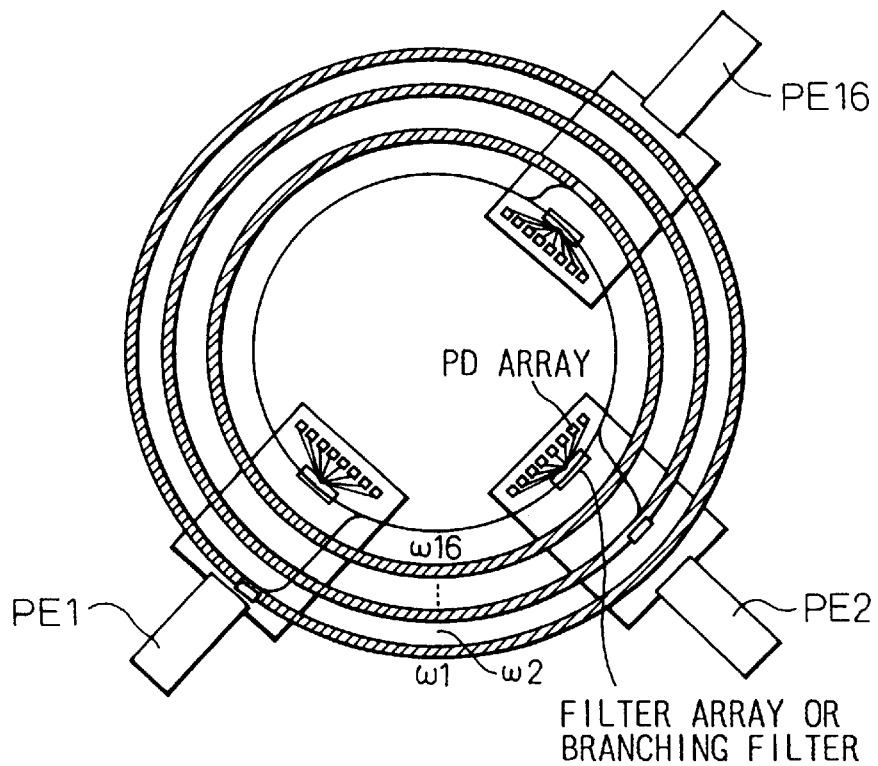

FIG. 137 is an illustrative view showing an example of a loop-type optical network.

Figure 138:
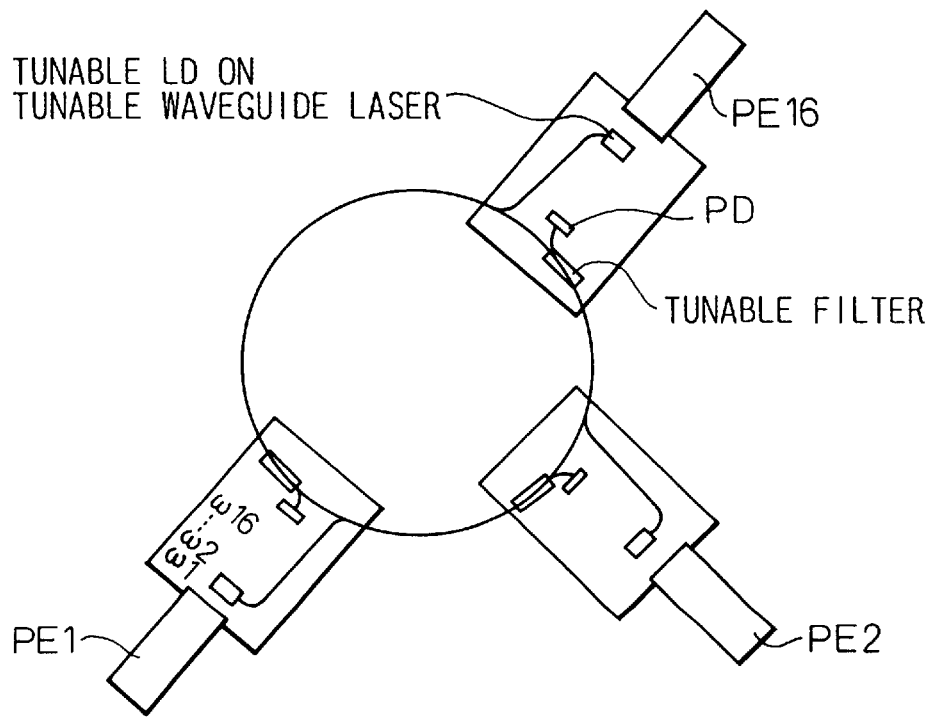

FIG. 138 is an illustrative view showing an example of a loop-type optical network.

Figure 139:
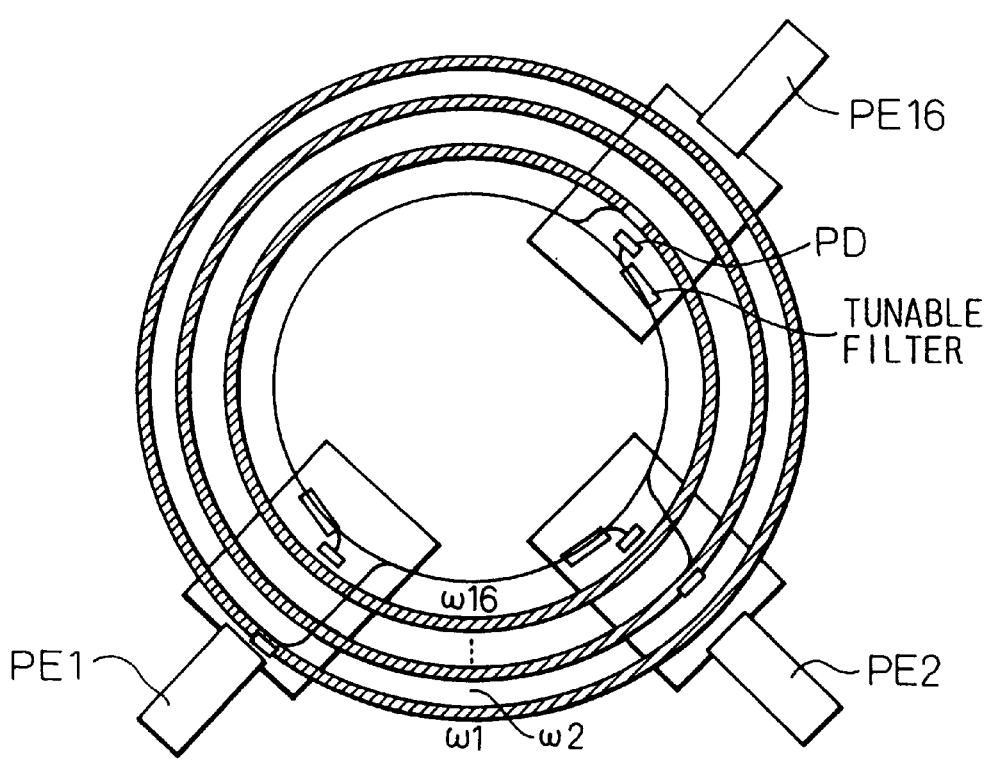

FIG. 139 is an illustrative view showing an example of a loop-type optical network.

DESCRIPTION OF THE PREFERRED EMBODIMENTS

The first aspect of the present invention will now be explained in more detail by way of the following examples, with reference to the drawings.

Figure 1:
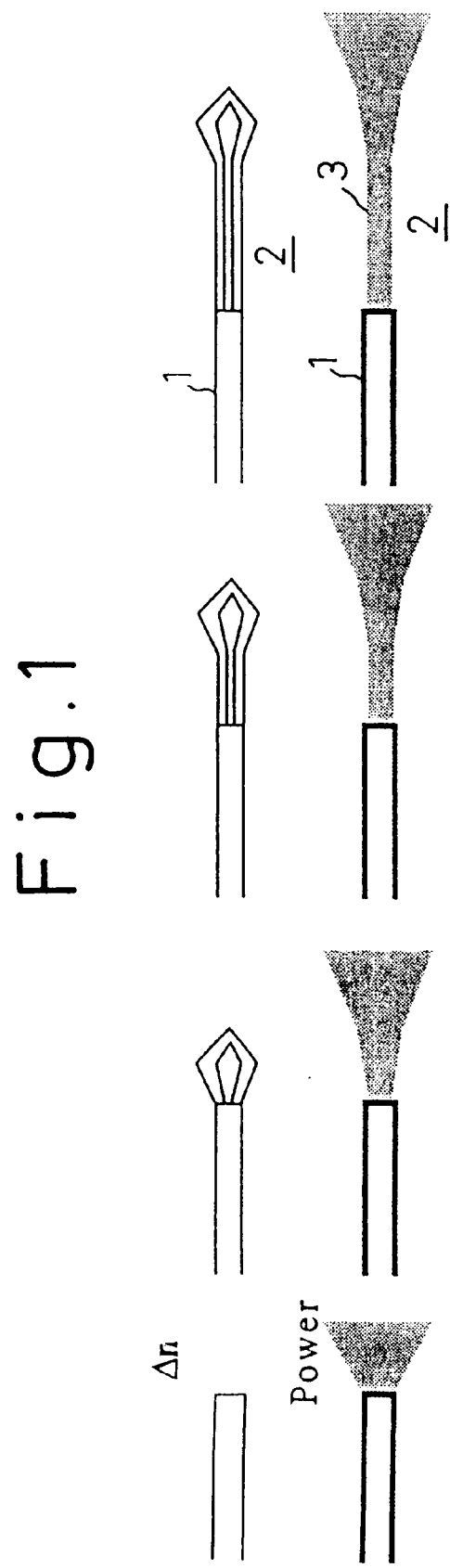
FIG. 1 is an illustrative view of embodiments of the method of the present invention.
Figure 5A:
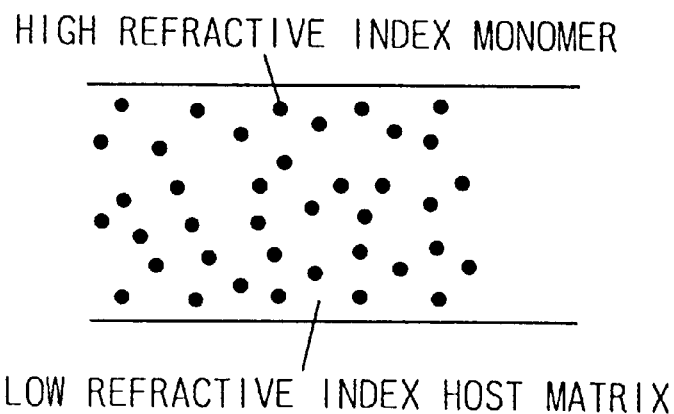
FIGS. 5A and 5B are illustrative views for explanation of the change in refractive index of a photorefractive material.
Figure 5B:
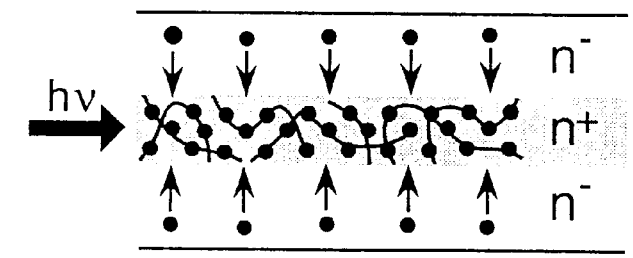
Figure 29:
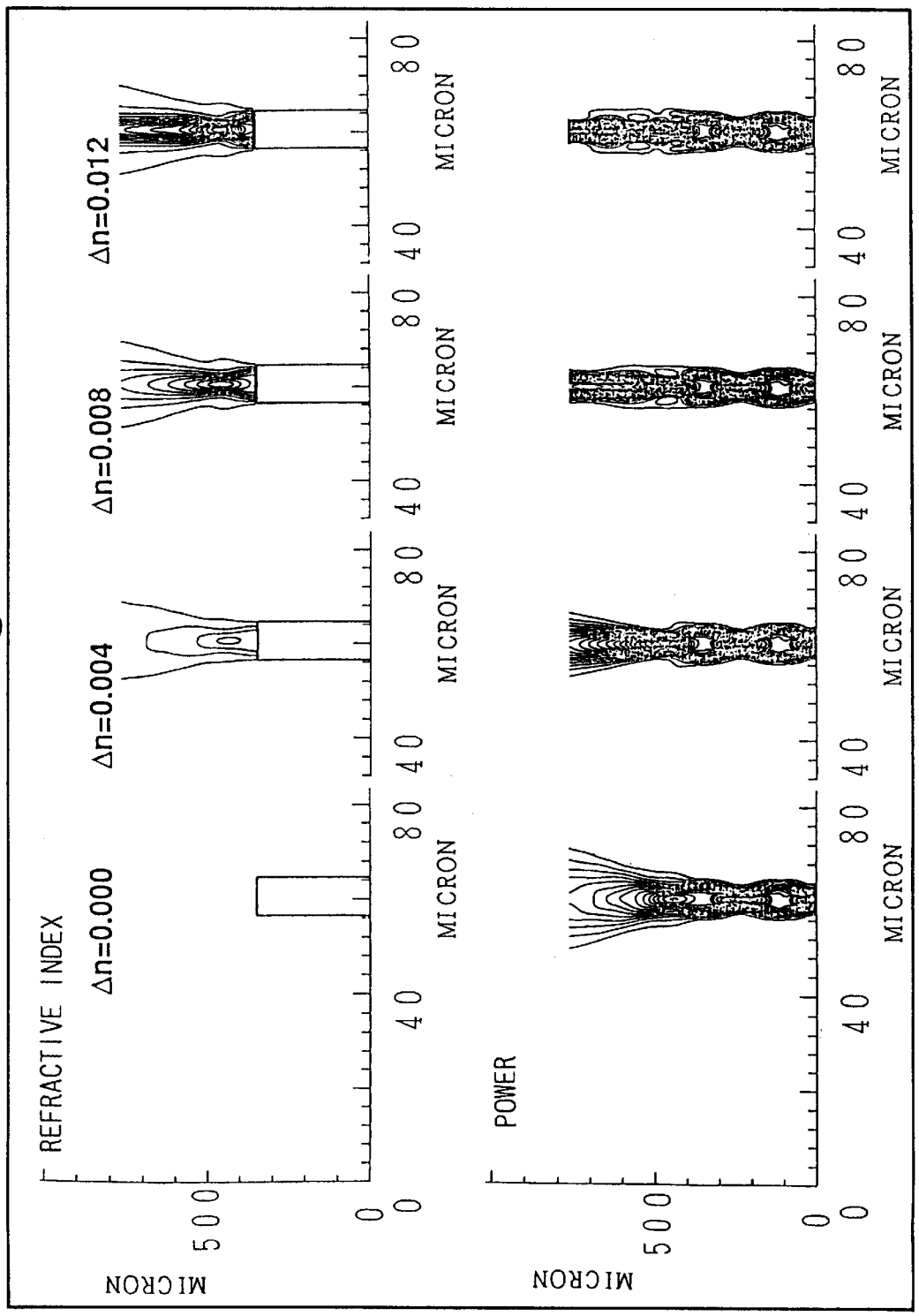
FIG. 29 is a drawing showing the conditions of waveguides formed in 2-dimensional space by the method of the present invention, as simulated by BPM.

FIG. 1 is an illustration of an example of producing an optical waveguide by utilizing self-focusing. When light emitted from the light source 1 enters the photorefractive material usually indicates rewritable material. In the present patent, we use photorefractive material for bolt rewritable material not-rewritable material. The mechanism described in FIGS. 5A and 5B is for not-rewritable material. Photorefractive material 2, the refractive index of the photorefractive material changes, causing a self-focusing phenomenon, and there is formed an optical waveguide 3 consisting of the section in the photorefractive material with a refractive index differing from the surrounding refractive index. For example, light (with a wavelength of 488 nm) emitted from the light source 1 (refractive index of core= 1.62, refractive index of clad=1.6) comprising an 8 $\mu$m-wide waveguide enters the photorefractive material 2 and is self-focused, and an optical waveguide 3 is thus formed. FIG. 29 shows the condition of such self-focusing simulated in 2-dimensional space [refractive index of waveguide= 1.61, refractive index of clad=1.60, 4-step exposure, peak power 1, 3.6 $\mu$m-wide Gaussian beam input, calculation based on refractive index change $\Delta n=0.003$ p (p=optical power)] per step. This drawing was obtained using the beam propagation method (BPM), and the top end indicates refractive index distribution while the bottom end indicates optical power propagation. The light used does not need to be of a single wavelength, as it may be white light or light of a broad spectral bandwidth.

The refractive index change induced by two-photon adsorption can also be used for the present invention.

For example, using a mixture of an epoxy resin-based matrix and vinylcarbazole, a polymerization initiator, etc. incorporated therein as a photorefractive material, a fiber was provided in the photorefractive material, and a light from a lamp for curing a UV-curing resin was emitted through the end face of the fiber core. By this light, a refractive index distribution was written in the photorefractive material, and an optical waveguide extending from the core end face was formed. The fiber used was of quartz with a single mode for 1.3 μm, and the light intensity was about 40 nW.

Figure 2:
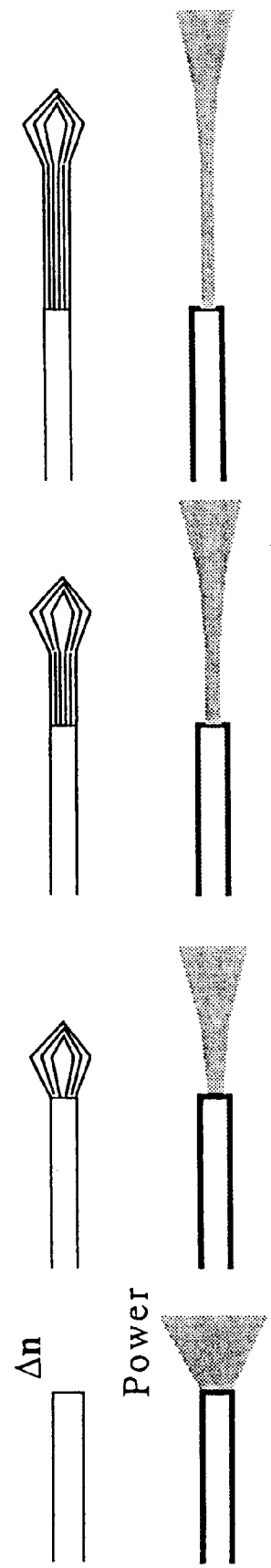
FIG. 2 is an illustrative view of inappropriate examples.

FIG. 1 is a case where Δn is a reasonable value. In this case, there is little leakage of propagated light or mode turbulence. In contrast, FIG. 2 is an illustrative view of a case in which the refractive index change Δn is too large. In this case, the confinement of the guided light is too strong, tending to result in leakage of the propagated light and mode turbulence. Control of Δn may be accurately achieved by monitoring the propagated light and refractive index distribution. Alternatively, by using a material whose refractive index change is saturated at an appropriate value, it is possible to form the waveguide in a simple manner without the need for monitoring.

Figure 27:
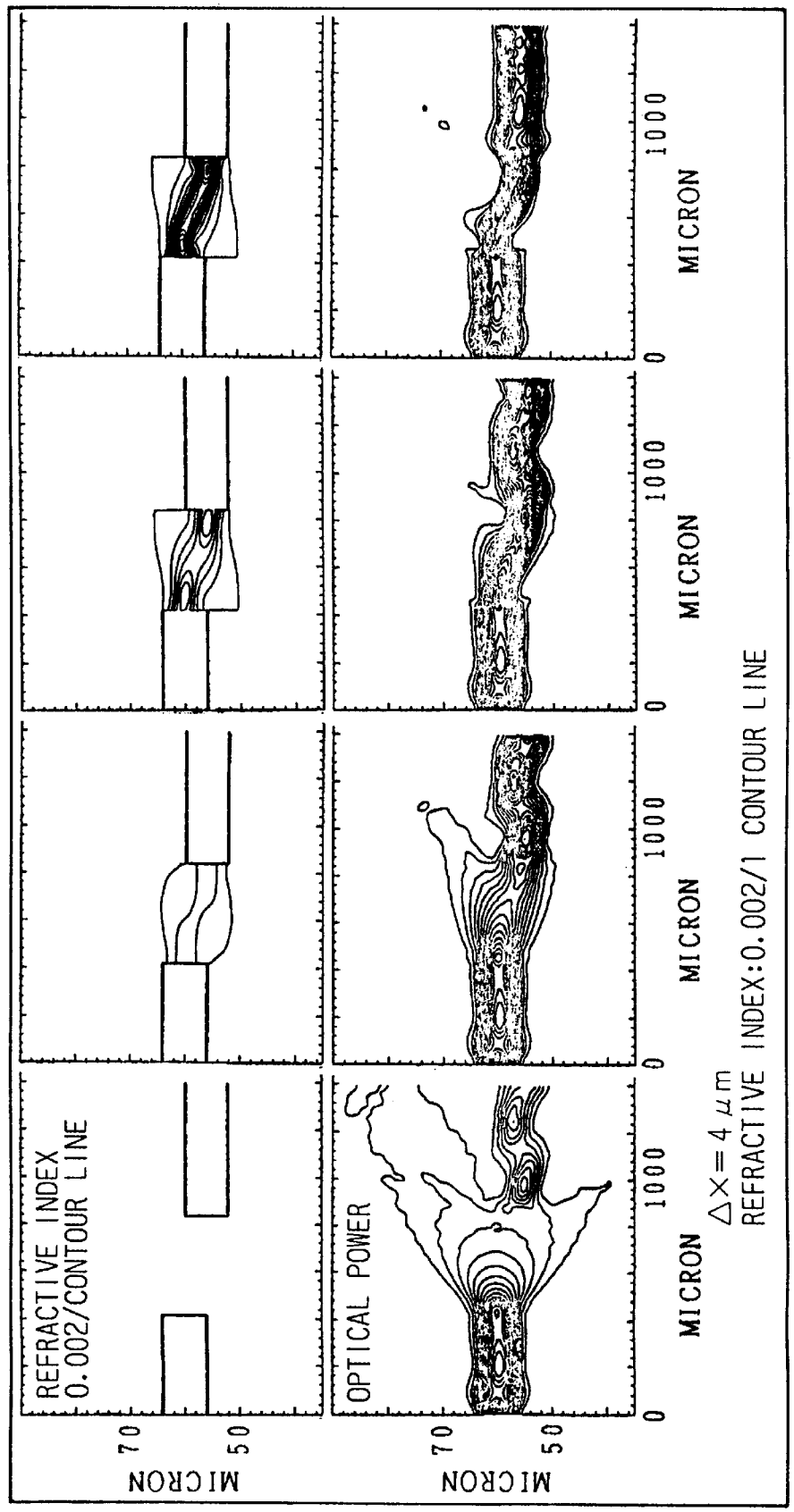
FIG. 27 is a drawing showing the conditions of waveguides formed in 2-dimensional space by the method of the present invention, as simulated by BPM (beam propagation method).
Figure 28:
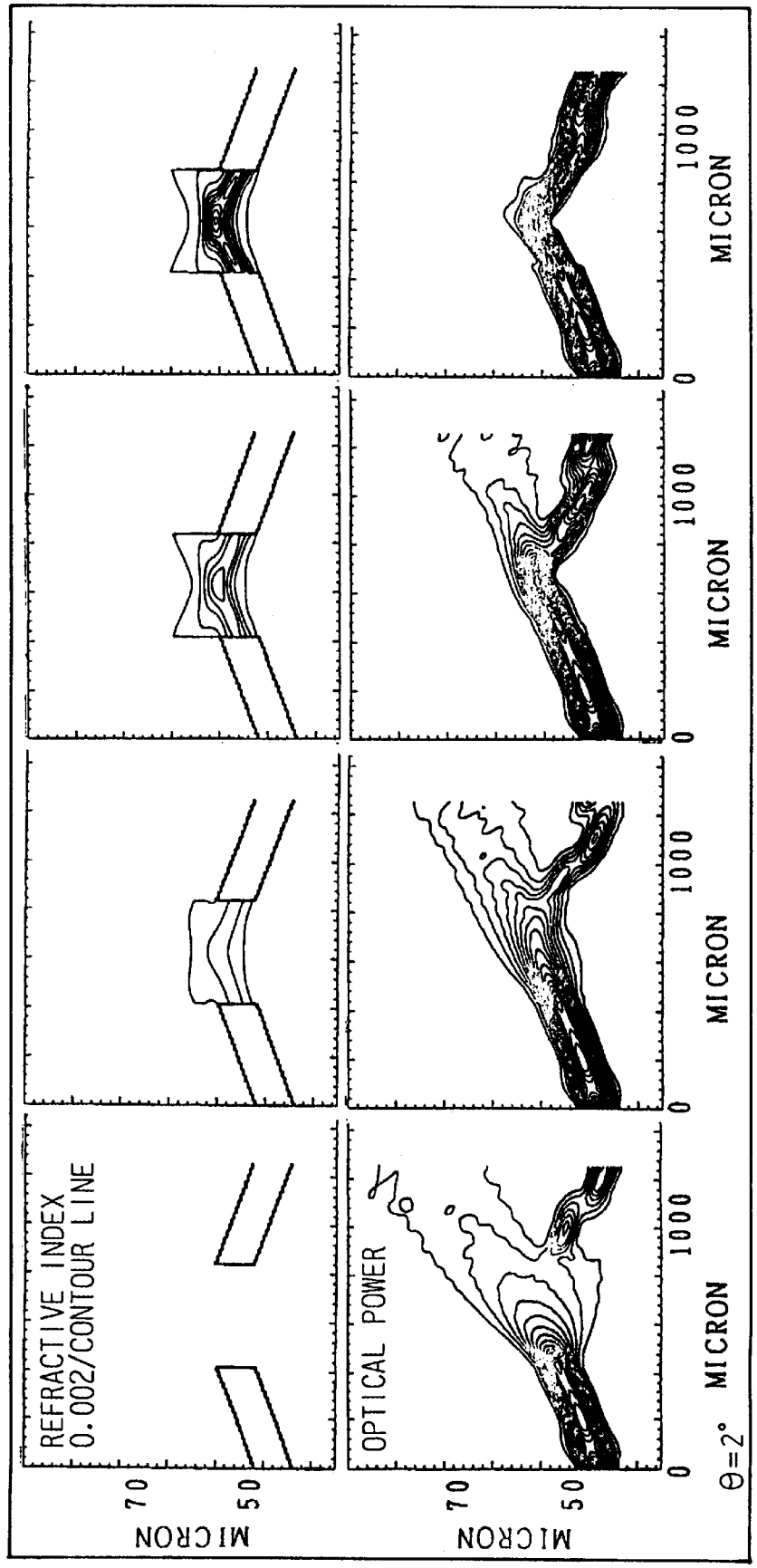
FIG. 28 is a drawing showing the conditions of waveguides formed in 2-dimensional space by the method of the present invention, as simulated by BPM.

FIG. 3 is an illustration of an example of supplying light from two light sources 1. In the well of the refractive indexes formed by light from each of the light sources (the high refractive index portions are the lower end of the well), each calls in the other, and finally a bend waveguide 3 is formed automatically in the photorefractive material 2. FIGS. 27 and 28 show such a condition simulated in 2-dimensional space [refractive index of waveguide=1.61, refractive index of clad=1.60, 3-step exposure, peak power 1, 3.6 μm-wide Gaussian beam input, calculation based on refractive index change Δn=0.003 p (p=optical power)] per step. These drawings were obtained using the beam propagation method (BPM) as was FIG. 29, and the top ends indicate refractive index distribution while the bottom ends indicate optical power propagation. In the cases of FIGS. 27 and 28, waveguide formation is carried out from both sides with light of 488 nm, and the light of 1.3 μm propagates from left to right. In the cases of FIG. 29, waveguide formation is carried out from the waveguide with light of 488 nm, and the light propagates upward.

Two optical fibers were provided with one end of one fiber being opposed to one end of the other fiber by a space of 400 μm, and the above-mentioned photorefractive material was filled therebetween. The deviation of the fiber axes (Δx in FIG. 12) was set to 0 or 4 μm, and a light coupling efficiency was measured (wavelength of 1.3 μm). Writing was carried out using the above-mentioned UV-curing lamp. A light of 40 nW was emitted from the fibers of both sides to effect writing from both sides. A coupling efficiency of 80 to 90% or more was obtained for both the axis deviations of 0 and 4 μm. On the other hand, in the case of writing from one side, the coupling efficiency was not lower than 80% for the axis deviation of 0 μm, but it was about 50 to 60% for the axis deviation of 4 μm which proves the superiority of the method of writing from both sides (SOLNET).

FIG. 3 is, as mentioned above, a case where Δn is a reasonable value, and there is little leakage of propagated light or mode turbulence. FIG. 4 is an illustrative view of a case in which the refractive index change Δn is too large, and the confinement of the guided light is too strong, tending to result in leakage of propagated light and mode turbulence. In this case as well, control of Δn may be accurately achieved by monitoring the propagated light and refractive index distribution, but by using a material whose refractive index change is saturated at an appropriate value, it is possible to form the waveguide in a simple manner without the need for monitoring.

The material whose refractive index change is saturated at an appropriate value may be, as shown for example in FIG. 5A, a material in which a high refractive index monomer is dispersed in a low refractive index host matrix. When such materials are exposed to light for photopolymerization, as shown in FIG. 5B, the high refractive index monomer migrates to the photopolymerized section, and as a result the refractive index of the photopolymerized section becomes $n^+$ while the refractive index of the surrounding sections become $n^-$. The saturation value of the refractive index change Δn is related to the transfer number of the high refractive index monomer ($N_m$), the transfer number of the low refractive index host matrix pushed away at that time ($N_h$), the refractive index of the high refractive index monomer ($n_m$) and the refractive index of the low refractive index host matrix ($n_h$) in the following manner:

$$\Delta n = n^+ - n^- 2(n_m N_m - n_h N_h)$$

Consequently, by appropriate selection of these values it is possible to control the saturation value of Δn.

FIG. 6 is an illustration of an example of a case in which a substance is present in the photorefractive material which absorbs writing light, such as a sensitizing pigment. The alteration breaching of the light-absorbing substance is more appreciable in the regions of stronger light, and the light is well propagated in those regions. Consequently, the amount of leakage of writing light to the surrounding areas is relatively lower, and the waveguide grows in a relatively linear manner. Also, when the waveguides from each end collide, a smooth connection results.

Figure 7:
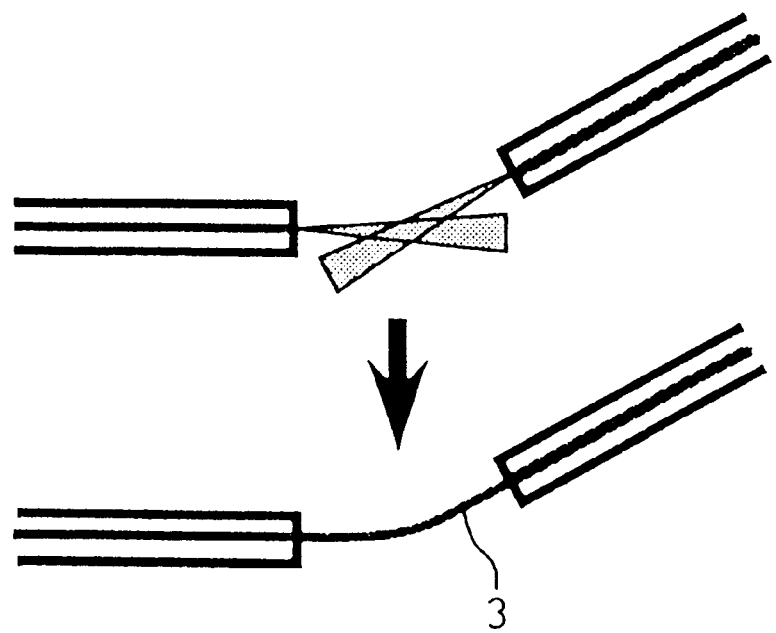
FIG. 7 is an illustrative view of still another embodiment of the method of the present invention.
Figure 8:
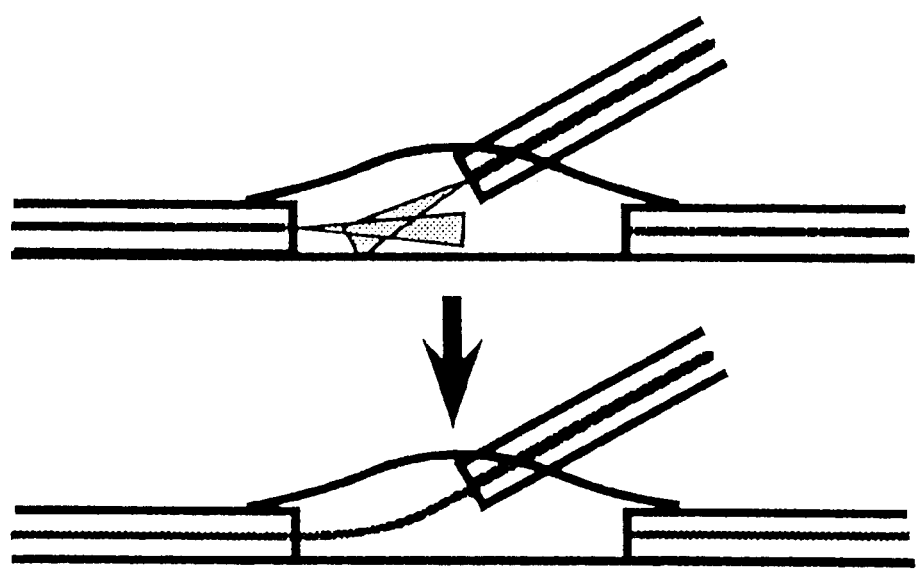
FIG. 8 is an illustrative view of still another embodiment of the method of the present invention.
Figure 9:
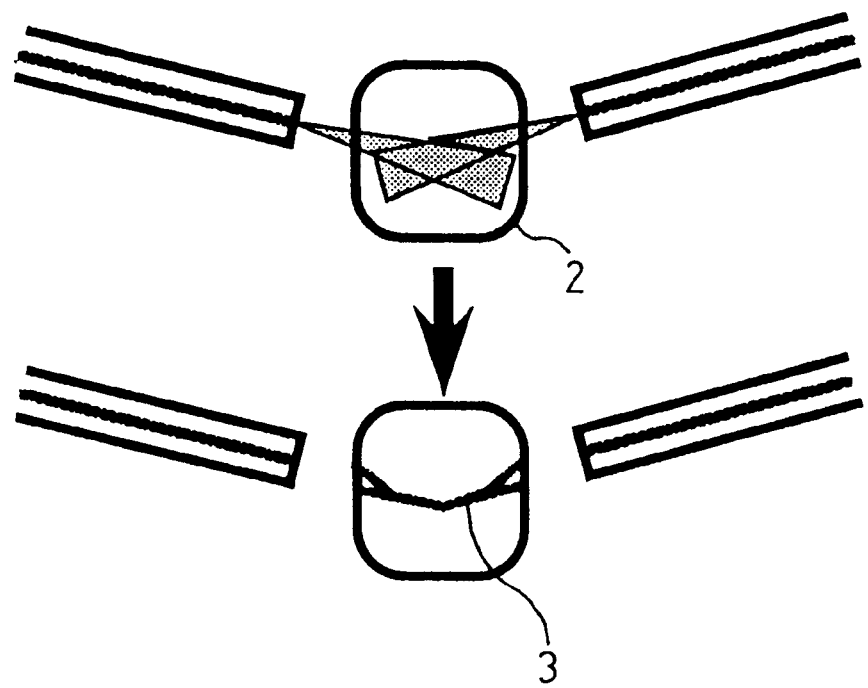
FIG. 9 is an illustrative view of still another embodiment of the method of the present invention.
Figure 10:
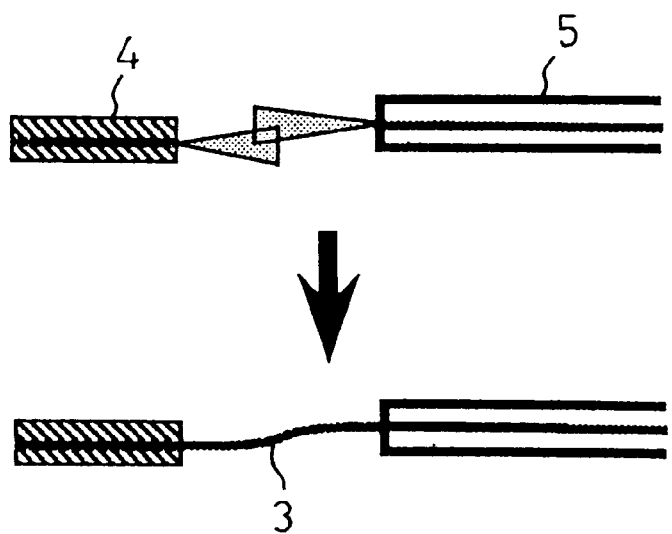
FIG. 10 is an illustrative view of still another embodiment of the method of the present invention.

FIG. 7 is an example in which writing light is emitted from 2 light sources comprising waveguides to produce a bend waveguide 3, by the same method as described above. FIG. 8 is an example in which the beam from the optical circuit surface end is linked with the waveguide to produce a Z-axis waveguide. FIG. 9 is an example in which a waveguide 3 is formed in a photorefractive material 2 situated between space beams. It is thus possible to realize a space beam coupler capable of guiding and coupling light via space beams. It may also be used as a monomolecular beam diaphragm. Each of the lights may be irradiated either simultaneously or alternately. Another example is the waveguide coupler produced by forming a waveguide 3 by this method between a laser diode (LD) or waveguide 4 and fibers 5, as shown in FIG. 10.

Figure 11:
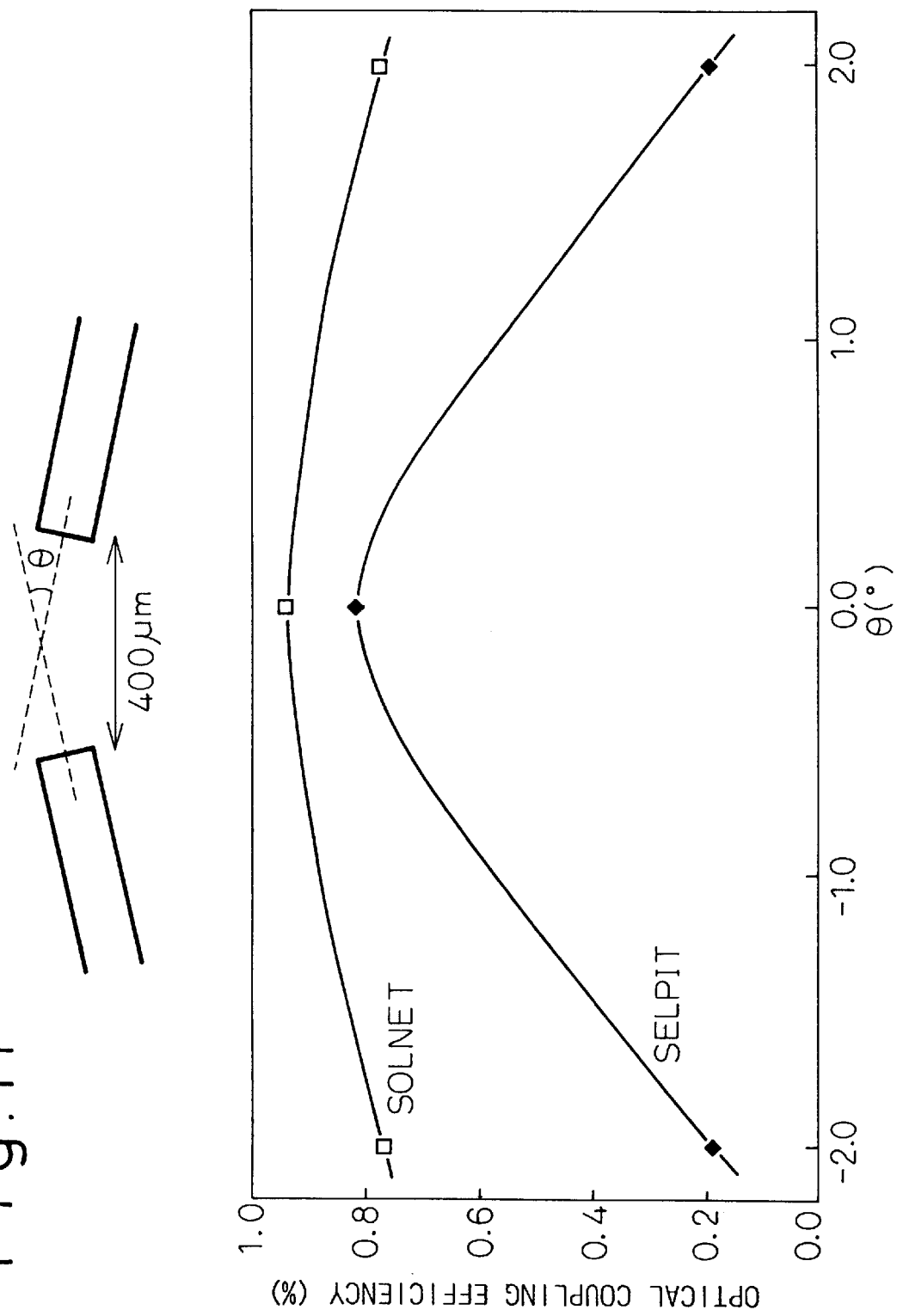
FIG. 11 is a graph showing the dependence of light coupling efficiency on the crossing angle at the center line between light emitted from two light sources.
Figure 12:
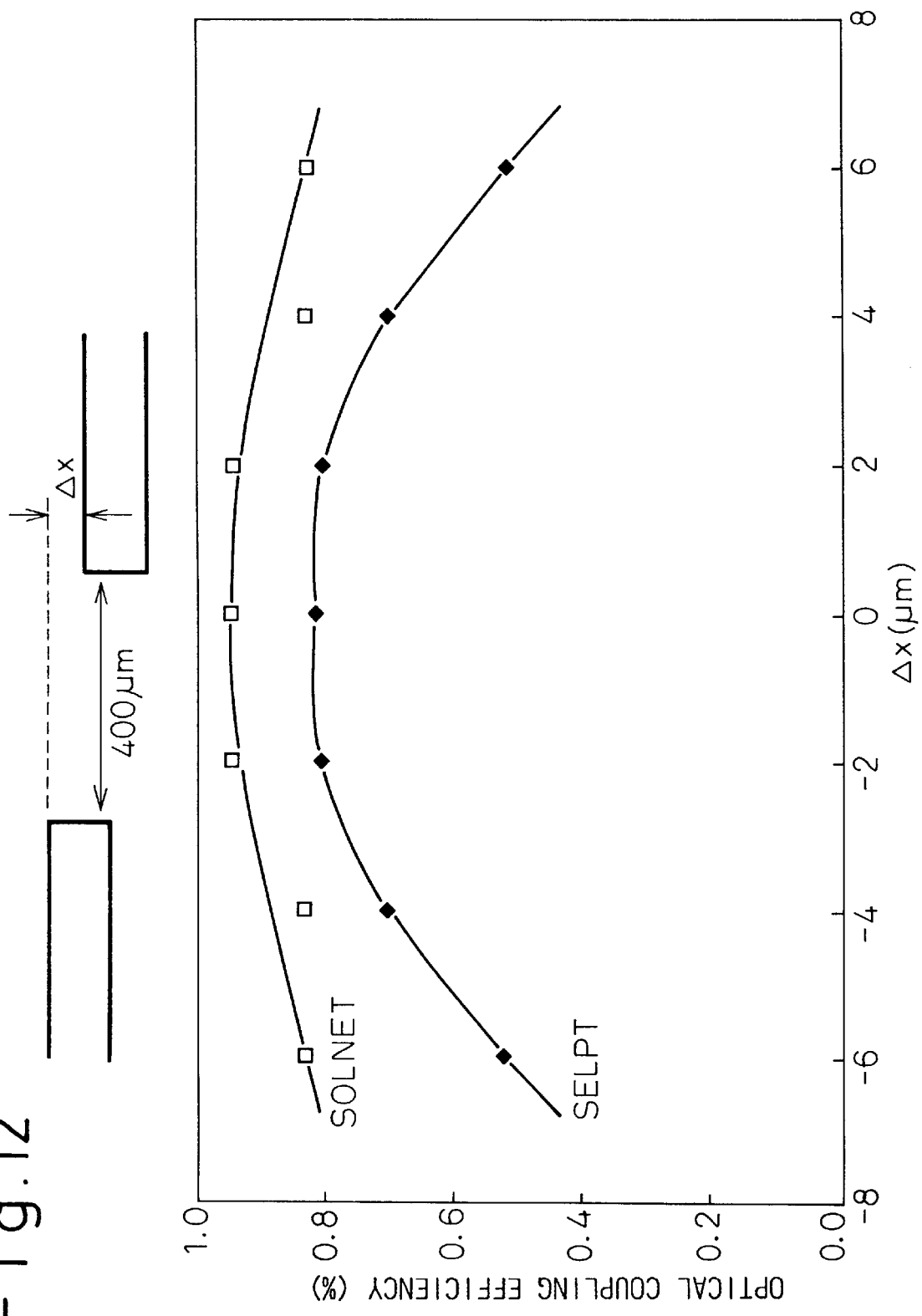
FIG. 12 is a graph showing the dependence of light coupling efficiency on the shift distance of the center line between light emitted from two light sources.

FIG. 11 is a graph showing the dependence of light coupling efficiency on the crossing angle θ at the center line between the lights emitted from each of the light sources, for the example shown in FIG. 3 (in the two-dimensional plane). Also, FIG. 12 is a graph showing the dependence of light coupling efficiency on the shift distance Δx of the center line between the lights emitted from each of the light sources, for the example shown in FIG. 10 (also in the two-dimensional plane). FIGS. 13A and 13B show the results of FIGS. 11 and 12 designated in more detail by dB. In the drawings, "Butt joint" refers to the embodiment of opposing two waveguides (fibers). "SOLNET" refers to the writing from both sides, "SELPIT" refers to the writing from one side where self-focusing was not utilized, and "SELPIT(SF)" refers to the writing from one side where self-focusing was utilized. In these graphs, SOLNET represents the light coupler obtained by the above-mentioned example according to the present invention, and SELPIT represents a conventional light coupler. From these drawings, it is proved that the SOLNET has characteristic features of high coupling efficiency and high tolerance. This supports the above-mentioned test results that the method of writing from both sides (SOLNET) is excellent.

Figure 14:
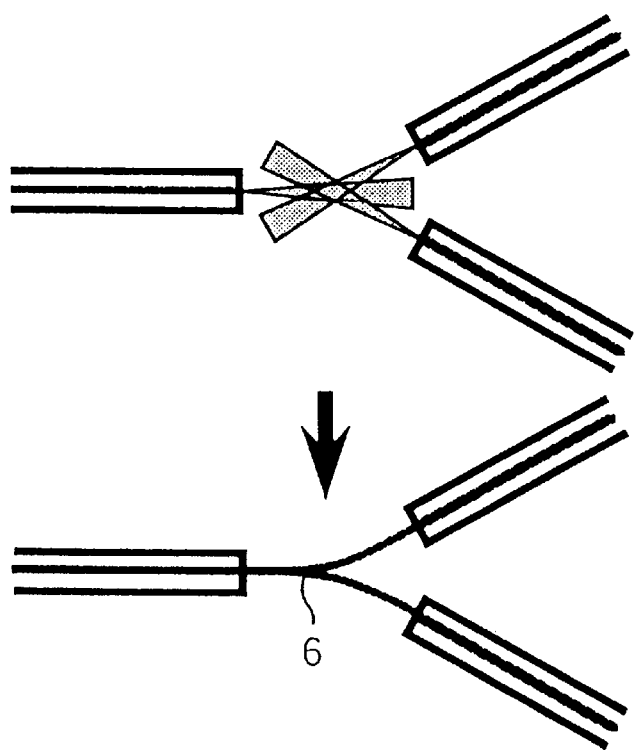
FIG. 14 is an illustrative view of still another embodiment of the method of the present invention.
Figure 15:
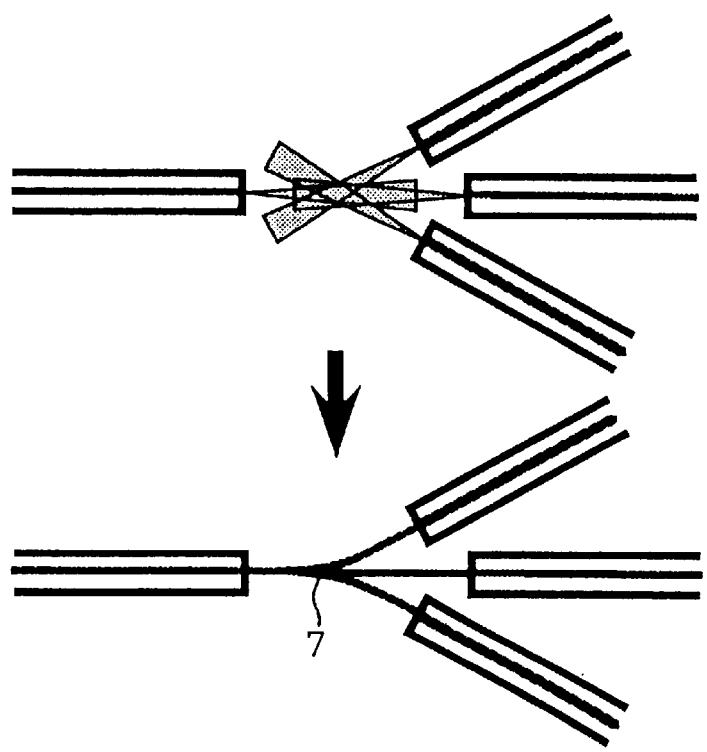
FIG. 15 is an illustrative view of still another embodiment of the method of the present invention.
Figure 16:
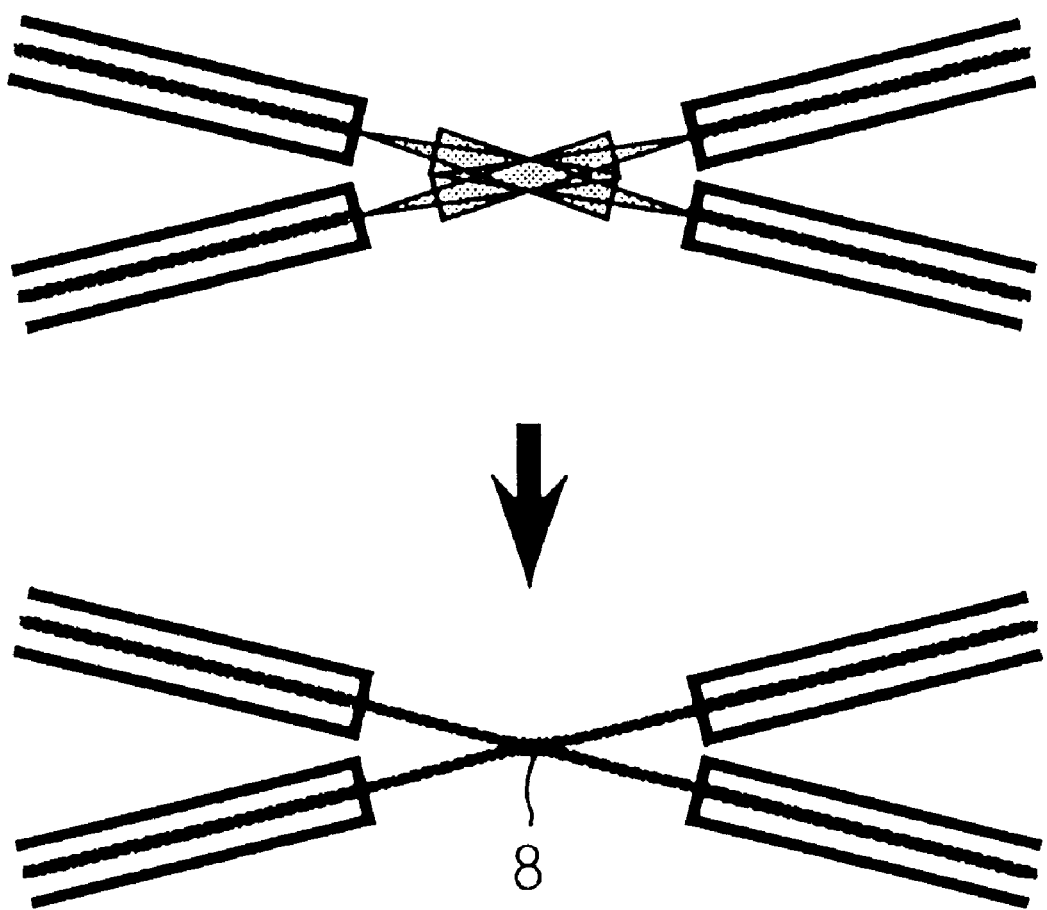
FIG. 16 is an illustrative view of still another embodiment of the method of the present invention.

Examples using 3 or more light source beams are shown in FIGS. 14, 15 and 16. These are formed by a Y-branch waveguide 6, a star coupler 7 and a cross waveguide 8, respectively.

Figure 17:
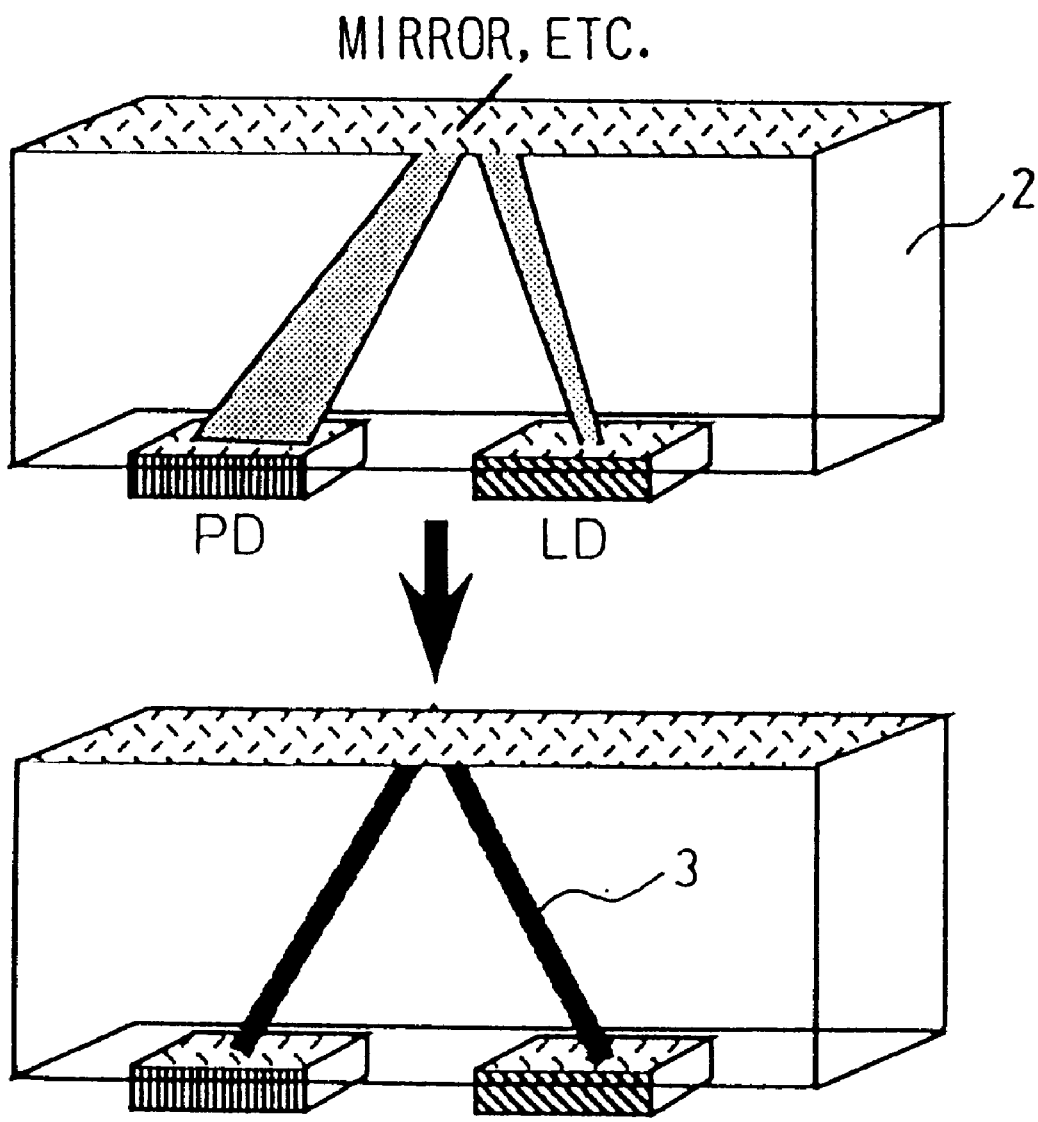
FIG. 17 is an illustrative view of still another embodiment of the method of the present invention.
Figure 18:
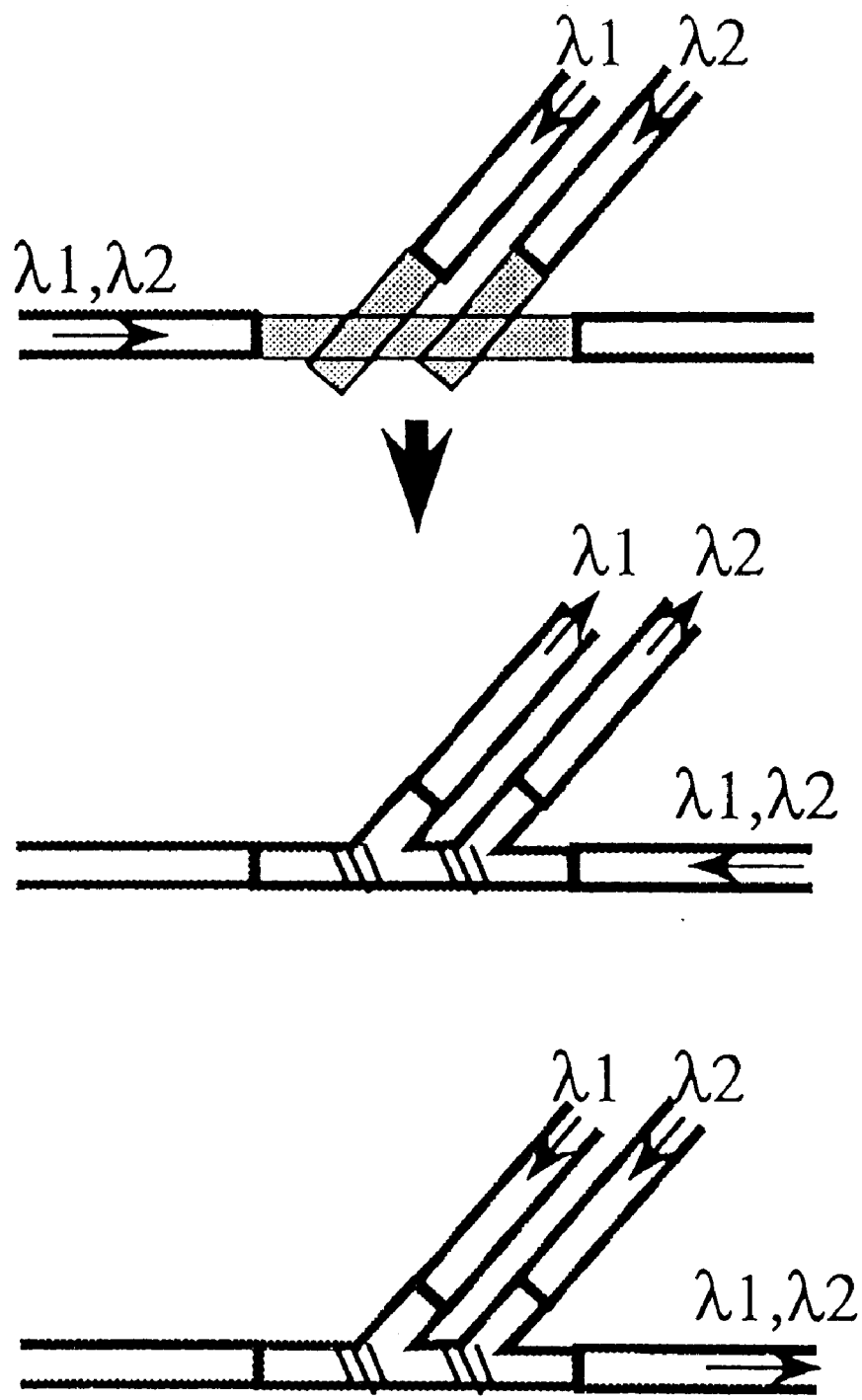
FIG. 18 is an illustrative view of still other embodiments of the method of the present invention.
Figure 19:
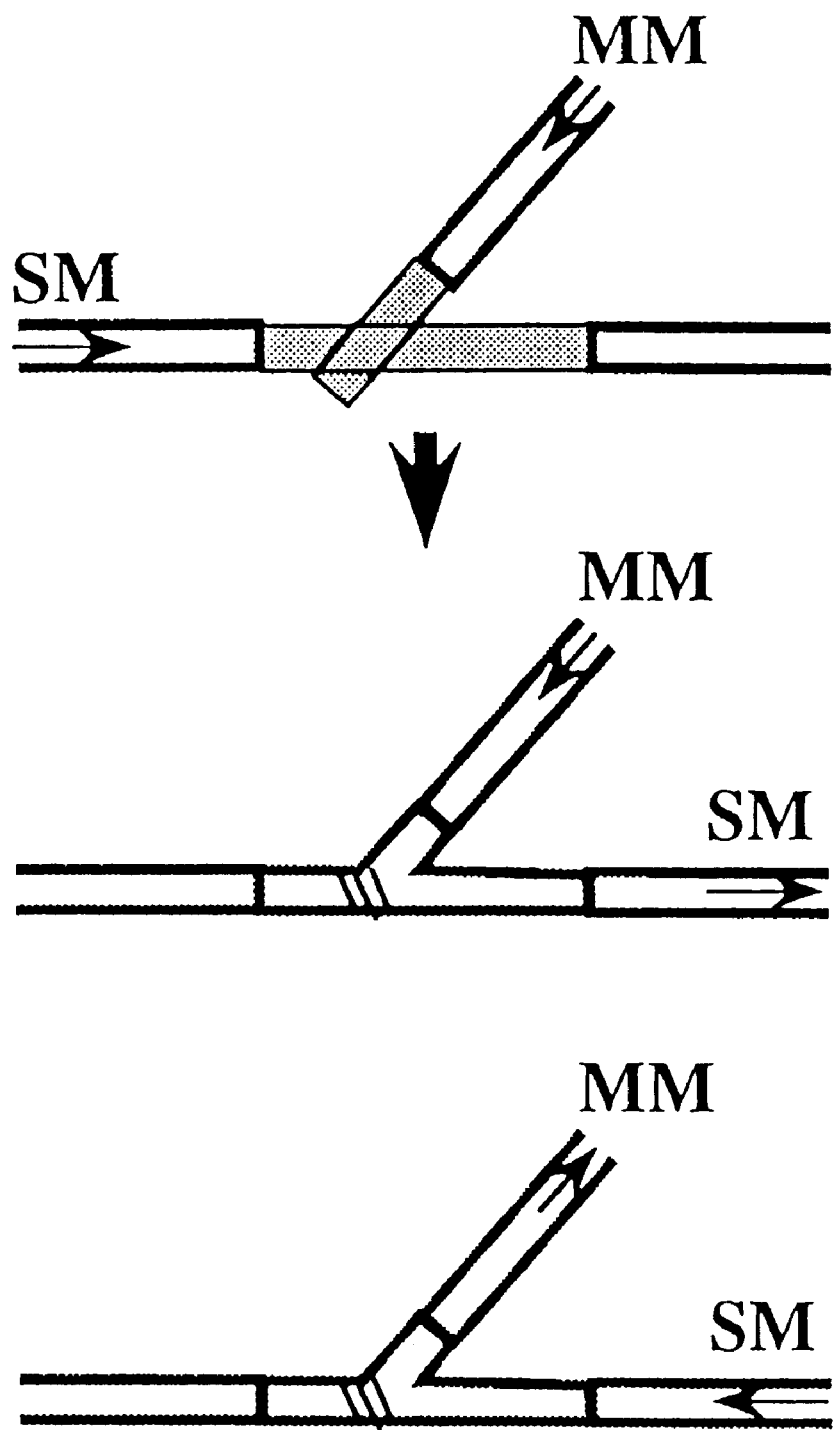
FIG. 19 is an illustrative view of still other embodiments of the method of the present invention.

The same method may also be used to form a variety of devices such as the space waveguide shown in FIG. 17, the wavelength filter for wavelengths λ1 and λ2 shown in FIG. 18, and the mode converter between a multi mode (MM) and single mode (SM) shown in FIG. 19. In the example in FIG. 17, light from a laser diode (LD) enters the photorefractive material 2 and is reflected by a mirror, hologram, grating or the like, and while it is received at a photodiode (PD), a space waveguide 3 is formed in the photorefractive material.

For the formation of the various devices described above, the light emitting end of the light source and the photorefractive material may either be connected or unconnected.

Also, in the examples described above, a photosensitive material may be used instead of the photorefractive material. When a photosensitive material is used, the soluble sections may be etched, and they may also be covered with another material.

The above serves to explain one example of the method of forming an optical waveguide system according to the present invention, and the light sources or beam sources used may be, instead of optical waveguides, optical fibers, semiconductor lasers, light-emitting diodes, photodiodes, lenses, holograms, prisms, mirrors, pinholes, slits, gratings or any other light-supplying devices. However, in cases where direct light from a semiconductor laser is used, the photorefractive material or photosensitive material must have a sensitivity in a wavelength region of from the red to infrared regions. In cases where a passive device such as a waveguide is used, the light passing through it and the spectral sensitivity of the material must match. There is usually used light spanning from the white, red or green to ultraviolet regions, and therefore the material must have a sensitivity within such ranges.

Furthermore, although it is a waveguide, it is not necessary for it to have a linear refractive index distribution, as its refractive index distribution may be of any desired shape, such as a tapered distribution.

Figure 20:
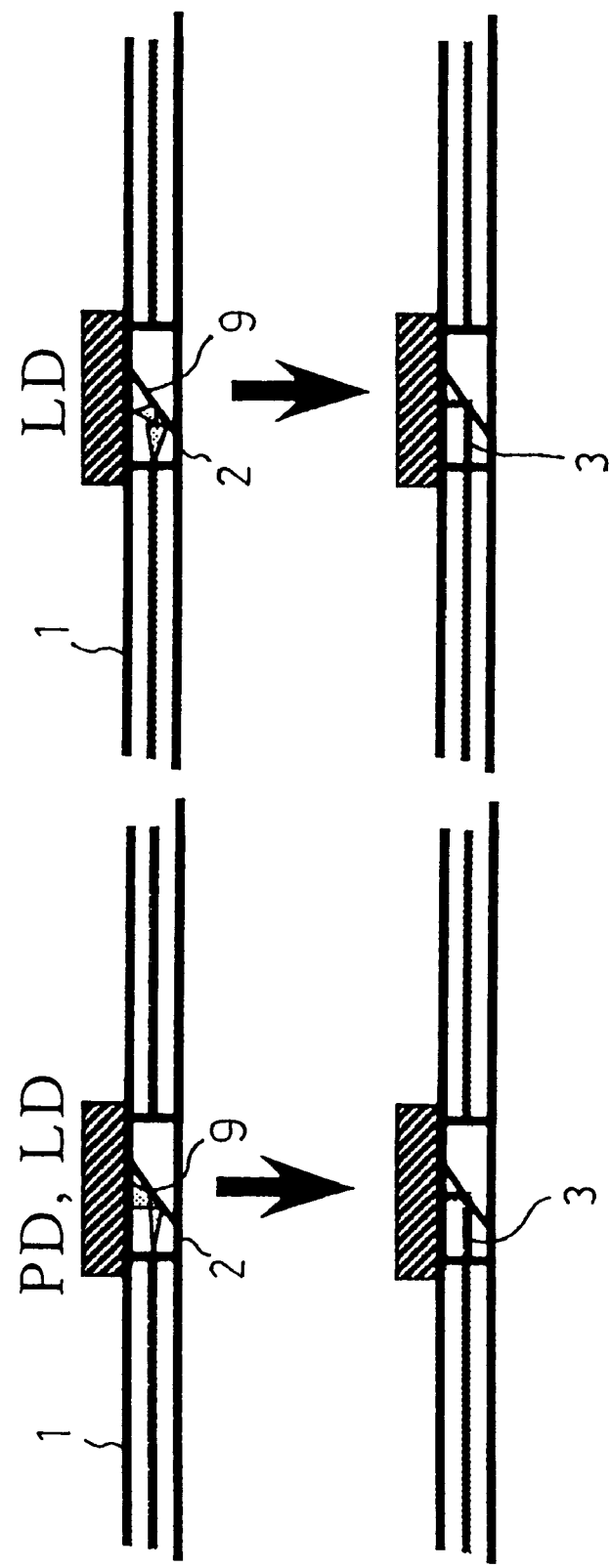
FIG. 20 is an illustrative view of still other embodiments of the method of the present invention.

FIG. 20 is an example in which a mirror 9 intervenes for self-organization of the waveguide. In this example, a photorefractive material 2 is situated between a photodiode (PD) and an optical waveguide 1, and an L-shaped waveguide 3 is formed therein. For this example, a laser diode (LD) may be used instead of the photodiode. In such a case, light may be emitted from both the optical waveguide 1 and the laser diode (LD). According to the method of the present invention, it is thus possible to form a very effective optical waveguide for optical SMT (optical surface mount technology). In addition, a grating, hologram, prism, lens, waveguide, pinhole, slit or the like may be situated in the entirety or part of the region through which the light passes, instead of the mirror in the previous example, for self-organization of the waveguide.

As photorefractive materials useful for the method of the present invention there may be mentioned, for example, photopolymers prepared by adding a high refractive index vinyl carbazole monomer or the like to an acrylic binder or epoxy binder (polymer, oligomer or monomer), and further adding a sensitizing agent or polymerization initiator. Such materials result in a higher refractive index of the light irradiated section. Also, the sensitivity is usually from 300 to 700 nm. Reinforcement of the hardness and stability is also possible by ultraviolet (UV) irradiation and heat treatment. Naturally, the material is not limited to the above, and other polymers, glass or any other material whose refractive index changes with light irradiation may be used. In addition, rewriting is possible if the material is a photorefractive material. A sensitizing agent may also be added for long wavelength sensitization.

According to the present invention, a photosensitive material which insolubilizes (cures) with light irradiation may be used instead of the photorefractive material. Upon development after local insolubilization of the photosensitive material, the material remains in the form of a waveguide. At that time, after development, the cavities may be filled with a low refractive index material. UV irradiation or heat treatment may also be performed. This allows reinforcement of the hardness and stability. As useful materials there may be mentioned photocuring and photosensitive polyimide epoxy resins, photosensitive glass, and the like. Conversely, photosensitive materials which solubilize with light irradiation may also be used, but in such cases funnel-shaped pores are opened. A high refractive index material may be injected therein to cover them, to bring out the converging effect.

The aforementioned examples of FIGS. 3 to 20 also constitute self-organized optical couplers.

To explain in more detail, according to the present invention the light used to irradiate the photorefractive material or photosensitive material is preferably light generated from an optical device itself, such as an LD, LED, waveguide laser amp, or the like, in order to give the wavelength of the incident light a degree of freedom. The light used to irradiate the photorefractive material or photosensitive material may also be light introduced to the optical device from outside. Alternatively, the irradiated light may be light generated in the optical device as a result of light introduced to the optical device from outside, or light generated in the optical device by irradiating light on the optical device from outside; the use of this type of light becomes possible by adding a substance selected from fluorescent pigments and inorganic fluorescent substances, two-photon absorbing/emitting substances such as LD light-measuring phosphor, up-conversion substances such as rare earth metal ions and SHG substances, to part or all of the optical device, to produce luminescence by the excitatory light. In addition, since fluorescent light is sometimes produced by ultraviolet irradiation on glass waveguides and polymer waveguides, this may also be employed. Furthermore, the irradiated light used may be luminescence produced by excitatory light from the optical device as a result of adding a substance selected from fluorescent substances, two-photon absorbing/emitting substances, up-conversion substances and SHG substances, to part or all of a photorefractive material or photosensitive material.

Figure 23:
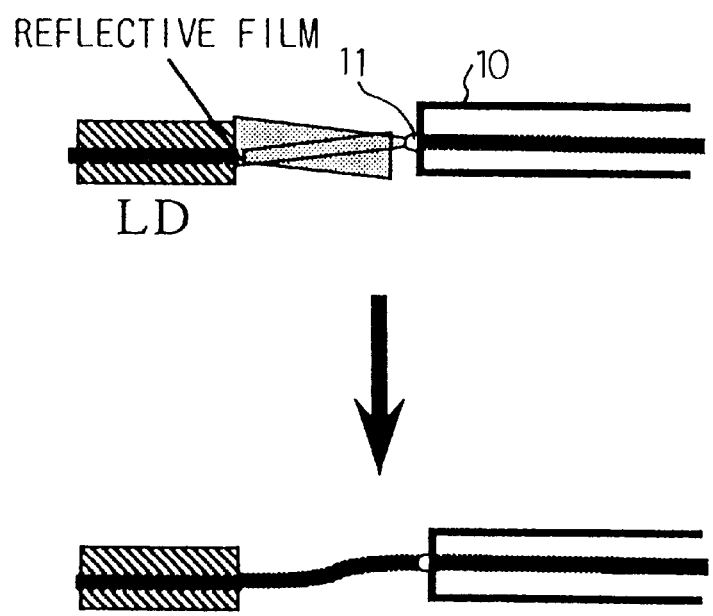
FIG. 23 is an illustrative view of still another embodiment of the method of the present invention.
Figure 24:
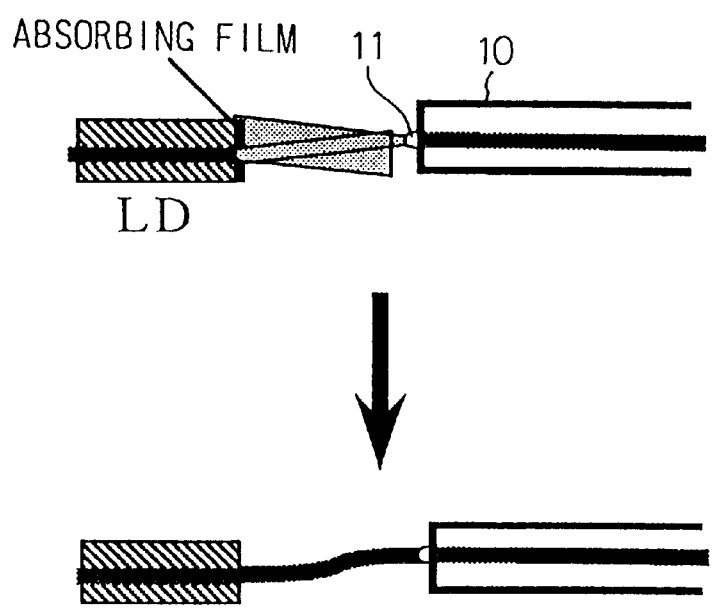
FIG. 24 is an illustrative view of still another embodiment of the method of the present invention.
Figure 25:
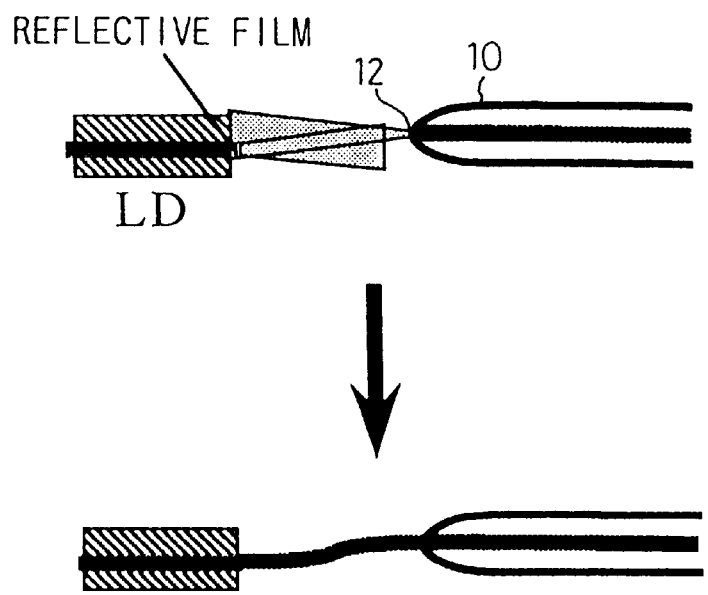
FIG. 25 is an illustrative view of still another embodiment of the method of the present invention.
Figure 26:
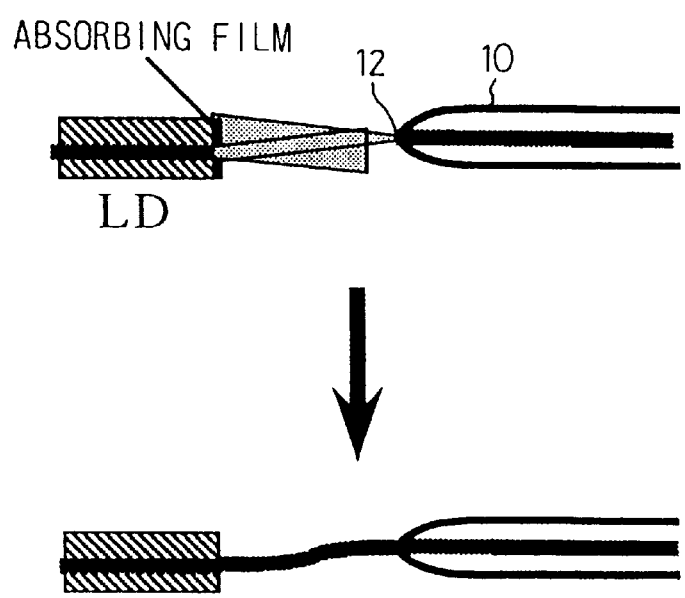
FIG. 26 is an illustrative view of still another embodiment of the method of the present invention.

Also, particularly in the case of coupling between LD/fibers or a waveguide, the sensitivity of the photorefractive material or photosensitive material is sometimes not in the LD light range. To counter this, as shown in FIG. 21 for example, the irradiated light may be selectively reflected from the laser diode (LD) light emitting region of the LD end surface or a roughly equivalent region, and waveguide formation or waveguide coupling accomplished by interaction between the propagated light and the reflected light. An example is where a reflective film such as a dielectric multilayer mirror is formed in the LD light emitting region to reflect light in a wavelength region with a high sensitivity, such as the green to ultraviolet region. Alternatively, as shown in FIG. 22, the same effect may be obtained by forming an absorbing film in the region surrounding the laser diode (LD) light emitting region of the LD end surface or another region which is roughly equivalent thereto. The reflective film or absorbing film may be formed by a common photolithography technique, or by self-align etching or lift-off using a photosensitive film which is sensitive to LD light. It may also be formed by removal of a thin-film by laser. Furthermore, in these examples, a microlens 11 may be formed at or in the vicinity of the end surface of the fibers or waveguide 10 (FIGS. 23 and 24), or the end surface of the fibers or waveguide 10 or its vicinity may be made into a platelet shape 12 (FIGS. 25 and 26).

With other embodiments of the present invention, the following technical problems are overcome by using photorefractive materials and photosensitive materials.

There is provided an optical waveguide or refractive index distribution with a high degree of freedom and a method for its production, such as a method of automatically burrowing out a waveguide by light incidence and a device formed thereby, and a method of forming a waveguide circuit network by naturally combining a few waveguides and a device formed thereby.

There is provided an optical device such as a waveguide, refractive index distribution or optical coupler with a high degree of freedom, by self-aligned optical coupling which makes use of automatic formation of a waveguide or refractive index distribution of a lens or the like as mentioned above, wherein a refractive index change or curing reaction is caused by superimposing light of 2 or more wavelengths.

In addition, there is also provided a range of selection of materials with infrared sensitivity in the 1.3 $\mu$m and 1.5 $\mu$m bands.

According to this embodiment, there may be provided waveguides and various other types of optical devices and self-aligned optical couplers with a large degree of freedom of shape, wherein connection between the waveguides is established automatically even in cases where the positioning precision is rough, as well as methods for their production, and also waveguides and various other types of optical devices and self-aligned optical devices employing photorefractive materials or photosensitive materials with sensitivity to LD wavelengths, as well as methods for their production.

In other words, according to this embodiment of the present invention, there is provided a method of producing optical devices by irradiating light on a photorefractive material whose refractive index changes with light irradiation, and forming a refractive index distribution while inducing self-focusing.

There is also provided a method of producing optical devices by irradiating light on a photosensitive material whose refractive index changes and which cures and insolubilizes with light irradiation, and forming a refractive index distribution while inducing self-focusing and insolubilizing the photosensitive material.

It is also possible to form an optical coupler or optical waveguide network by optical coupling using the means described above.

The various applications mentioned above are also possible by using light of a plurality of wavelengths.

Such cases according to the present invention are described below.

Figure 30:
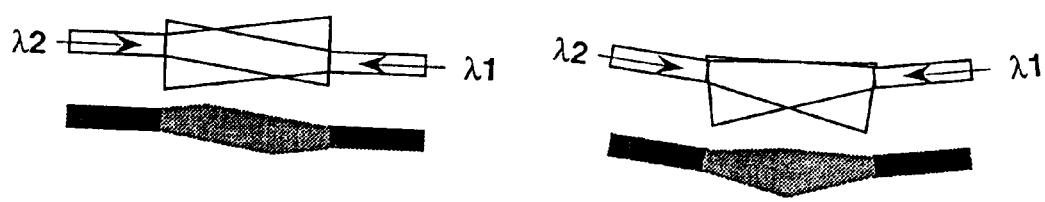
FIG. 30 is an illustrative view for explanation of an example of the method of the present invention with multiple wavelength writing.

FIGS. 30 to 33 show examples of producing waveguides, refractive index distributions and optical couplers by two-wavelength writing. Between two waveguides there is placed a material whose refractive index increases when light of wavelength $\lambda 1$ and $\lambda 2$ are superimposed. Light of wavelength $\lambda 1$ is emitted from one waveguide, and light of wavelength $\lambda 2$ is emitted from the other waveguide. As a result, there is produced a refractive index change as illustrated in FIGS. 30 to 33, and a waveguide is formed at the section of superimposition of the wavelengths $\lambda 1$ and $\lambda 2$. Here, these refractive index distributions may sometimes be considered as GRIN lenses the centers of which are in each waveguide. The various courses shown as examples in FIGS. 30 to 33 are possible by increasing or decreasing the absorption of the photorefractive material with respect to the wavelengths $\lambda 1$ and $\lambda 2$. The waveguides formed here also constitute self-aligned optical couplers connecting two waveguides. This may be said for all of the following examples. The wavelength distribution of light does not necessarily have to be of a single color, as it may also be a wide wavelength band. In the present specification, $\lambda$ is used in this sense. FIG. 30 is a case of low absorption of both $\lambda 1$ and $\lambda 2$, FIG. 31 is a case of low absorption of $\lambda 1$ and high absorption of $\lambda 2$, FIG. 32 is a case of high absorption of $\lambda 1$ and low absorption of $\lambda 2$, and FIG. 33 is a case of high absorption of both $\lambda 1$ and $\lambda 2$.

FIGS. 34 to 37 are examples in which the self-focusing effect is utilized (SOLNET: Self-Organized Lightwave Network). Since light is naturally concentrated in the section of strong light intensity, a more smoothly linear waveguide is formed in comparison to the cases of FIGS. 30 to 33 which do not utilize the self-focusing effect. Also, by providing at least two light sources in such an orientation that they exert an influence on each other by the refractive index changes caused by their light, the lights emitted from each waveguide attract each other. Due to this effect, the waveguide formation is accomplished more smoothly and efficiently than in the case of one wavelength. Of these drawings, FIG. 34 is a case of low absorption of both $\lambda 1$ and $\lambda 2$, FIG. 35 is a case of low absorption of $\lambda 1$ and high absorption of $\lambda 2$, FIG. 36 is a case of high absorption of $\lambda 1$ and low absorption of $\lambda 2$, and FIG. 37 is a case of high absorption of both $\lambda 1$ and $\lambda 2$.

Figure 38:
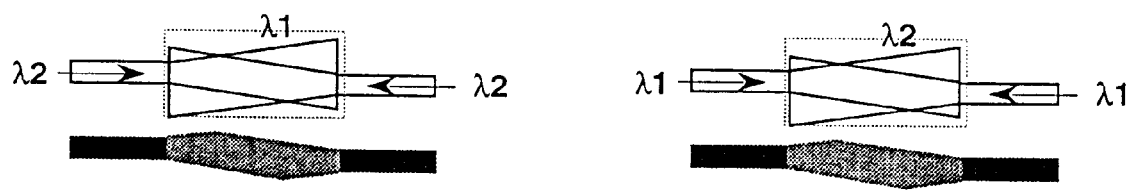
FIG. 38 is an illustrative view for explanation of other examples of multiple wavelength writing.

FIGS. 38 to 40 are examples in which irradiated light from outside is used in combination with emitted light from the waveguides. Light of either wavelength $\lambda 1$ or wavelength $\lambda 2$ is assigned to the emitted light from the waveguides and the outside light, respectively, to produce a refractive index change at the section of superimposition of the lights. This case has advantages, in that the location where the refractive index change is produced may be selected from the outside, and the emitted light from both waveguides may be of the same wavelength.

Here, instead of only 2 waveguides, 3 or more waveguides may be used. The light for formation of the waveguide may be, instead of light from waveguides, also light from other optical devices such as optical fibers, semiconductor lasers, light-emitting diodes, photodiodes, lenses, holograms, prisms, gratings, mirrors, pinholes, slits and the like. In addition, the wavelengths are not limited to 2, as light of 3 or more wavelengths may also be superimposed. The light irradiation may be performed simultaneously or alternately.

Figure 41:
FIG. 41 is an illustrative view for explanation of other examples of multiple wavelength writing.
Figure 42:
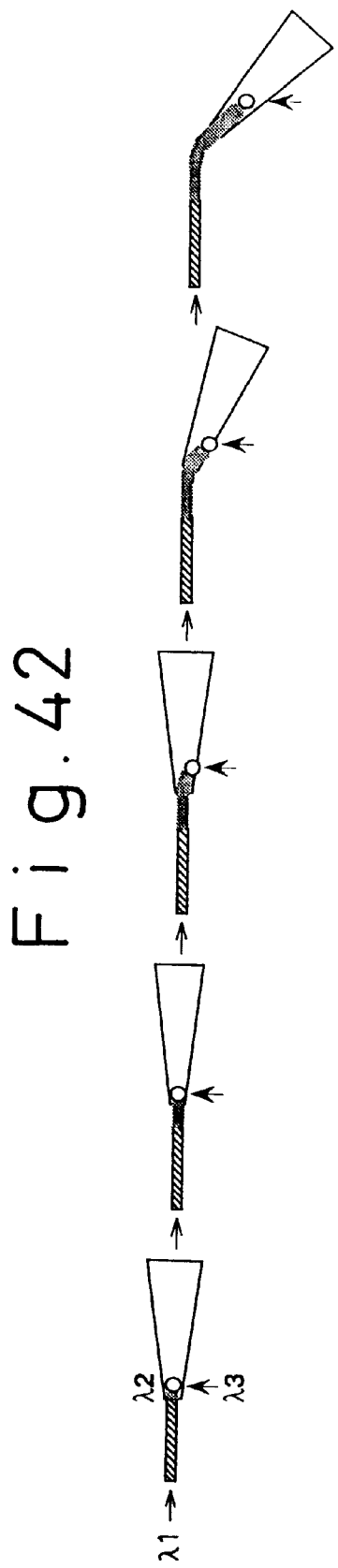
FIG. 42 is an illustrative view for explanation of other examples of multiple wavelength writing.
Figure 43:
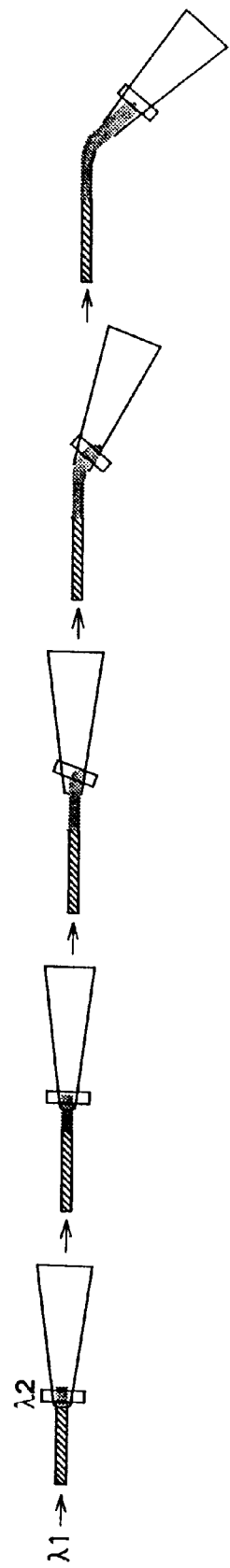
FIG. 43 is an illustrative view for explanation of other examples of multiple wavelength writing.
Figure 44:
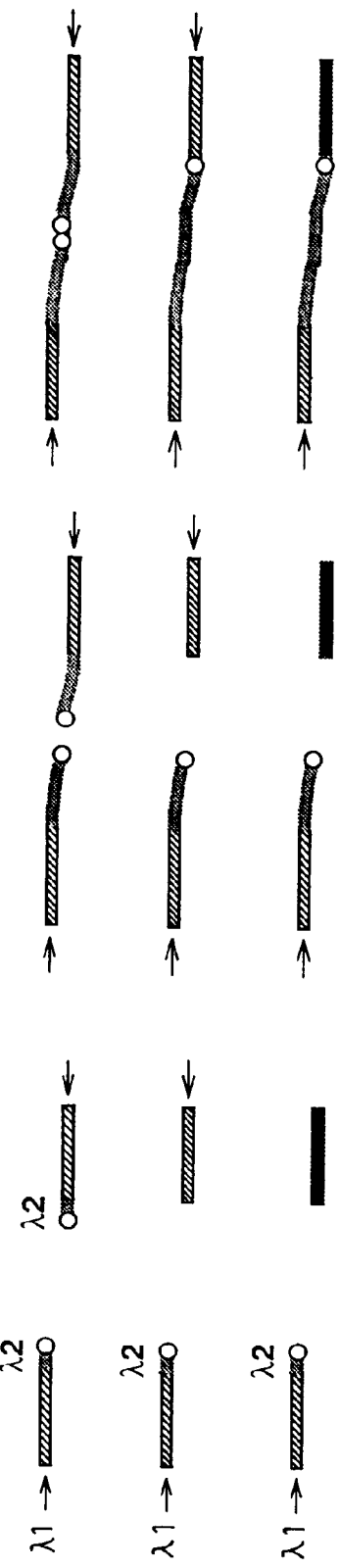
FIG. 44 is an illustrative view for explanation of other examples of multiple wavelength writing.
Figure 46:
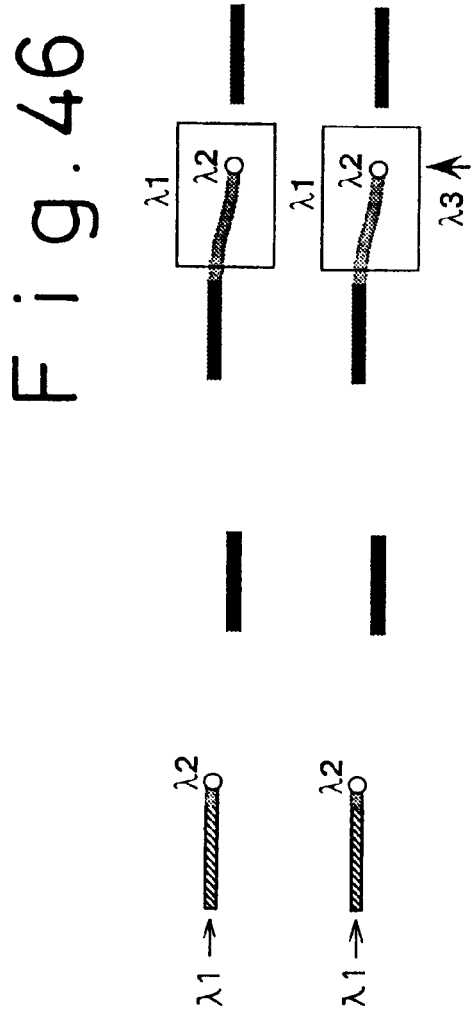
FIG. 46 is an illustrative view for explanation of other examples of multiple wavelength writing.

FIGS. 41 to 43 and FIGS. 44 to 46 are illustrations of examples in which the irradiated light from the outside is spot light or patterned light. By moving this type of irradiated light, it is possible to form a refractive index pattern of any shape, and thus form a variety of types of optical devices such as waveguides, lenses, mirrors, gratings, prisms, holograms, pinholes and slits. FIGS. 41 to 43 show cases of low absorption of light of wavelength $\lambda 1$, but the same effect may be achieved even without low absorption. FIGS. 41 to 43 show examples of drawing an optical waveguide and producing an optical coupler. In these cases, since the writing light is present only near the end surface of the waveguide, the waveguide is automatically linked with the written waveguide. Linkage of the 2 waveguides is even easier by widening the beam width near the end surface, as shown in FIG. 43. At the left-hand side and center of FIG. 45, there are shown cases where one light is irradiated on the entire surface, while the other light is a spot light, and a waveguide is formed by scanning. At the right-side of FIG. 45 is a case where one light is irradiated from the side, and the position in the direction of the film thickness is controlled. FIG. 46 is an example in which one light is irradiated from the waveguide when the other light has approached the waveguide end surface, and at other times the light is irradiated as outside light (light introduced from the surface, back or side of the film), for the purpose of increasing the degree of freedom of the waveguide writing pattern and improving the precision of linkage of the waveguides. The examples shown in FIG. 42, FIG. 45, center and FIG. 46 utilize light of 3 wavelengths, which facilitates control of the 3-dimensional refractive index distribution. This also makes it possible to provide a Z-axis waveguide in the direction of thickness, or a waveguide whose depth is made to vary.

In cases where a plurality of lights are used, they may be of mutually differing wavelengths, or in some cases 2 or more lights of the same wavelength may be used.

A mirror, grating, hologram, prism, lens, waveguide, pinhole or slit may also be situated in the entirety or at least a part of the region through which the light passes.

Furthermore, by the methods described above it is possible to realize a bend waveguide, coupling between a space beam and a waveguide, a space beam coupler which couples space beams, etc. The light may be irradiated either simultaneously or alternately. It will also be understood from the above descriptions that LD/fiber and waveguide couplers are also included as examples.

In addition, 3 or more beams may be used to form a Y-branch, star coupler, cross waveguide, or the like. A variety of devices such as space waveguides, wavelength filters and mode converters may also be realized.

The light-emitting end and the photorefractive material may be either contacting or separated.

A photosensitive material may also be used instead of a photorefractive material. If a photosensitive material is used, the soluble sections may be etched. They may also be covered.

The light-supplying sources or light-receiving device may be optical waveguides, optical fibers, semiconductor lasers, light-emitting diodes, photodiodes, lenses, holograms, prisms, gratings, or any other devices capable of supplying light. However, in cases where direct light from a semiconductor laser is used, the material must have sensitivity in the wavelength region of from the red to infrared regions. In cases where a passive device such as a waveguide is used, the light passing through it and the spectral sensitivity of the material must match.

A mirror may intervene and a photorefractive material formed between a PD and a waveguide to form a waveguide therein. A waveguide and an LD may be connected in the same manner. When light is emitted from both a waveguide and an LD thus connected, a waveguide may be formed by an effect similar to that shown in FIGS. 44 to 46. That is, a very effective optical waveguide is formed thereby with optical SMT (optical surface mount technology). Furthermore, instead of a mirror, alternatively a grating, hologram, prism, lens, waveguide, pinhole or slit may be placed in the entirety or part of the region through which the light passes.

Figure 48:
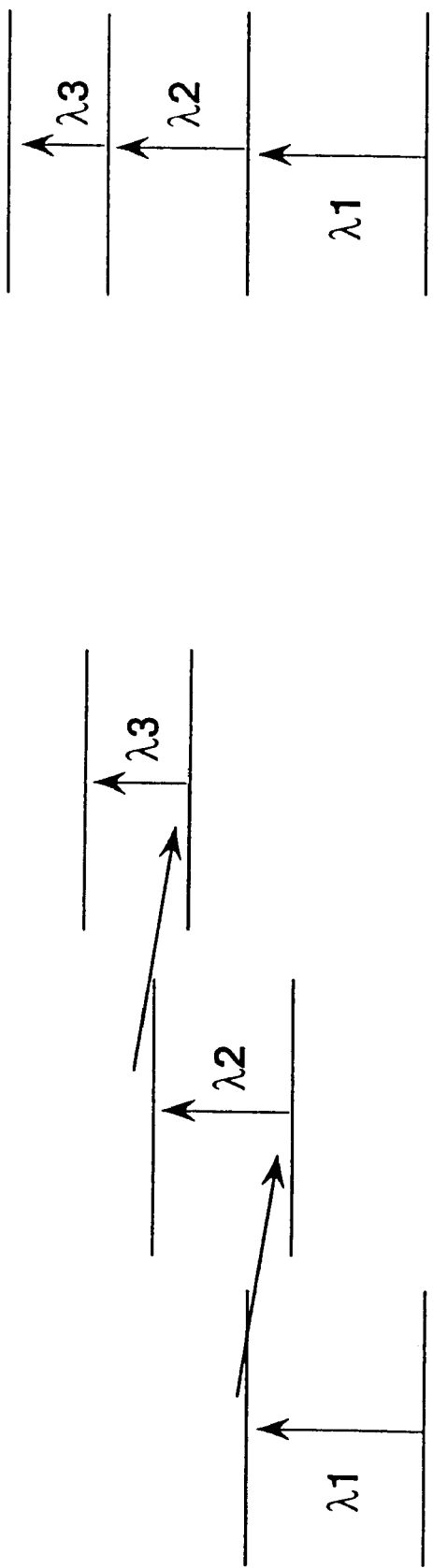
FIG. 48 is an illustrative view for explanation of another example of a method using multi-level excitation.

An example of a method for realizing multi-level excitation is, as shown in FIGS. 47 and 48, wherein, $\lambda_1$, $\lambda_2$ and $\lambda_3$ correspond to those appearing in the drawings, one in which a reaction is caused in the photorefractive material or photosensitive material by a substance which is excited to an excitation state by light of one wavelength and then further excited from that state to another state by light of another wavelength, or a substance which is excited to an excitation state by light of one wavelength, transferred from that state to another state, and then further excited to another state by light of another wavelength. Specific examples thereof include the sensitizing materials described in, for example, IBM J. Res. Develop. Vol.26 (1982) 217 and U.S. Pat. No. 4,571,377. That is, there may be mentioned α-diketones (diacetyl, benzyl, camphaquinone), tetrazine, dimethyl-s-tetrazine, carbazole, benzophenone, oxirane, tetraphenyloxirane, and combinations of donor molecules such as 9,10-dibromoanthracene, protoporphyrin IX dimethyl ester, benzyl or tetraphenyl porphyrin, and acceptor molecules such as napthalenesulfonyl chloride, α-chloromethylnaphthalene and quinolinesulfonyl chloride. Here, the acceptor sometimes functions as a reaction initiator for polymerization, etc.

An ether or the like may also be used as the donor, and TCNB as the acceptor (K. Kimura, Reviews of Chemical Intermediates Vol.2, Verlag Chem. GmbH (1979) p.321).

These may be incorporated into or added by bonding to a matrix comprising a polymer, oligomer, monomer, or a mixture thereof, or a polymerization initiator or other high refractive index or low refractive index monomer may be incorporated into or added by bonding thereto to make a photorefractive material. For example, by superimposing light of 300–500 nm and light of 700–1100 nm on a diacetyl-, benzyl- or camphaquinone-diketone in a poly (methyl-, ethyl- or isobutyl-cyanoacrylate) or a diacetyl-, benzyl- or camphaquinone-diketone in a poly(methyl methacrylate); light of 300–330 nm and light of 400–430 nm on a carbazole in poly(methyl methacrylate); and 2 photons of light of 488 nm on a dimethyl-s-tetrazine in poly(vinyl carbazole), the residual monomer reacts to produce a refractive index change. Other epoxy matrixes and the like may also be used. In addition, materials prepared by adding the above-mentioned donor/acceptor combinations to polymers, oligomers and monomers such as methyl methacrylate, vinyl, epoxy, acryl, alkyl acrylate/methacrylate, hydroxy acrylate/methacrylate, glycol acrylate/methacrylate, allyl acrylate/methacrylate, epoxy acrylate/methacrylate, aminoplast acrylate/methacrylate, and combinations thereof, may be used as 2-photon or 2-wavelength materials. Furthermore, if high refractive index materials such as vinyl carbazole and polymerization initiators are added to these, it is possible to increase the rate and size of the refractive index change. Photorefractive materials containing other multi-level materials, such as 4-level, 2-photon photochemical materials and 3-level, 2-photon photochemical materials, may also be used. Since a diacetyl-, benzyl- or camphaquinone-diketone in a poly(methyl-, ethyl- or isobutyl-cyanoacrylate) or a diacetyl-, benzyl- or camphaquinone-diketone in a poly(methyl methacrylate) is sensitive to light of 700–1100 nm, there is the added merit of allowing the use of a semiconductor laser.

Reinforcement of the hardness and stability of these materials is also possible by irradiation with UV light and heat treatment. The materials are not limited to the above, and other polymers, glass or any other material whose refractive index changes with irradiation of superimposed lights of differing wavelengths may be used.

In cases where a photosensitive material which insolubilizes (cures) with light irradiation is used instead of a photorefractive material, for example, a substance which produces the multi-level process described above may be added to cause a curing reaction with the superimposed light of different wavelengths. Upon development after local insolubilization of the photosensitive material, the material remains in the form of the waveguide. The cavities may be filled with a low refractive index material. UV irradiation or heat treatment may also be performed. This allows reinforcement of the hardness and stability. Conversely, when photosensitive materials which solubilize with light irradiation are used, pores open in the light-irradiated sections. A high refractive index material may be injected in the pores to cover them, to bring out the converging effect. Any other materials, such as photocuring and photosensitive polyimide epoxy resins, photosensitive glass, etc. which solubilize or insolubilize with light irradiation, may also be used.

Also, in order to give the wavelength of the writing light a degree of freedom, the light used to irradiate the photorefractive material or photosensitive material is preferably light generated from an optical device itself. This may be an LD, LED, waveguide laser amp, or the like.

Alternatively, the light used to irradiate the photorefractive material or photosensitive material may be light introduced to the optical device from outside, light generated in the optical device as a result of light introduced to the optical device from outside, light generated in the optical device by irradiating light on the optical device from outside, or combinations of these types of light.

Of the above, light generated in the optical device as a result of light introduced to the optical device from outside and light generated in the optical device by irradiating light on the optical device from outside may be obtained, for example, by adding a substance selected from fluorescent pigments and inorganic fluorescent substances, two-photon absorbing/emitting substances such as LD light-measuring phosphor, up-conversion substances such as rare earth metal ions and SHG substances, to part or all of the optical device, to produce luminescence by the excitatory light. With naturally luminescent materials such as glass and polymer waveguides, luminescence may be produced by irradiating part or all of the optical device with excitatory light.

Alternatively, the light used to irradiate the photorefractive material or photosensitive material may be luminescence produced by excitatory light from the optical device as a result of adding a substance selected from fluorescent substances, two-photon absorbing/emitting substances, up-conversion substances and SHG substances, to part or all of the material.

Also, particularly in the case of coupling between LD/fibers or a waveguide, the sensitivity of the photorefractive material or photosensitive material is sometimes not in the LD light range. To counter this, as shown in FIG. 21 for example, the irradiated light may be selectively reflected from the LD light emitting region of the LD or a roughly equivalent region, and a SOLNET produced by interaction between the propagated light and the reflected light. A dielectric multilayer mirror may be used to reflect light in a wavelength region of high sensitivity, such as the green to ultraviolet region. Alternatively, as shown in FIG. 22, the same effect may be obtained by forming an absorbing film in the region surrounding the LD light emitting region of the LD or another region which is roughly equivalent thereto. Patterning of the film is possible by a common photolithography technique, or by self-align etching or lift-off using a photosensitive film which is sensitive to LD light.

In this case, a microlens may be formed at or in the vicinity of the end surface of the fibers or waveguide, which may alternately be made into a platelet shape.

Another example of LD/fiber or LD/waveguide coupling is luminescent radiation of light of a writing wavelength resulting from optical excitation. This example is shown in FIG. 49. For example, a luminescent film is formed in the LD light emitting region of the LD or a region which is roughly equivalent thereto, and light of wavelength $\lambda 1$ is irradiated from the waveguide or fiber end. When the light of wavelength $\lambda 1$ is irradiated on the luminescent film, light of wavelength $\lambda 2$ luminesces and radiates. As a result, the same state is achieved as if $\lambda 2$ light is emitted from the LD and $\lambda 1$ light is emitted from the waveguide or fibers. As another example, an outside light is $\lambda 1$ light and $\lambda 2$ light is emitted from the waveguide or fibers. As a result, the same state is achieved as if $\lambda 2$ light is emitted from the LD and $\lambda 2$ light is emitted from the waveguide or fibers. In cases where luminescent films are formed at both the LD end and the waveguide or fiber end, $\lambda 2$ light radiates when $\lambda 1$ light is irradiated from the outside, and thus the same state is achieved as if $\lambda 2$ light is emitted from the LD and $\lambda 2$ light is emitted from the waveguide or fibers. Here, the luminescent films may be selected from many types of fluorescent materials which radiate light of wavelengths 11 and $\lambda 2$, to make it possible to achieve the same state as if $\lambda 1$ light is emitted from the LD and $\lambda 2$ light is emitted from the waveguide or fibers. In the examples described thus far, it need not be mentioned that the $\lambda 1$ light and $\lambda 2$ light may be switched. Also, the light irradiated to produce luminescence may also contain light of a wavelength $\lambda e$ especially for excitation.

In this case as well, a microlens may be formed at or in the vicinity of the end surface of the fibers or waveguide, which may alternately be made into a platelet shape.

Here, there is no restriction to LD/waveguide or fiber coupling, as waveguide/fiber coupling and waveguide/PD coupling, when writing from both ends is required, are possible using the above-mentioned methods.

Figure 50:
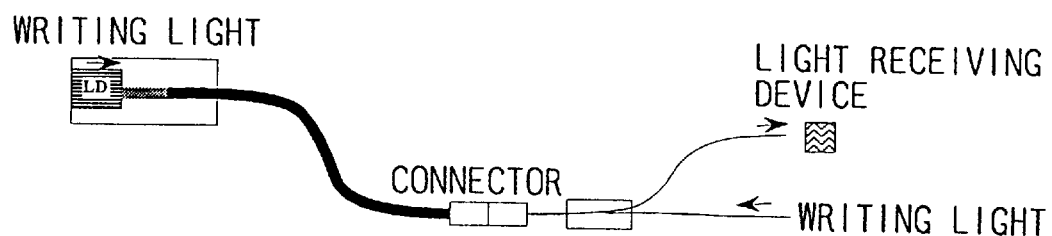
FIG. 50 is an illustrative view for explanation of an example of a method of monitoring LD coupling.

FIG. 50 shows an example of a method of monitoring LD coupling. A photorefractive material or photosensitive material is situated between the LD and the fibers (or waveguide). Writing light is emitted from the LD and fibers (or waveguide). Here, by monitoring the intensity of the LD writing light using the branch as shown in the drawing, it is possible to improve the coupling efficiency based on a simple determination of the optimum state for the coupling.

The following embodiments may also be used for the self-aligned optical coupling method of the present invention.

That is, in self-aligned optical coupling for coupling of optical devices by situating a photorefractive material in the entirety or part of the area between a plurality of optical devices and irradiating the photorefractive material with light from the plurality of optical devices to impart an refractive index distribution, the emitted light from one of the devices is drawn by the refractive index distribution formed by emitted light from another of the devices, and this forms a refractive index distribution to form a coupling path between the devices.

Alternatively, in self-aligned optical coupling for coupling of optical devices by situating a photorefractive material in the entirety or part of the area between a plurality of optical devices and irradiating the photorefractive material with light from the optical devices to impart a refractive index distribution, the refractive index distribution may be formed by emitted light from a device with a small mode field size at the emitting end to form optical coupling between the devices.

Also, in self-aligned optical coupling for coupling of optical devices by situating a photorefractive material in the entirety or part of the area between a plurality of optical devices and irradiating the photorefractive material with light from the plurality of optical devices to impart a refractive index distribution, the wavelengths of emitted light of at least 2 or more of the optical devices may be different.

According to the method of the present invention, there is achieved an effect whereby light at the other end is called in (priming system) by a refractive index distribution due to light with a large angle of emission, and this allows an increase in the coupling efficiency between the optical devices. It is also possible to emit light from the end with a small mode size to enlarge the mode field and increase the coupling efficiency, and by combining this with the wavelength of the sensitization region or the sensitivity region of an initiator or monomer, it becomes possible to use emitted light from optical devices of differing wavelengths.

Figure 51:
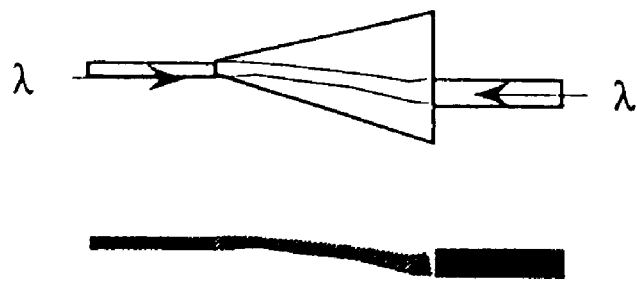
FIG. 51 is an illustrative view showing an example of a method of calling in light from one end by the refractive index distribution created by light with a large angle of emission.

FIG. 51 shows an illustration of an example of a method according to the priming system. Light at the other end is called in by a refractive index distribution created by light with a large angle of emission, to increase the coupling efficiency between the optical devices. This is a conceptual drawing, and the writing distribution from the LD end is self-focused for greater linearity.

Figure 56A:
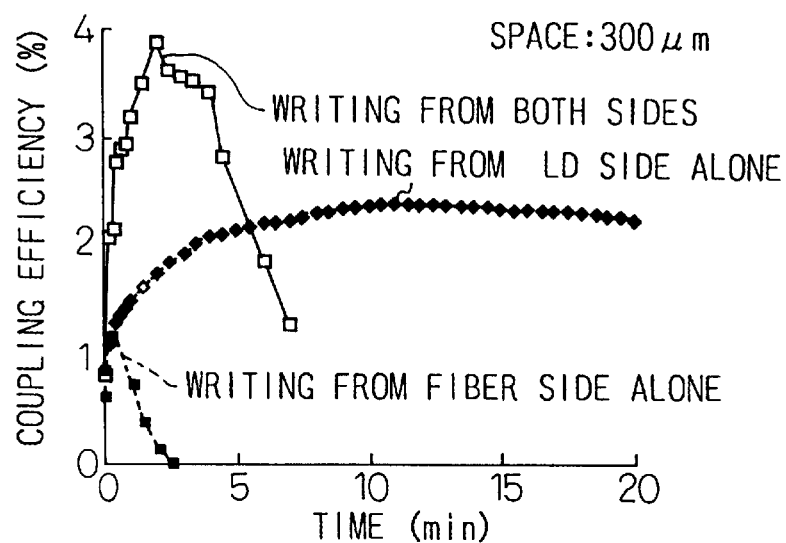
FIGS. 56A, 56B and 56C are graphs showing the coupling efficiency achieved according to the examples.
Figure 56B:
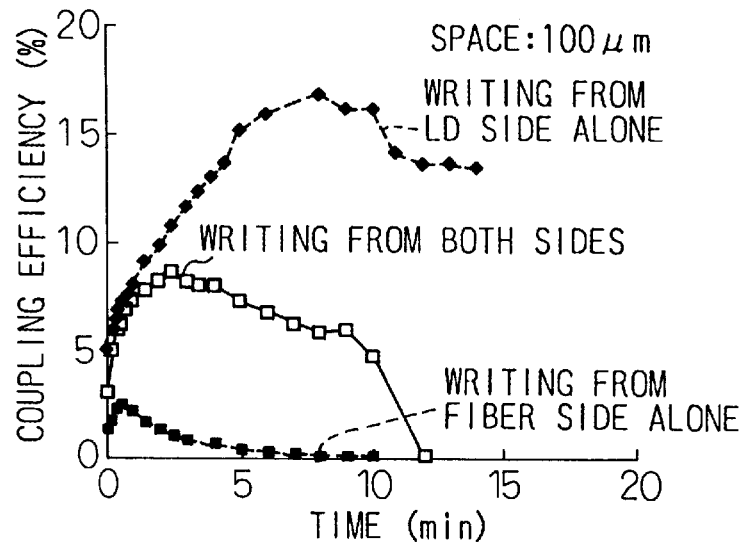
Figure 56C:
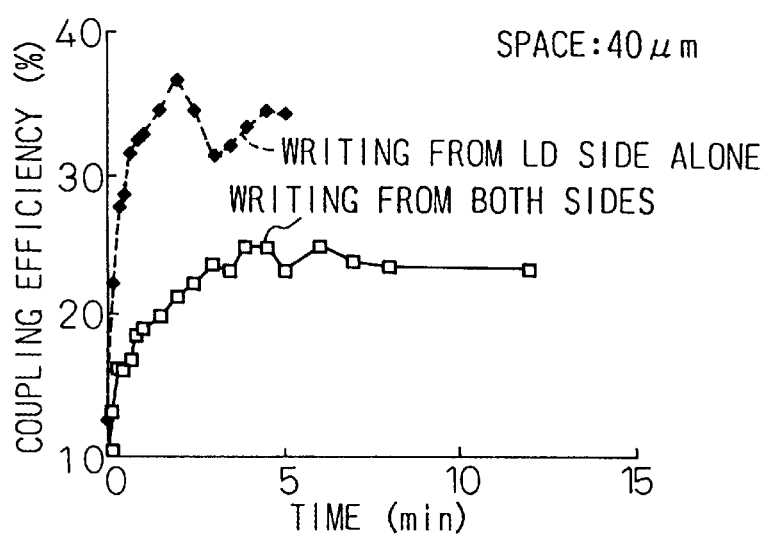

An explanation will now be given regarding a case of coupling between, for example, an LD of 680 nm and single mode fibers. FIGS. 56A, 56B and 56C are graphs showing the results of the coupling tests. The LD and single mode fibers are oriented to oppose each other over a space of 300, 100 or 40 $\mu$m which is filled with a photorefractive material. The material used may be, for example, a mixture of a vinyl carbazole, polymerization initiator, red sensitizing dye, or the like in an epoxy matrix. The LD is caused to luminesce (at 200 $\mu$W or less), while He-Ne laser light (633 nm, 20 $\mu$W) is simultaneously emitted from the fibers, resulting in the increase in efficiency as shown in FIG. 56B, to a coupling efficiency of 8% in the case of the space of 100 $\mu$m. Also, in the case of the space of 300 $\mu$m, the coupling efficiency of about 0.1% was increased to 4% by the writing from both sides as shown in FIG. 56A. In this case the LD light spreads over a large angle ($\theta p=11°$, $\theta v=17°$). Here, the light may be emitted from the He—Ne laser after light emission from the LD. Alternatively, this may be repeated. The light is not limited to CW, but may also be a pulse train. In this case, the duty factor may be varied to control the actual light intensity. During the writing of refractive index distributions, the writing light may be subjected to intensity modulation. For example, in the case of a pulse train with a duty factor of 10:1, the actual light intensity may be reduced to $\frac{1}{10}$. This method is particularly useful under conditions where the light intensity cannot be freely varied, such as in the case of writing with LD light.

Figure 52:
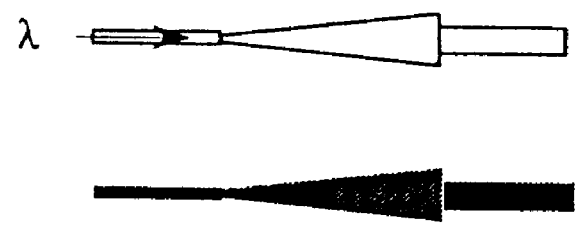
FIG. 52 is an illustrative view showing an example of a method of writing emitted light from an LD alone.

FIG. 52 is an illustrative view of an example of a writing method by emitting light from an LD alone under the same conditions described above. By writing from the LD, it is possible to form a tapered refractive index distribution. This distribution may be the result of the self-focusing effect, or it may obtained as a result which includes no self-focusing effect. It may also be obtained as a result which partially includes a self-focusing effect. The mode field size of the LD is smaller than that of the fibers or waveguide. In this case of the space of 100 $\mu$m, as shown in FIG. 56B, the writing was accompanied by an increase in efficiency to obtain a 16% coupling efficiency. The mode size of the LD is believed to be enlarged by the refractive index distribution, thus improving the coupling efficiency.

When the space was made to be 40 $\mu$m, the coupling efficiency further increased to 35%. Here, there is no particular need for a linear waveguide, as the role of a waveguide may be carried out so long as a condensing refractive index distribution (for example, of a taper shape, etc.) can be produced as a result of self-focusing (see, for example, FIG. 53).

As shown in FIGS. 56A–56C, with writing from only the fiber end there is virtually no increase in the coupling efficiency (FIGS. 56A and 56B), and thus the effect may be said to be small compared to the two methods described above.

Figure 57A:
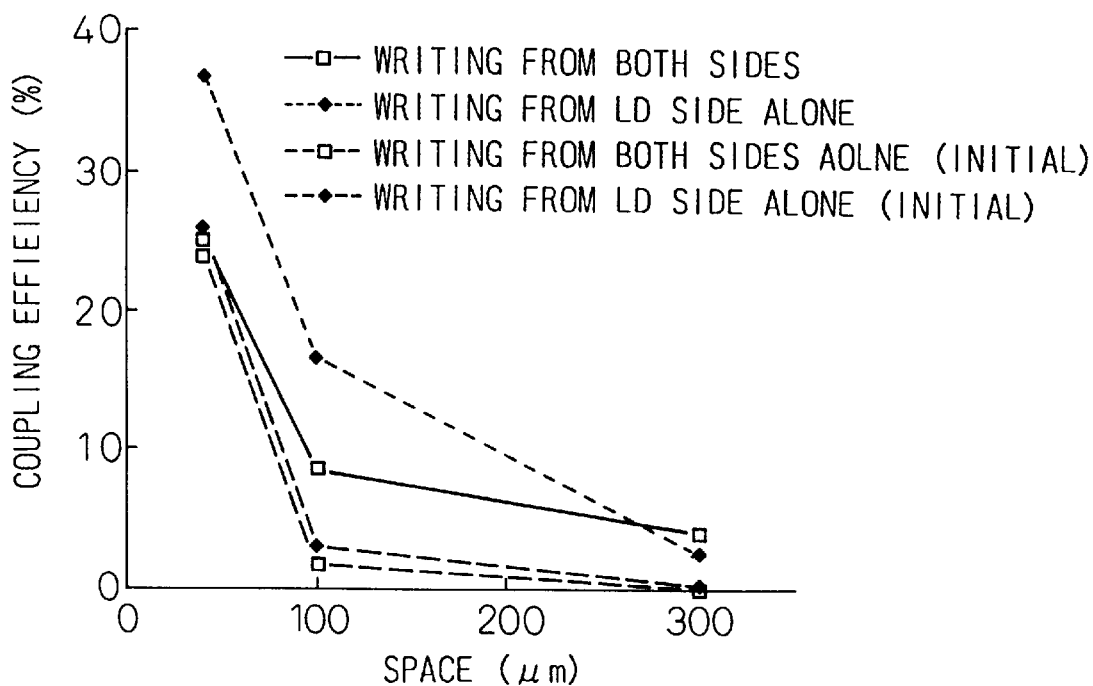
FIGS. 57A and 57B are graphs showing the coupling efficiency by writing from both sides and writing from the LD side alone.
Figure 57B:
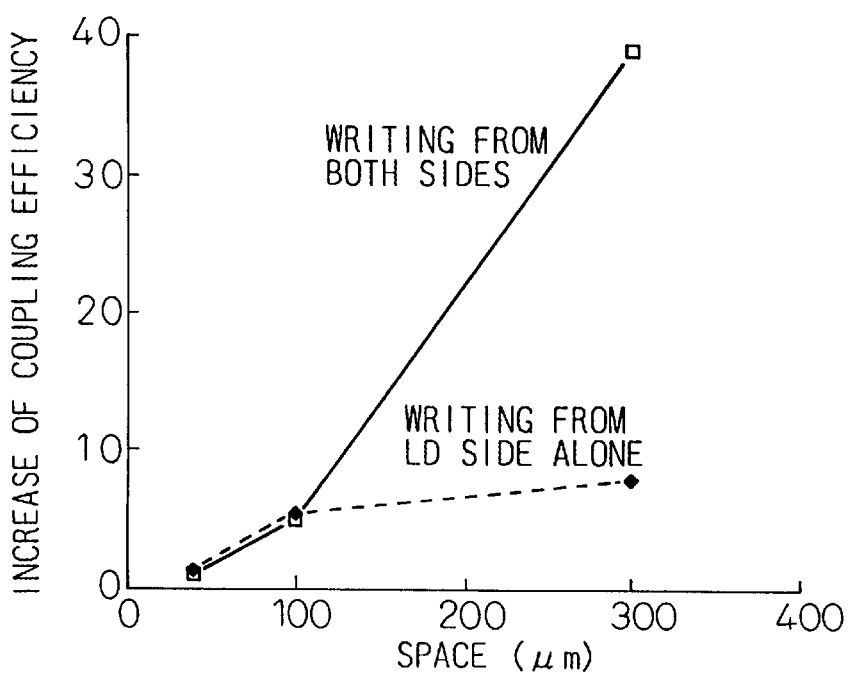

FIGS. 57A and 57B are graphs showing the increase in the coupling efficiency by the writing from both sides and by the writing from the LD side alone. The vertical axis represents "Peek Efficiency/Initial Efficiency". Larger the space between the LD and the fiber, higher the effect by the writing from both sides. The increase of the coupling efficiency at the space of 300 $\mu$m was 10 times by the writing from the LD side alone, but as high as 40 times by the writing from both sides. It is supposed that this is because the increasing effect of the LD beam spot size is merely expected by the writing from the LD side alone, while the effect of calling in the light beams from both the LD and the fiber applies in addition to the LD beam spot size-increasing effect by the writing from both sides. Where the space is as small as 30 $\mu$m, the increase of the coupling efficiency is low in both cases. The reason is supposed as follows. The beam-calling-in effect by the writing from both sides is attained only at an interacting distance of 100 $\mu$m or more, but is insufficient at an interacting distance of 30 $\mu$m, where the deviation of the fiber axes is several $\mu$m, and a distance of 100 $\mu$m or more is also necessary for increasing the beam spot size with a sufficient gradual rate.

In these examples, the 2 wavelengths of 680 nm ($\lambda 2$) of the light from the LD and 633 nm ($\lambda 1$) of the light from the fibers were used. The light of these wavelengths $\lambda 1$ and $\lambda 2$ are both in the sensitivity range of red sensitizing dyes (FIG. 54). Also, the light from the fibers ($\lambda 1$) may be 680 nm to be the same wavelength as the light from the LD ($\lambda 2$). Alternatively, the emitted light from the fibers ($\lambda 1$) may be blue to ultraviolet light with a wavelength in the sensitivity range of an initiator or monomer (FIG. 55).

Furthermore, as shown in FIG. 58, a fluorescent substance may be situated at or near the emitting end of one of the optical devices and emitted excitatory light ($\lambda 1$) from the other one, to form a refractive index distribution by the excitatory light and the fluorescent light ($\lambda 2$). In this case, since the fluorescent light is usually weaker than the excitatory light, the sensitivity is preferably made to be larger in the wavelength of the fluorescent light. Thus, even when writing light is necessary from both ends, light need be incident only from one end, thus allowing the process to be simplified. An example of a fluorescent substance is a fluorescent pigment dispersed in a photocuring substance.

Where He—Ne laser beam (10 $\mu$W) was emitted from an optical fiber of a core diameter of 6 $\mu$m into a red sensitized photorefractive material, it was observed that a linear waveguide extending from the light-emitting end of the fiber core was formed in the photorefractive material within 10 seconds. It was also observed that a linear waveguide or taper-shaped refractive index distribution was formed from the emitting end by similar writing from a visible LD. The LD light was observed to be transmitted linearly or with a small spreading angle from the emitting end by the self-focusing effect.

According to the present invention, even when off-axis placement between the optical devices exists, even when the angles of divergence of emitted light from each of the optical devices are different, even when the mode field sizes at the emitting ends of each of the optical devices are different, even when the wavelengths of the emitted light from each of the optical devices are different, and even when the positioning precision is rough, there may be realized optical devices, self-aligned optical couplers and the like, including waveguides and refractive index distributions, wherein connection is automatically established between the waveguides and a large degree of freedom of shape is possible, as well as methods for their production.

According to the present invention, even when off-axis placement between the optical devices exists, even where the angles of divergence of emitted light from each of the optical devices are different and even when the mode sizes at the emitting ends of the respective optical devices are different, it is possible to realize simple conversion to a desired pattern, and the optical coupling efficiency between devices is improved.

In addition, it is possible to form simple waveguides and coupling paths, with alleviation or elimination of lowered efficiency due to the limits of mechanical precision of working to make V-grooves and raised portions, as well as stabilization of modules and a high degree of freedom.

Figure 59:
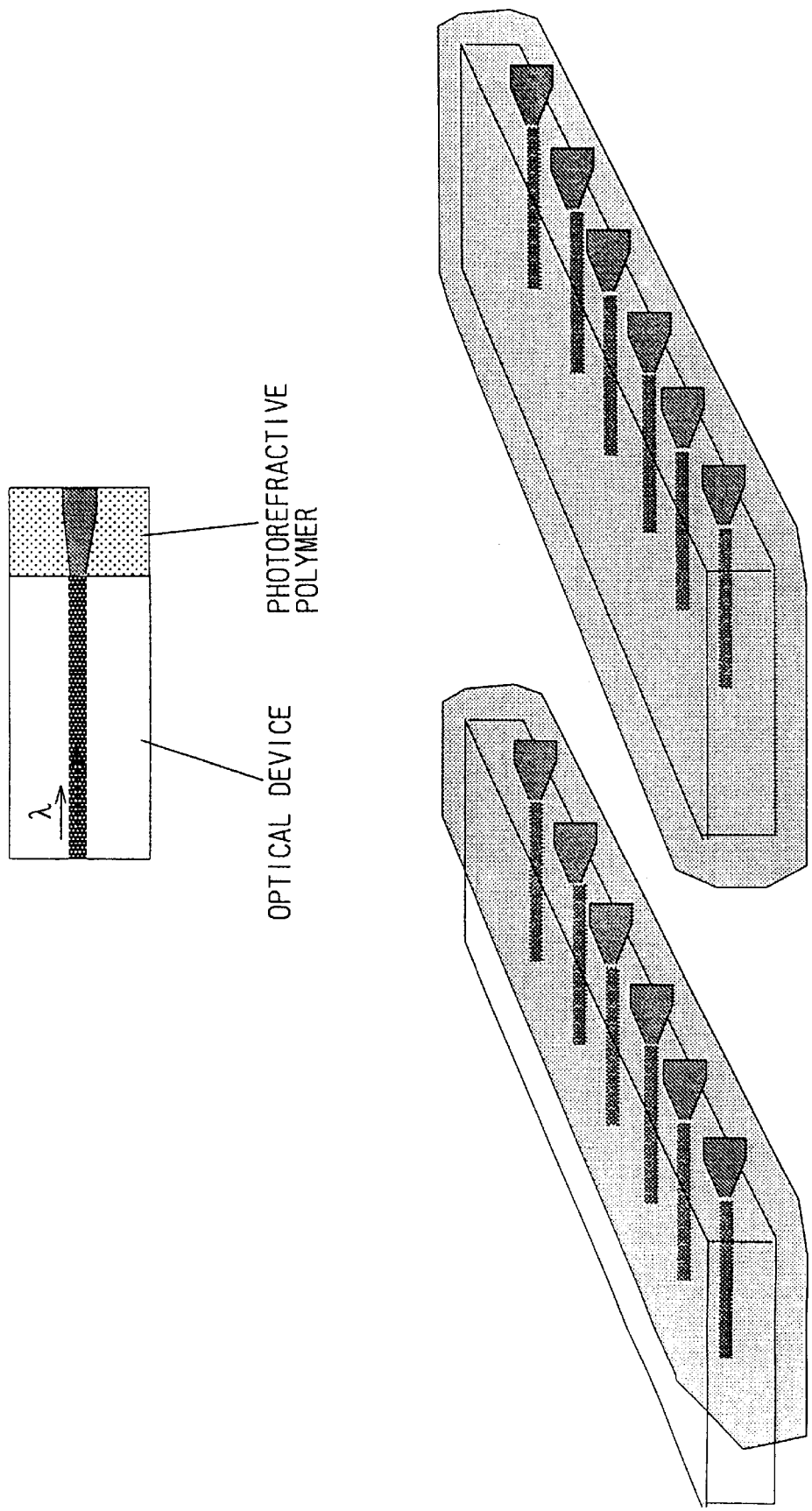
FIG. 59 is a conceptual view of a light coupled device.

FIG. 59 illustrates the concept of a light coupling device of the present invention, with an example in which the optical device is an LD (or waveguide). A photorefractive material is coated either as discrete chips or as an array prior to cutting off discrete chips, and this is exposed to light emitted from the LD (or waveguide) to form a refractive index distribution. It is thus possible to convert the characteristic light emission pattern of the device to a proper pattern for emission. For example, the LD has a beam size of about 1 μm, but by widening this to about 10 μm, coupling between the fiber or waveguide is facilitated. The coating may be accomplished by, for example, dipping or spin coating all or a portion (which includes the light emitting end) of the device. The writing light is emitted from the light emitting end. In the case of an LD, it may also be driven to luminesce to produce the writing light. In particular, by utilizing the self-focusing effect of the emitted light to form the refractive index distribution, the confined state of the light is improved to allow formation of a satisfactory optical coupling path. The optical device may be, in addition to a waveguide or LD, an optical fiber, light-emitting device, photodiode, lens, hologram, prism, grating, mirror, pinhole, slit, or the like.

Actual examples of LD/photorefractive materials are given below. A 100 μm-thick photorefractive material layer is formed on a 680 nm LD. The material used may be prepared, for example, by adding a vinyl carbazole monomer, polymerization initiator, red sensitizing agent or the like to an epoxy matrix. The LD is caused to luminesce (around 680 μm) to write in the refractive index distribution, and the device is made by photocuring or thermosetting adhesion. This device provided a coupling efficiency of 17% with a single mode fiber. When an LD without refractive index distribution formation was used for fiber coupling in the same orientation, only 5% efficiency was achieved. It is believed that the mode size of the LD was enlarged by the refractive index distribution to thus improve the coupling efficiency.

Figure 60:
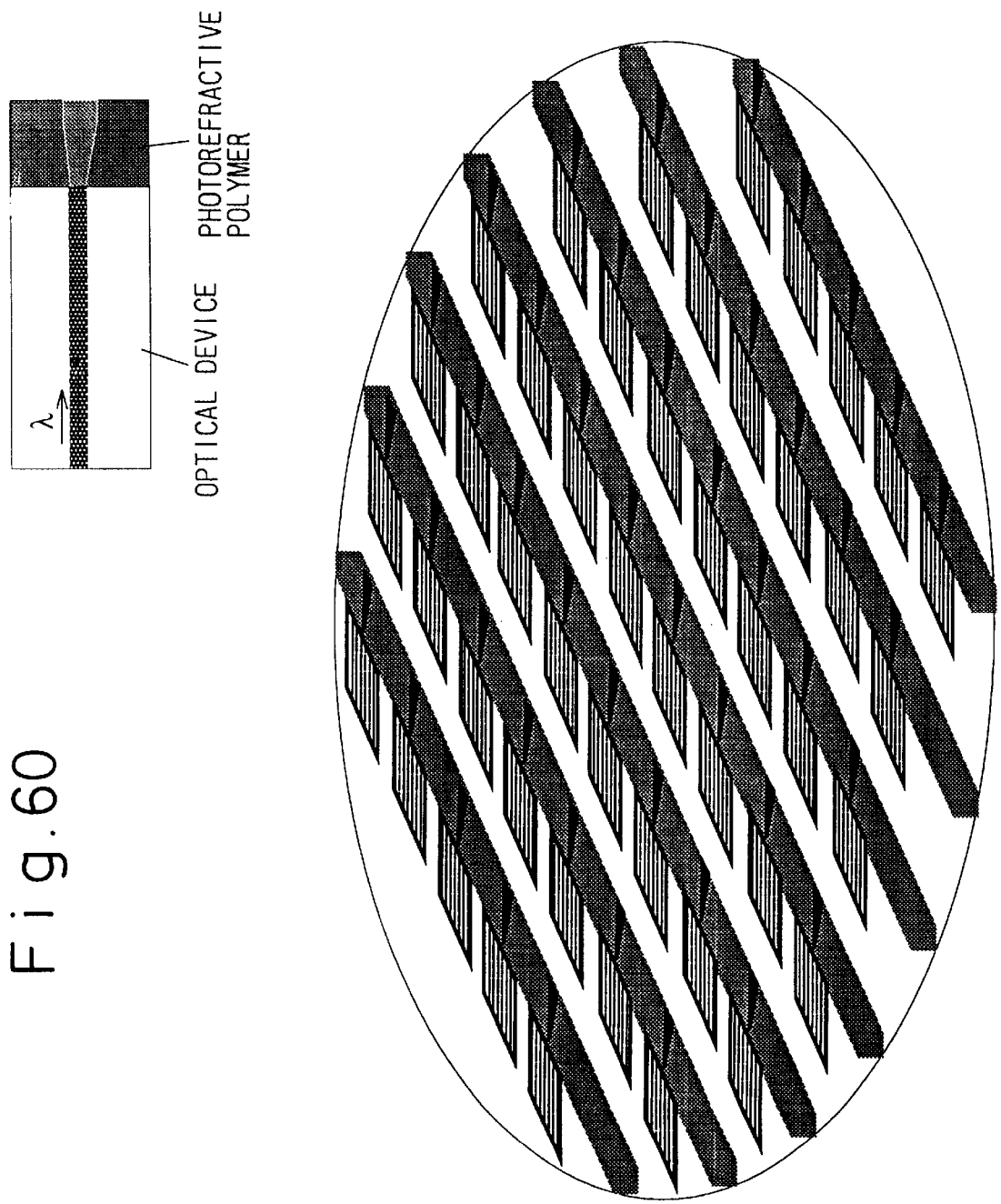
FIG. 60 is an illustrative view showing an example of a method of concurrently forming refractive index distributions in an LD wafer.
Figure 61:
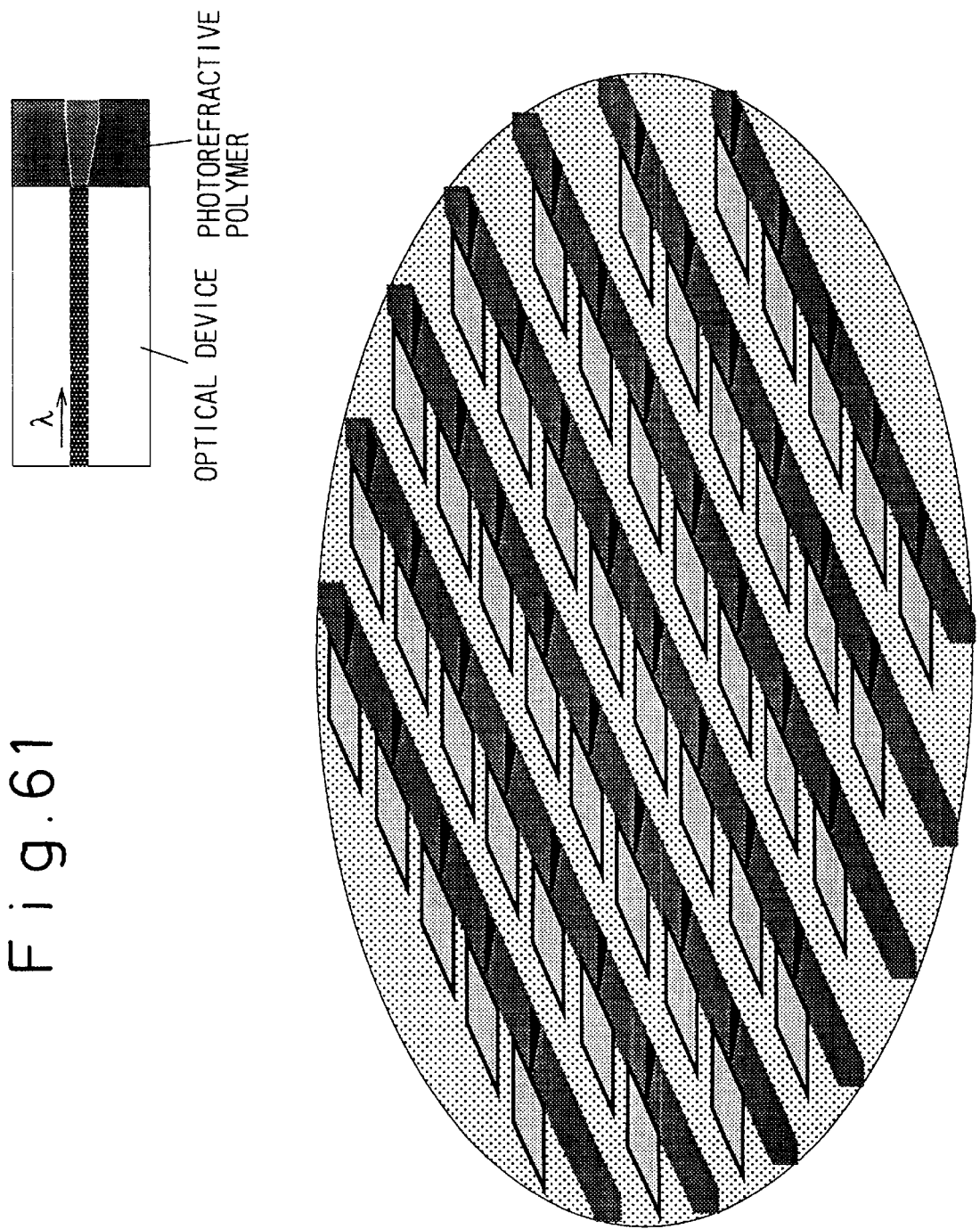
FIG. 61 is an illustrative view showing another example of a method of concurrently forming refractive index distributions in an LD wafer.

FIGS. 60 and 61 illustrate examples for concurrently forming refractive index distributions in LD wafers. A groove is formed at an emitting end of each LD, a photorefractive material is provided, and a refractive index distribution is formed by light emitted from the LD. After curing the photorefractive material, LD chips are cut off. If necessary, the polymer may be etched before cutting to make the cutting off easy. In the case of FIG. 61, the photorefractive material was formed on the whole wafer and, thus, the productivity is improved.

FIGS. 62A, 62B, 63A, 63B, 64A and 64B are illustrative views of structures of optical coupling modules.

Figure 62A:
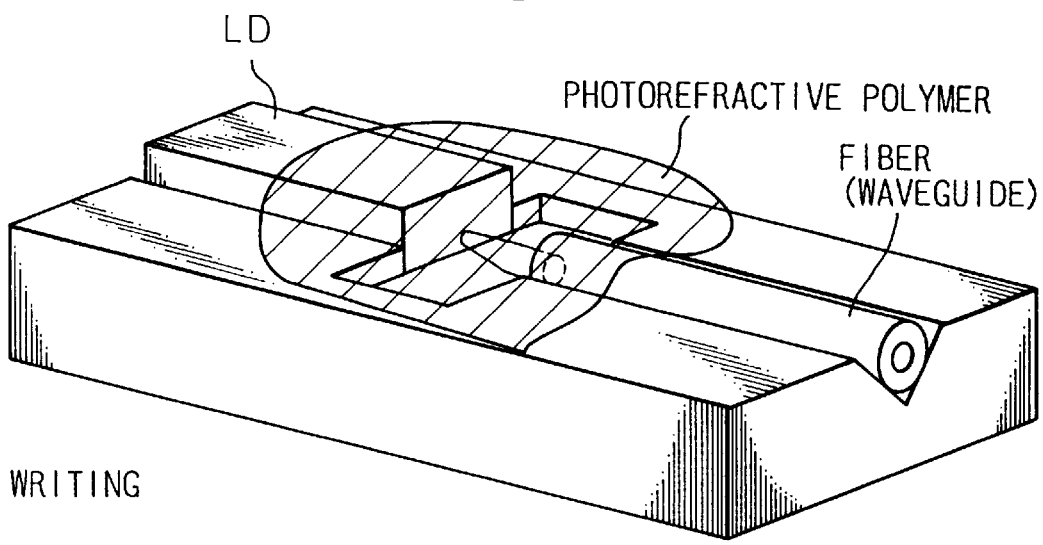
FIGS. 62A and 62B are illustrative views showing examples of an LD/fiber coupled module.
Figure 62B:
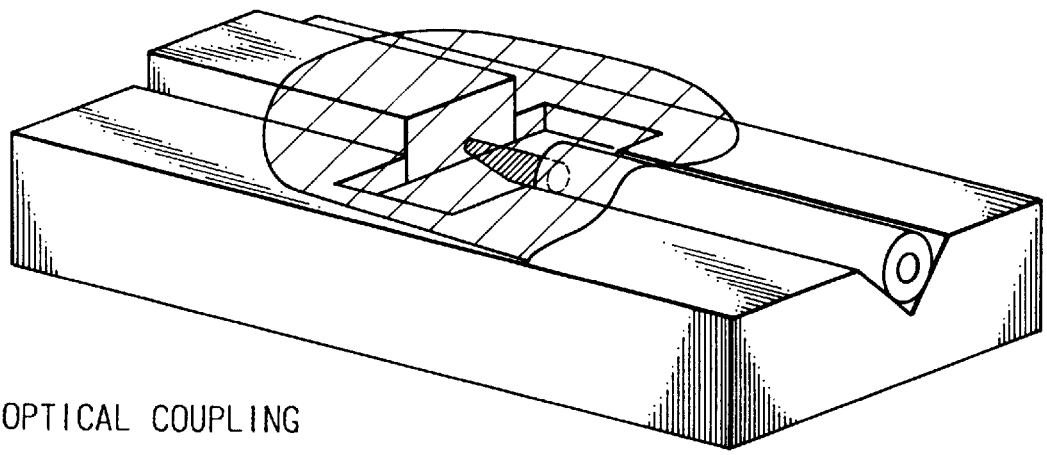

FIGS. 62A and 62B are examples of an LD/fiber (or waveguide) coupling module. After the LD and fiber have been fixed to a substrate provided with, for example, a Si V-groove and raised portion, the photorefractive material is dropped thereon, and a refractive index distribution is written by the self-focusing effect from the LD end (it may also be written from both the LD and fiber ends). This is adhesively fixed to make a module. The LD light spot size enlarges to the spot size of the fiber to be efficiently introduced into the fiber. The photorefractive material may be inserted only between the LD and fiber, or it may also cover all or part of the LD.

Figure 63A:
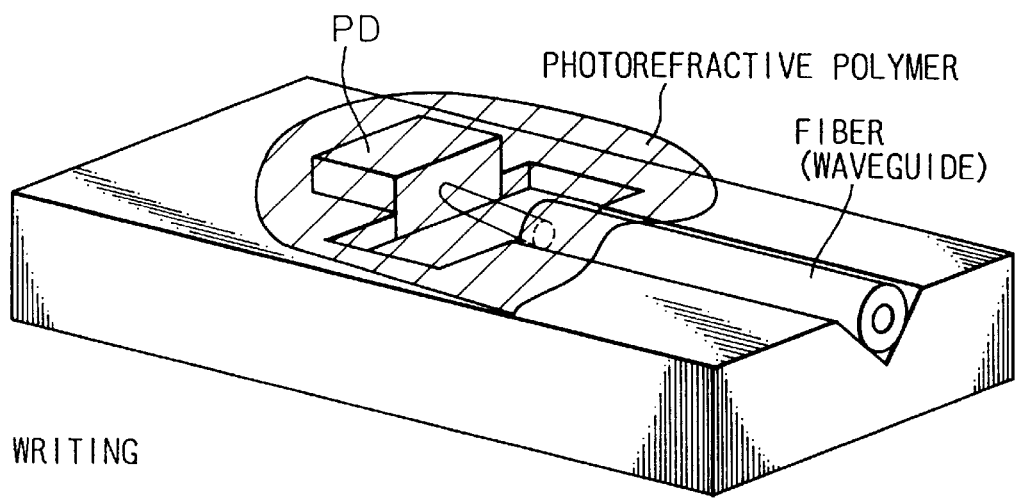
FIGS. 63A and 63B are illustrative views showing examples of a PD/fiber coupled module.
Figure 63B:
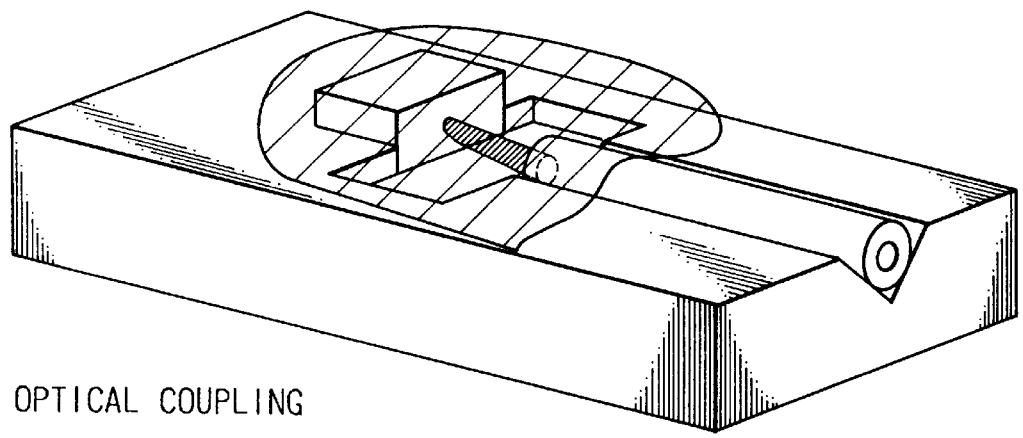

FIGS. 63A and 63B are examples of a PD/fiber (or waveguide) coupling module. After the PD and fiber have been fixed to a substrate provided with, for example, a Si V-groove and raised portion, the photorefractive material is dropped thereon, and a refractive index distribution is written by the self-focusing effect from the fiber end. This is adhesively fixed to make a module. The light from the fiber is introduced to efficiently enter into the PD. The photorefractive material may be inserted only between the PD and fiber, or it may also cover all or part of the PD.

Figure 64A:
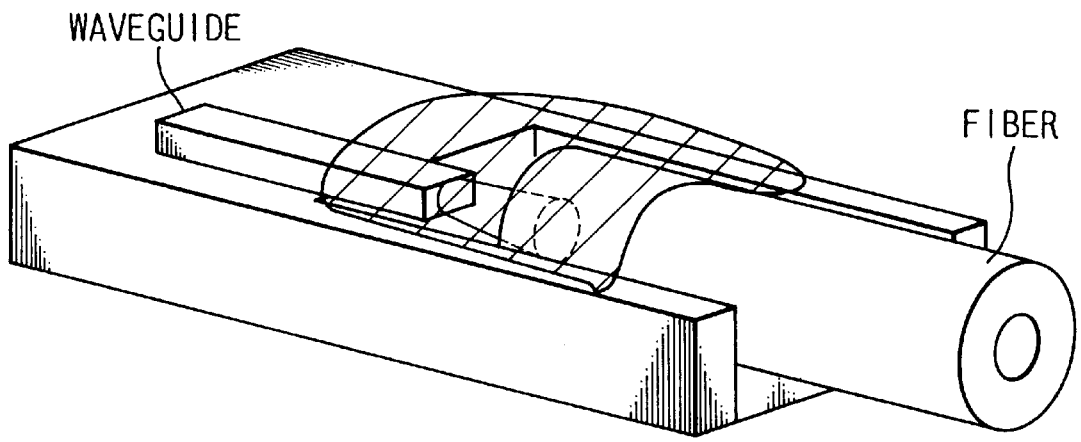
FIGS. 64A and 64B are illustrative views showing examples of a waveguide/fiber coupled module.
Figure 64B:
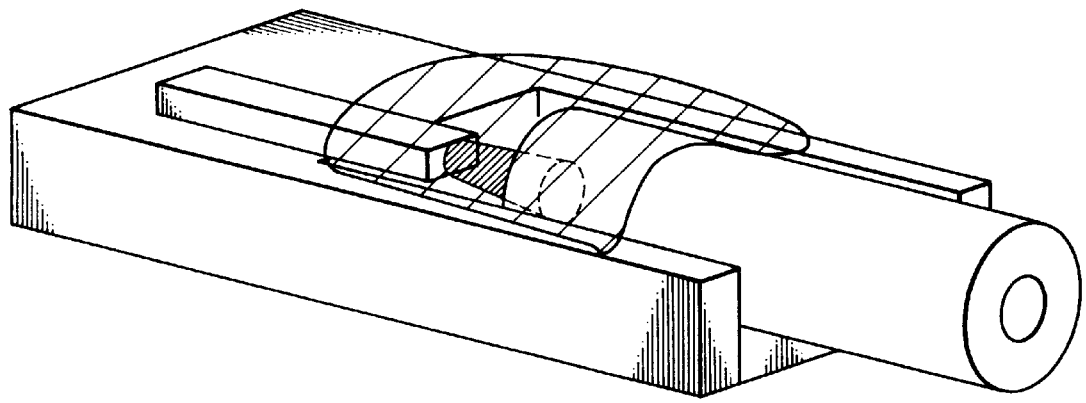

FIGS. 64A and 64B are examples of a waveguide/fiber coupling module. After, for example, a polyimide film on Si is worked to make a V-groove and raised portion, and the waveguide and fiber are fixed thereto, the photorefractive material is dropped thereon, a refractive index distribution is written by the self-focusing effect from both the waveguide and fiber ends. This is adhesively fixed to make a module. This accomplishes efficient coupling between the waveguide and the fiber. The photorefractive material may be inserted only between the PD and fiber, or it may also cover all or part of the waveguide.

A photosensitive material may also be used in place of the photorefractive material.

According to the first aspect of the present invention described above, it is possible to realize a method of automatically burrowing out a waveguide by light incidence and a method of forming a refractive index distribution by self-focusing and devices formed thereby; a method of forming a waveguide circuit network by automatically combining a few waveguides by light incidence and devices formed thereby; and optical couplers having an alleviated positioning accuracy employing waveguides obtained in such a manner.

Furthermore, it is possible to realize optical devices with a high degree of freedom and optical coupling formation, by a method employing light of a plurality of wavelengths.

The following provides an explanation of preferable embodiments of the second aspect of the present invention with reference to the drawings.

FIGS. 65–68 are respectively conceptual drawings of the non-linear optical material of the present invention.

Figure 65:
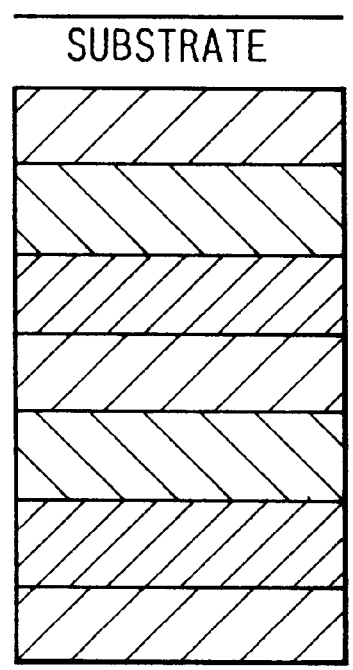
FIG. 65 is a conceptual drawing of a substance-modulated non-linear optical material.

FIG. 65 indicates an example of substance modulation. In this example, the substances of each layer are different in a multi-layer structure. Centro-symmetry is eliminated in the direction of film thickness by controlling the lamination sequence. In this example, the maximum Pockels effect is obtained when an electric field is applied in the direction of film thickness and the polarization of light is in the direction of film thickness.

Figure 66:
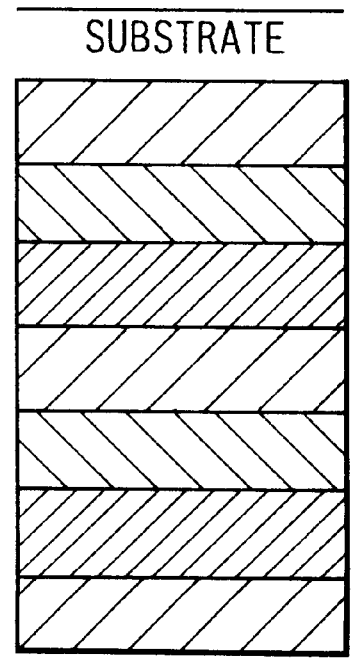
FIG. 66 is a conceptual drawing of a composition-modulated non-linear optical material.

FIG. 66 indicates an example of composition modulation. In this example, the composition of each layer is different in a multi-layer structure. Centro-symmetry in the direction of film thickness is eliminated by controlling the lamination sequence. In this example as well, the maximum Pockels effect is obtained when an electric field is applied in the direction of film thickness and polarization of light is in the direction of film thickness.

Figure 67:
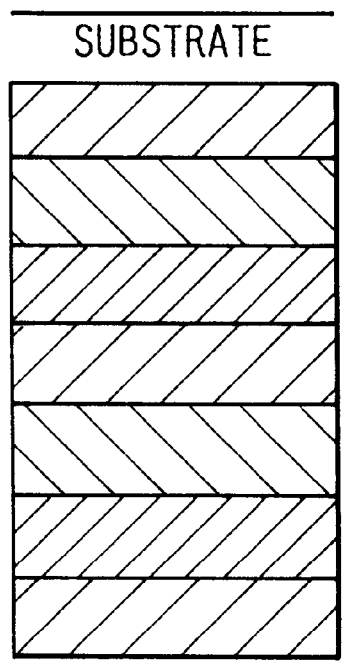
FIG. 67 is a conceptual drawing of a doping-modulated non-linear optical material.

FIG. 67 indicates an example of doping modulation. In this example, the doping material and doping concentration of each layer is different in a multi-layer structure. Centro-symmetry in the direction of film thickness is eliminated by controlling the lamination sequence. In this example as well, the maximum Pockels effect is obtained when an electric field is applied in the direction of film thickness, and the polarization of light is in the direction of film thickness.

Figure 68:
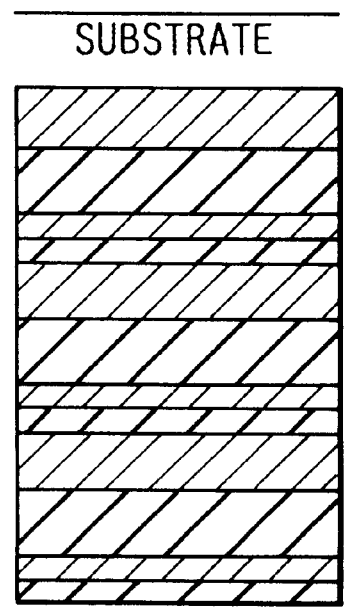
FIG. 68 is a conceptual drawing of a film thickness-modulated non-linear optical material.
Figure 69:
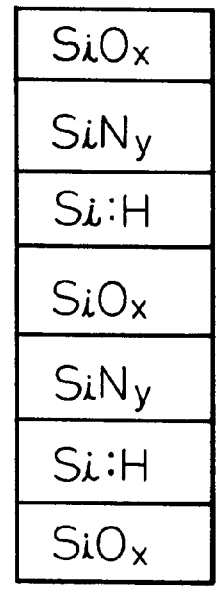
FIG. 69 is a schematic drawing showing an example of a substance-modulated non-linear optical material.

FIG. 68 indicates an example of film thickness modulation. In this example, the film thickness of each layer is different in a multi-layer structure. Reverse symmetry in the direction of film thickness is eliminated by controlling the lamination sequence. In this example as well, the maximum Pockels effect is obtained when an electric field is applied in the direction of film thickness, and the polarization of light is in the direction of film thickness.

In each of the above-mentioned examples, the effect of each repeating unit becomes uniform thereby allowing the obtaining of a large effect by making modulation cyclical.

FIGS. 69–81 indicate embodiments of the non-linear optical material of the present invention.

FIGS. 69–72 are examples of substance modulation. In the example shown in FIG. 69 in which a-$SiO_x$, a-$SiN_y$, and a-Si:H are sequentially laminated on a substrate, each material if deposited on an Si wafer by ordinary plasma CVD. a-Si:H is deposited by introducing 20% silane diluted with hydrogen under conditions of 50 sccm and 0.2 torr at a substrate temperature of 230° C., and applying 15 W of rf power. a-$SiN_y$ was deposited under the above-mentioned conditions and adding ammonia at 50 sccm. In the case of a-$SiO_x$, oxidizing reactive gas (such as $N_2O$) is added. A multi-layer structure can be obtained by sequentially repeating deposition. The thickness of each layer can be controlled according to deposition time. Since the deposition rate is 30 Å/min, film thickness becomes 3 Å in 6 seconds, 5 Å in 10 seconds, 10 Å in 20 seconds, and 30 Å in 60 seconds. However, deposition conditions are not limited to those mentioned above, but rather deposition can be performed at a faster rate. Since this structure does not have centro-symmetry in the direction of film thickness, when a voltage is applied, changes occur in the refractive index due to EO effects. A multi-layer structure fabricated in this manner in particular has properties such that electrons migrate from the nitride film side to the silicon side (Philosophical Magazine B, 1987, Vol. 55, 409–416). Thus, large polarization can be achieved that is effective in increasing non-linear optical properties.

Figure 70:
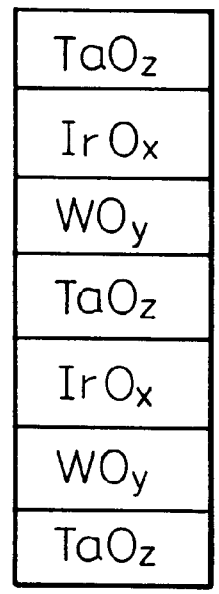
FIG. 70 is a schematic drawing showing another example of a substance-modulated non-linear optical material.

In the case of glass materials and transition metal oxides, deposition can be performed by, for example, multi-target simultaneous sputtering. In addition, various other deposition methods can also be used, including EB vapor deposition and CVD that utilizes the reaction between a transition metal chloride and water vapor. As shown in FIG. 70, in the case of using W, Ir and Ta for the transition metal, since $IrO_x$ has electron accepting properties, $WO_y$ has electron donating properties and $TaO_z$ has carrier blocking properties, polarization occurs efficiently resulting in the appearance of large non-linear optical properties.

In addition, as shown in FIG. 71, a rare earth ion doped material is created by using LHG-5:Nd glass made by Hoya Glass for a portion of the layer. As a result, a material is realized that has EO effects while also serving as an optical power source, waveguide laser or amplifier. When this material is formed into a waveguide and pump light at 800 nm is allowed to enter, light is emitted at 1052 nm. In addition, light at 1052 nm can also be amplified.

In addition, as shown in FIG. 72, by laminating a rare earth ion doped glass layer with various types of glass layers, a material can be realized that has EO effects while also serving as an optical power source, waveguide laser or amplifier.

In addition the above-mentioned sputtering, CVD, plasma CVD and EB vapor deposition processes, various other processes can be used for the deposition process, including optical CVD, sol-gel and flame deposition.

FIGS. 73–75 are examples of composition modulation. As shown in FIG. 73, a structure can be realized that does not have centro-symmetry in the direction of film thickness by changing the composition of a-SiN to a-$SiN_x$, a-$SiN_y$ and a-$SiN_z$. Consequently, when a voltage is applied, a change in the refractive index occurs due to EO effects. The band gap and electron donating properties of the nitride layer change according to its composition (Philosophical Magazine B, 1987, Vol. 55, 409–416). Thus, large polarization is able to be formed that has the effect of increasing non-linear optical properties. The composition of a-SiN can be changed by, for example, changing the flow volume of ammonia to 25, 50 and 100 sccm. The thickness of each layer can be controlled according to deposition time in the same manner as in the above-mentioned case of substance modulation.

In the case of a glass material or transition metal oxide, a non-linear optical material can be formed by changing the composite ratio of the transition metal as shown in, for example, FIGS. 74 and 75. In the case of using multi-target simultaneous sputtering, the power supplied to the targets should be changed. In addition, various other deposition processes can also be used, including EB vapor deposition and CVD using the reaction between a transition metal chloride and water vapor. In the case W, Ir and Ta are used for the transition metal, since $IrO_x$ is electron accepting, $WO_y$ is electron donating and $TaO_z$ is carrier blocking, the properties change according to these composite ratios, thereby resulting in the appearance of non-linear optical properties.

In addition, a rare earth ion doped material results by using LHG5:Nd glass made by Hoya Glass as a component of a portion of the layer. As a result, a material can be realized that has EO effects while serving as an optical power source, waveguide laser or amplifier. When this material is formed into a waveguide and pump light at 800 nm is allowed to enter, light is emitted at 1052 nm. In addition, light at 1052 nm can also be amplified.

In addition, a material can be realized that has EO effects while serving as an optical power source, waveguide laser or amplifier by doping rare earth ions. As a result, since this enables switching functions such as optical pick-up and so forth to be given to the material, devices such as variable wavelength light source and tunable optical switch can be realized.

In addition to the above-mentioned sputtering, CVD, plasma CVD and EB vapor deposition processes, various other processes can be used for the deposition process, including optical CVD, sol-gel and flame deposition.

FIGS. 76–78 are examples of doping modulation. For example, as shown in FIG. 76, a structure can be realized that does not have reverse symmetry in the direction of film thickness by sequentially laminating non-doped a-Si:H, B-doped a-Si:H and P-doped a-Si:H on a substrate. Consequently, when a voltage is applied, a change in the refractive index occurs due to EO effects. Since p–n junctions are formed in the film, large polarization can be formed thereby having the effect of increasing non-linear optical properties. B doping can be performed by introducing diborane during a-Si:H deposition, while P doping can be performed by introducing phosphine. The thickness of each layer can be controlled according to the deposition time in the same manner as in the case of the above-mentioned substance modulation.

Another example is shown using a glass material. As shown in FIG. 77, for example, the dopant is modulated in $SiO_x$. In this case, various deposition processes can be used, including plasma CVD, multi-target simultaneous sputtering, EB vapor deposition and CVD. For example, in the case of using W, Ir and Ta for the dopant transition metal, since IrOx is electron accepting, WOy is electron donating and TaOz is carrier blocking, properties change according to these composite ratios, thereby resulting in the appearance of non-linear optical properties.

In addition, a rare earth ion doped material as shown in FIG. 78 results by, for example, using LHG5:Nd glass made by Hoya Glass as a component of a portion of the layer. As a result, a material can be realized that has EO effects while serving as an optical power source, waveguide laser or amplifier. When this material is formed into a waveguide and pump light at 800 nm is allowed to enter, light is emitted at 1052 nm. In addition, light at 1052 nm can also be amplified.

In addition, by doping rare earth ions, a material can be realized that has EO effects while also serving as an optical power source, waveguide laser or amplifier. As a result, since this enables switching functions such as optical pickup and so forth to be given to the material, devices such as variable wavelength light source and tunable optical switch can be realized.

In addition, rare earth ions such as Nd ions may be modulated and doped in, for example, laser glass like LHG5.

In addition to the above-mentioned sputtering, CVD, plasma CVD and EB vapor deposition processes, various other processes can be used for the deposition process, including optical CVD, sol-gel and flame deposition.

Figure 79:
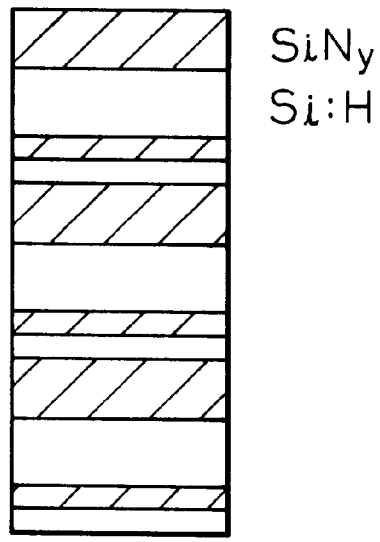
FIG. 79 is a schematic drawing showing an example of a film thickness-modulated non-linear optical material.
Figure 80:
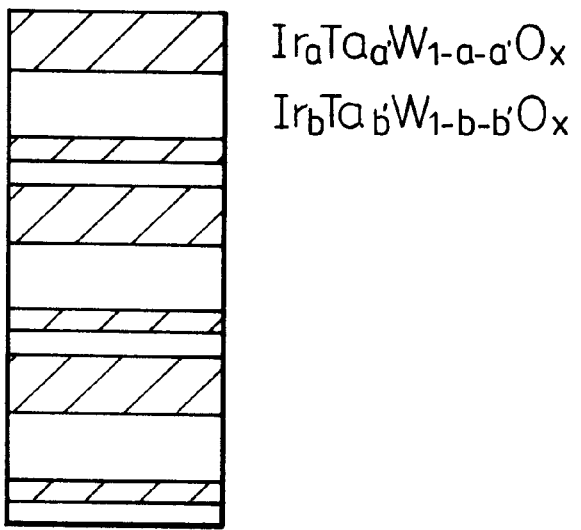
FIG. 80 is a schematic drawing showing another example of a film thickness-modulated non-linear optical material.
Figure 81:
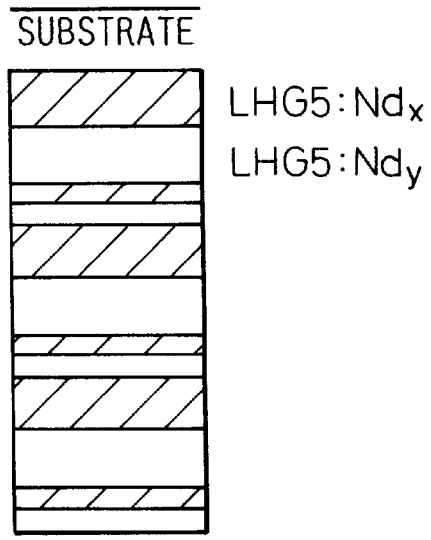
FIG. 81 is a schematic drawing showing another example of a film thickness-modulated non-linear optical material.

FIGS. 79–81 are example of film thickness modulation. As a result, a structure can be realized that does not have centro-symmetry in the direction of film thickness. Consequently, when a voltage is applied, changes occur in the refractive index due to EO effects. Examples of materials that can be used include those materials described with respect to substance modulation, composition modulation and doping modulation. In addition, various processes can be used for the deposition process, including plasma CVD, multi-target simultaneous sputtering, EB vapor deposition and CVD.

As explained for FIGS. 69–81, substance modulation, composition modulation, doping modulation and film thickness modulation can also be realized using not only inorganic materials, but organic materials as well.

Examples of organic crystal, polycrystalline or amorphous materials are shown below.

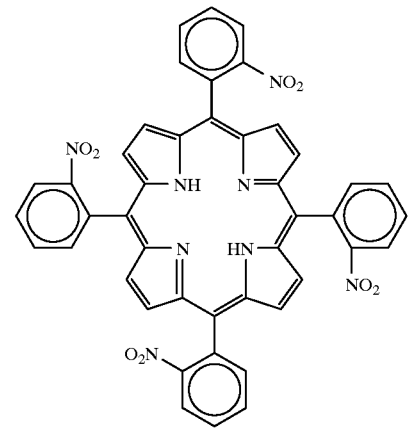

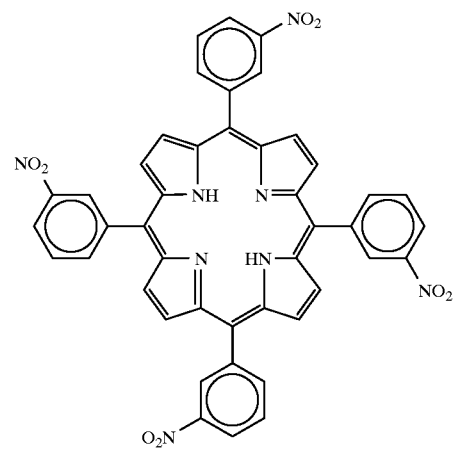

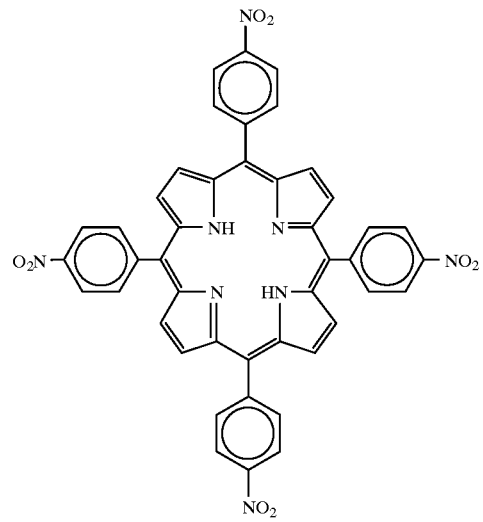

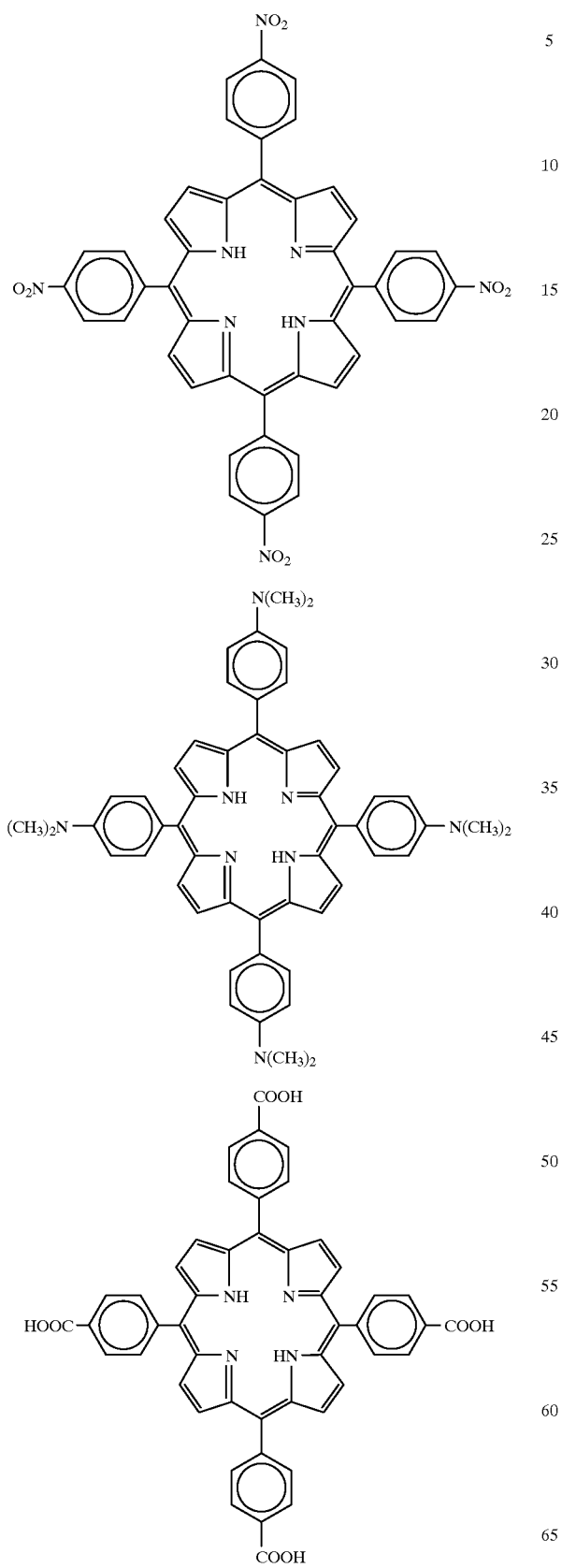
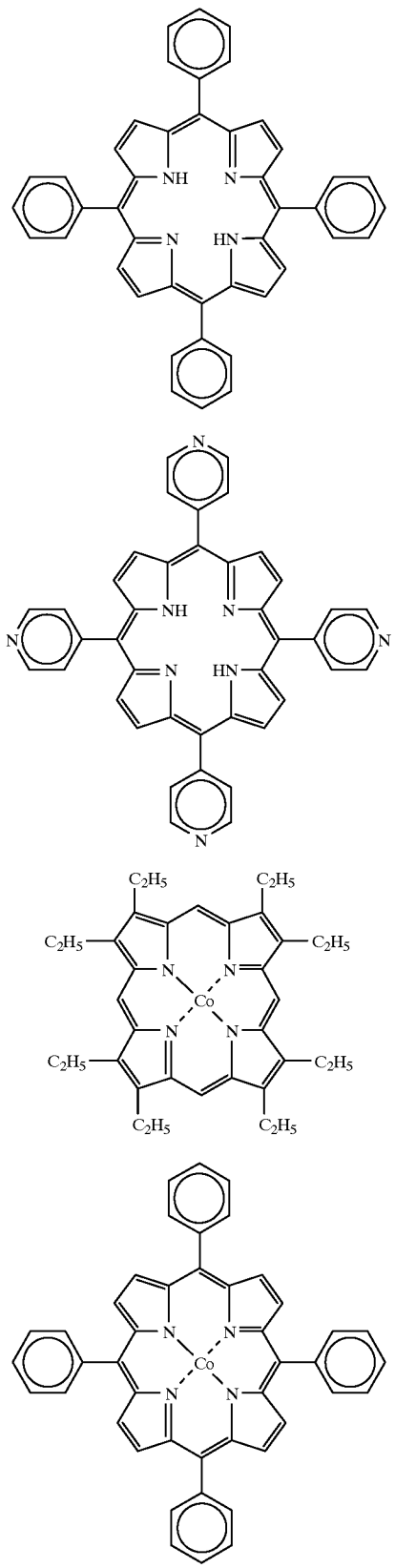

-continued

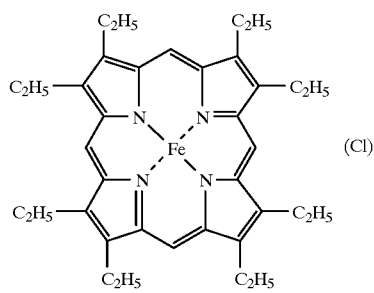

(Cl)

-continued

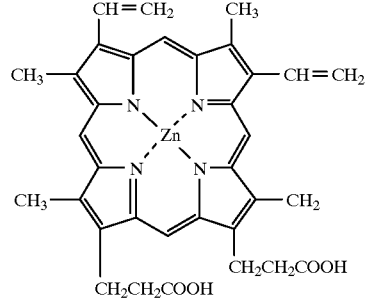

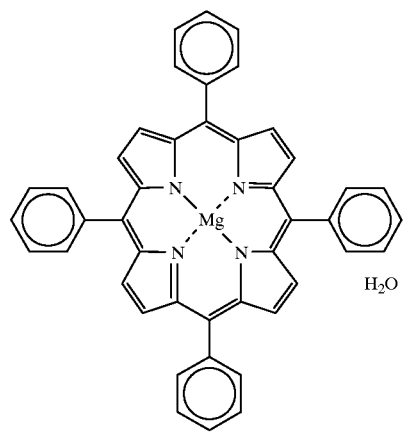

H₂O

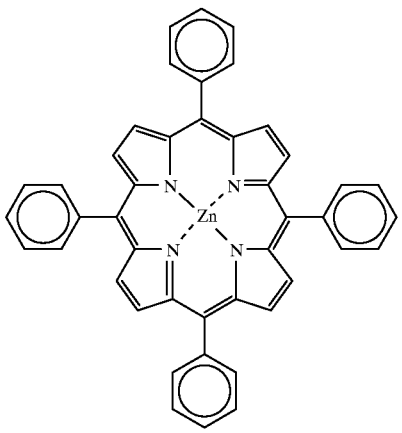

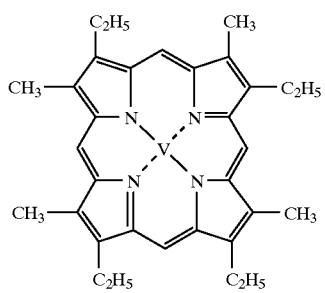

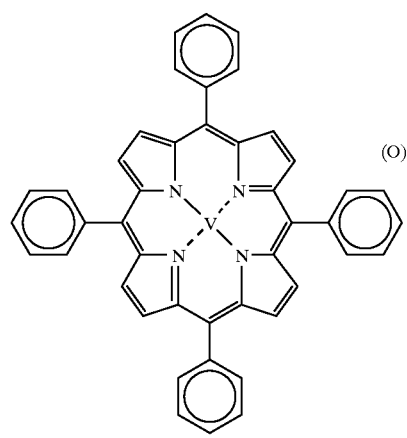

(O)

Substance modulation can be performed by laminating several types of porphyrins having the structure like that shown in the examples. Since depolarization occurs between each layer and there is no centro-symmetry in the direction of film thickness, second-order non-linear optical effects are produced. These materials are basically polycrystals. By forming on a substrate by epitaxial growth, these polycrystals can also be used in the form of single crystal. Numerous other types of materials can be used, including ring-shaped molecules such as phthalocyanine and naphthocyanine, MNBA materials (Fukuda and Gotoh: Laser Seminar "6th Non-Linear Optical Effect Device Technical Research Seminar", published research materials), PTCDA (perylenetetracarboxylic dianhydride) and NTCDA (naphthalenetetracarboxylic dianhydride). Composition can be modulated by employing a mixed composition of a plurality of types of molecules for each layer, and changing the mixing ratio, doping can be modulated by controlling the addition of impurity molecules, and film thickness can be modulated by controlling film thickness. Examples of processes that can be used for the deposition process include organic MBE, organic MBD, vapor deposition, LB and spin coating.

In the case of an organic polymer material, substance modulation can be performed by laminating a plurality of types of polymer layers. For example, in the case of a laminated film such as that in which polyimide, polyazomethine, polyphenylenevinylene, polyimide, polyazomethine, polyphenylenevinylene and so forth are laminated in sequence on a substrate, since polarization occurs between each layer and there is no centro-symmetry in the direction of film thickness, third-order non-linear optical effects are produced together with second-order non-linear optical effects. In addition, various types of films can be used, examples of which include a film in which polyimide, polyimide to which a donor group (e.g. methoxy group) has been added, polyimide to which an acceptor group (e.g. nitro group) has been added, polyimide, polyimide to which a donor group has been added, polyimide to which an acceptor group has been added, polyimide and so forth are laminated in sequence on a substrate, and a film in which azomethine, azomethine to which a donor group has been added, azomethine to which an acceptor group has been added, azomethine, azomethine to which a donor group has been added, azomethine to which an acceptor group has been added, azomethine and so forth are laminated in sequence on a substrate. Composition can be modulated by composing each layer in the form of a mixture or copolymer of a plurality of types of polymer molecules and changing the composite ratio, doping can be modulated by controlling the addition of impurities, and film thickness can be modulated by controlling the film thickness. Examples of processes preferably used for the deposition process include vapor phase deposition processes typically represented by CVD, MLD, vapor deposition polymerization and MBD as indicated in Japanese Unexamined Patent Publication No. 5-80370 and No. 4-296729. In addition, various other routine deposition processes can also be used, examples of which include organic MBE, organic MBD, vapor deposition, LB and spin coating.

In addition, in the type of film described above, polymer chains may be connected between layers. In addition, a rare earth ion doped material results by, for example, using LHG5:Nd glass made by Hoya Glass as a component of a portion of the layer. As a result, a material can be realized that has EO effects while serving as an optical power source, waveguide laser or amplifier. When this material is formed into a waveguide and pump light at 800 nm is allowed to enter, light is emitted at 1052 nm. In addition, light at 1052 nm can also be amplified.

Figure 82:
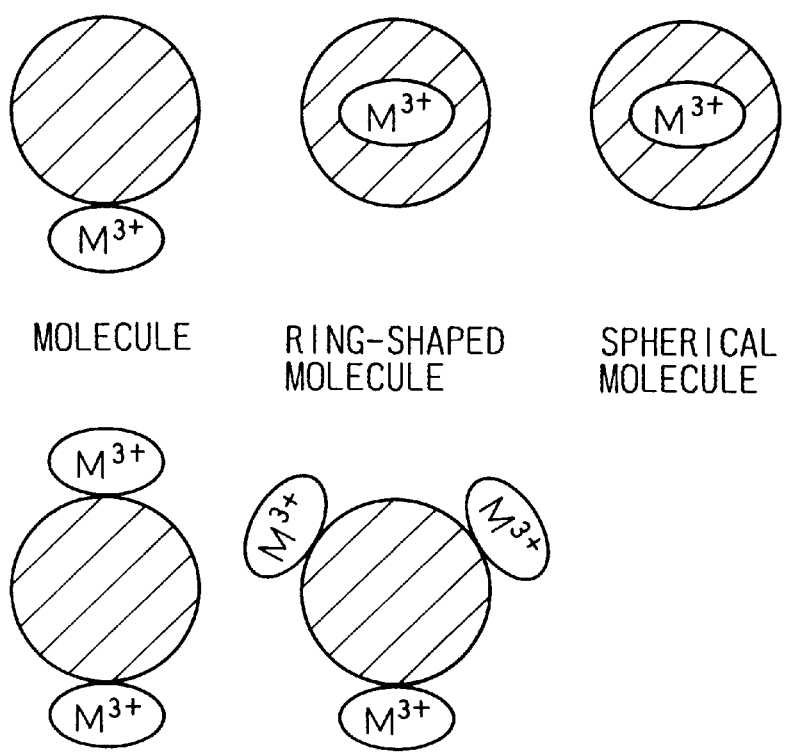
FIG. 82 is a schematic drawing of molecules containing rare earth ions.
Figure 83:
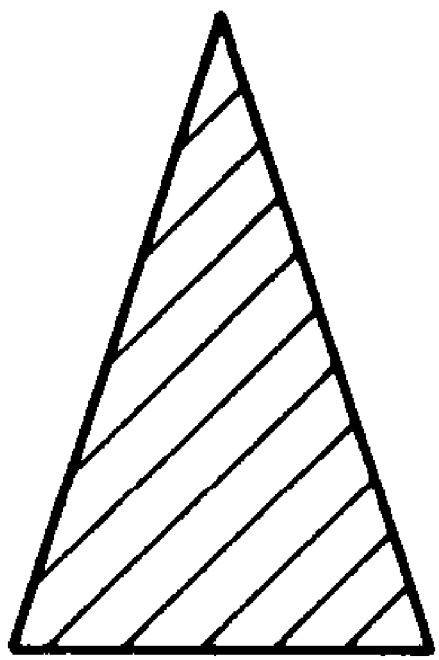
FIG. 83 is a schematic drawing of a non-linear optical molecule.
Figure 84A:
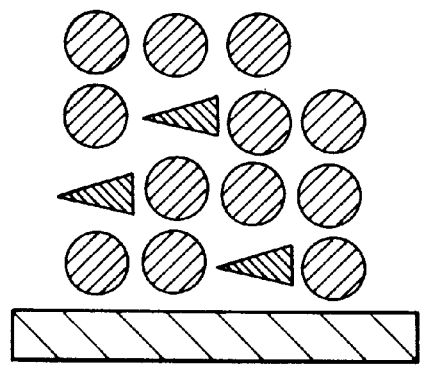
FIGS. 84A–84F are schematic drawings of non-linear optical materials containing molecules that contain rare earth ions.
Figure 84B:
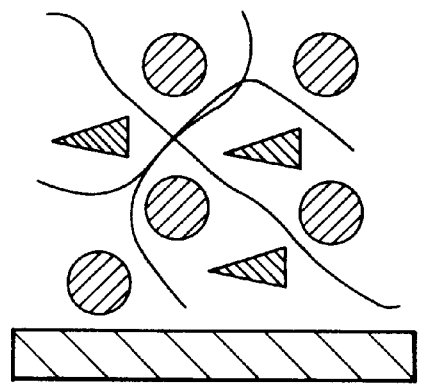
Figure 84C:
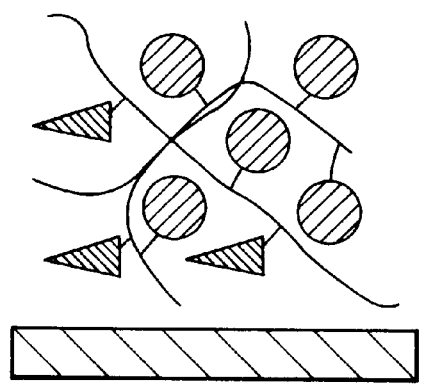
Figure 84D:
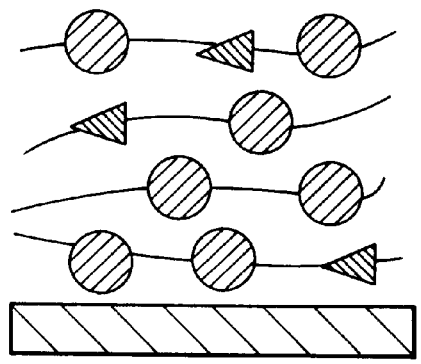
Figure 84E:
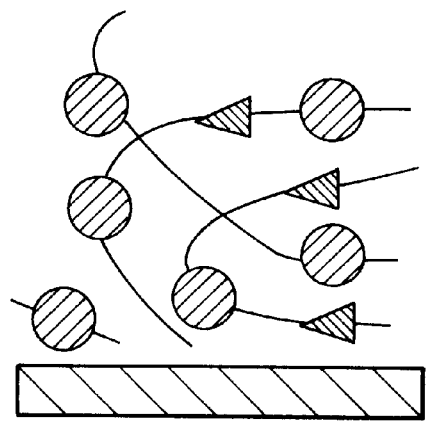
Figure 84F:
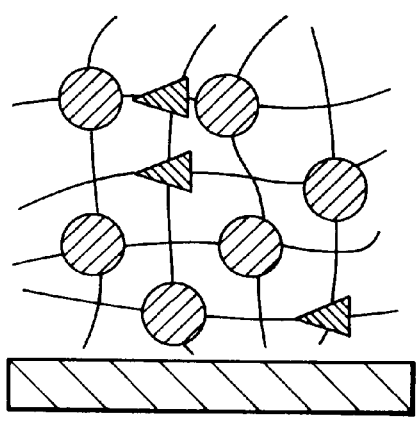

In addition, a material like that shown in FIGS. 84A–84F can be realized that has EO effects while also serving as an optical power source, waveguide laser or amplifier by containing rare earth ions and/or molecules containing rare earth ions ($M^{3+}$) like that schematically indicated in FIG. 82 in a non-linear optical molecule (NLO molecule) like that schematically indicated in FIG. 83. As a result, since this enables switching functions such as optical pick-up and so forth to be given to the material, devices such as variable wavelength light source and tunable optical switch can be realized.

Figure 87:
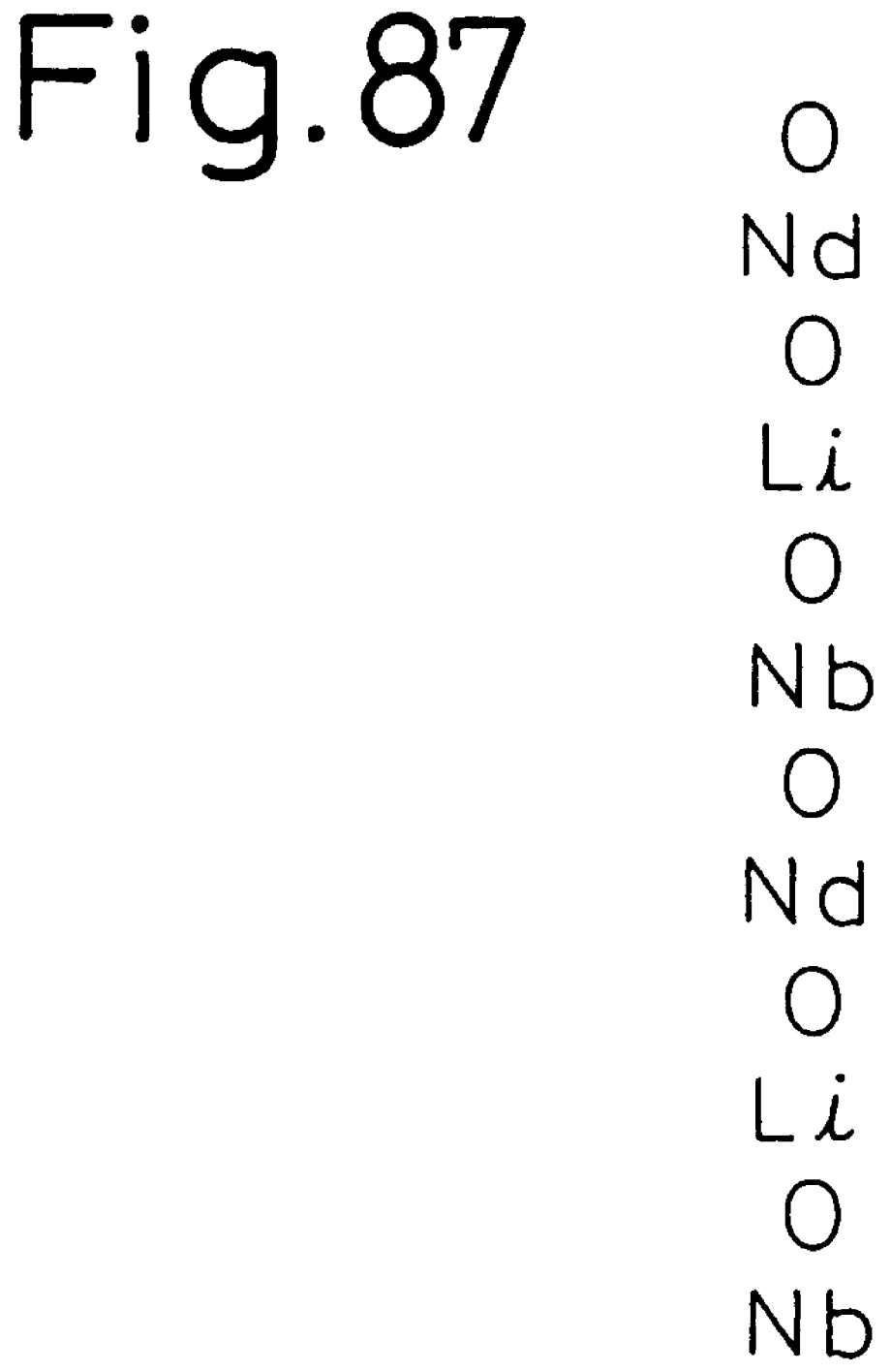

In addition, by changing the layer on a single atomic or single molecular scale to contain a single atomic layer or single molecular layer in a multi-layer film as shown in FIGS. 85–87 in an inorganic or organic material, it is possible to control wave function at the microscopic level, thereby enabling the generation of large non-linear optical effects. In addition, in the case of a thin film, nearly the same effects can be obtained in the case of containing a layer having a thickness of preferably 10 Å or less.

In FIG. 85, with a sequence of O, Si, O and N, Si, N, Si, O, ..., a film is constructed. In FIG. 86, with a sequence of O, Ta, O, Ir, O, W, ..., a film is constructed. In FIG. 87, with a sequence of O, Nd, O, Li, O, Nd, O, ..., a film is constructed.

FIGS. 88A–88F schematically indicate a deposition process controlled at the atomic level. Various processes can be employed for said deposition process, examples of which include alternately supplying Ta, Ir and W to a substrate by sputtering in an oxygen atmosphere and so forth (corresponding to the film fabrication shown in FIG. 86), CVD using silane gas for the base, or switching introduction of ammonia, $N_2O$ or methane (corresponding to the film fabrication shown in FIG. 85, in which gas is introduced in the sequence of $N_2O$, $N_2O+NH_3$, $NH_3$, $N_2O$, $N_2O+NH_3$, $NH_3$, $N_2O$, $N_2O$, ...). Alternatively, as shown in FIGS. 89A–89F, a process can also be used that utilizes the chemical reaction between reactive gases. For example, a layer structure can be formed when tantalum chloride, iridium chloride and tungsten fluoride gas are introduced while switching between each substance by CVD in an atmosphere of $H_2O$ and so forth. Namely, atomic layer deposition (ALD) can be performed by sequentially switching between tantalum chloride, $H_2O$, iridium chloride, $H_2O$, tungsten fluoride, $H_2O$, tantalum chloride, $H_2O$, iridium chloride, $H_2O$, tungsten fluoride and so forth (corresponding to the film fabrication shown in FIG. 86). FIGS. 90A–90F indicate an example of forming a layer structure by sputtering a compound such as an oxide with vapor deposition or CVD.

Figure 91A:
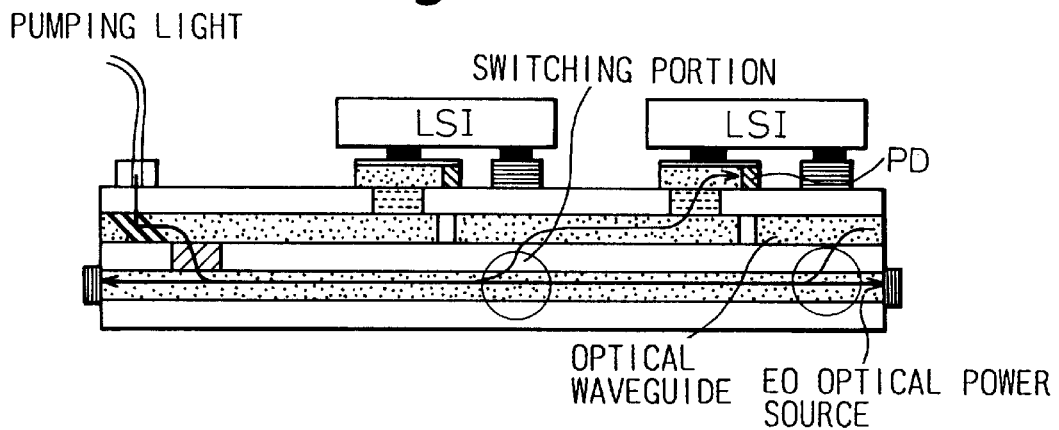
FIGS. 91A–91C are schematic drawings showing an example of an optical circuit substrate using the non-linear optical material of the present invention.
Figure 91B:
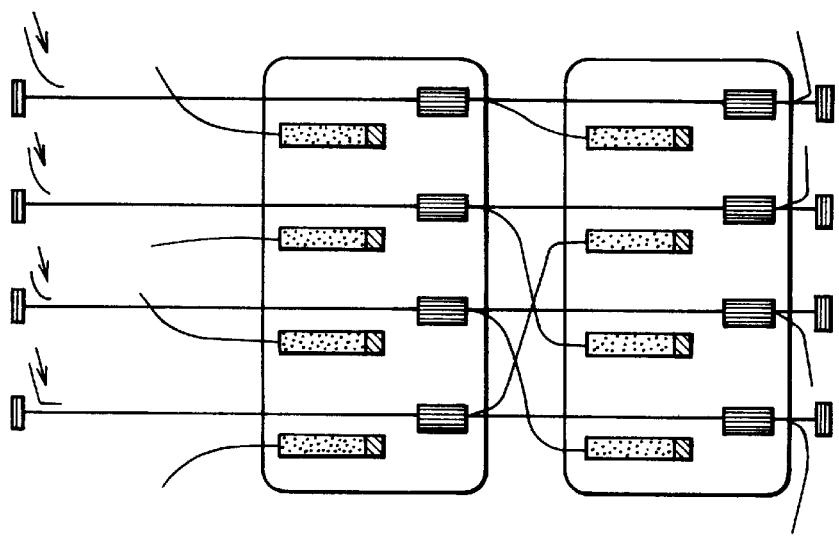
Figure 91C:
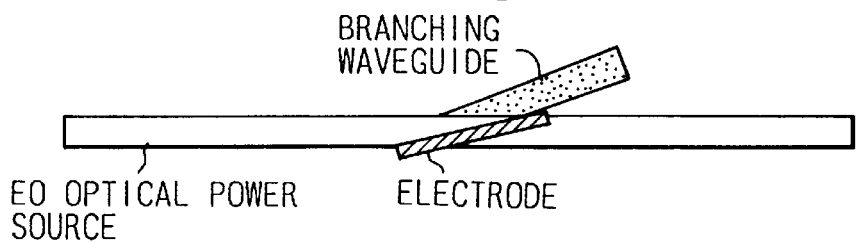

A film like that described above can be applied in various non-linear optical devices including electrooptical devices such as optical modulators, optical switches and tunable filters. Furthermore, the film can also be applied to electro-optical devices such as, optical amplifiers and optical waveguide lasers having non-linear optical effects, and, for example, the optical circuit substrate like that shown in FIGS. 91A–91C. FIG. 91A is a side view, FIG. 91B is an overhead view, while FIG. 91C is an enlarged view of the switch portion of FIG. 91A, wherein the switch is planner. A vertical switch with a stacked directional coupler structure can also be used. Moreover, the film of the present invention can be widely applied in optical wiring and switches for parallel processors, various types of optical modules for data processing and communication, and E/O circuit substrates.

According to the second aspect of the present invention, the present invention is able to provide a non-linear optical material, optical power source, optical waveguide laser and optical waveguide amplifier that have EO effects, as well as non-linear optical devices, non-linear optical amplifier, optical waveguide laser and optical circuit substrate that use the above, that have a large degree of freedom for the substrate composition, facilitate easy lamination, have a low dielectric constant, are suited to low power and high-speed driving, are easily applied to large surface areas, and can be easily and stably combined with other devices.

In the case the photoelectric device according to the third aspect of the present invention is a light emitting diode (LED), the functional layer composed of organic conjugated polymer formed by depositing on a substrate by vapor deposition polymerization may be one or two or more layers of the light emitting layer, hole transport layer and electron transport layer of this LED. In addition, in the case the photoelectric device is a solar cell, the functional layer composed of an organic conjugated polymer film may be the photoconductor layer of this solar cell. In the case the photoelectric device is a light receiving device, the functional layer composed of an organic conjugated polymer film may be the light receiving layer of this light receiving device. In the prior art, however, the forming of an organic conjugated polymer film by vapor deposition polymerization and the using of that film as the functional layer of a photoelectric device in the manner described above was not known in the prior art.

Deposition of said organic conjugated polymer film can be performed by, for example, performing vapor deposition polymerization of a diamine compound having two terminal amino groups (—NH$_2$) and a dialdehyde compound having two terminal aldehyde groups (—CHO), and depositing the resulting organic conjugated polymer having an azomethine bond

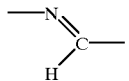

on a substrate to form a film. Alternatively, vapor deposition polymerization can be performed on an acetonitrile compound having two terminal acetonitrile groups (CH$_2$CN) and a dialdehyde compound having two terminal aldehyde groups to form an organic conjugated polymer having the bond indicated below:

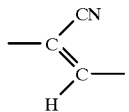

or, vapor deposition polymerization can be performed on a diacetylene compound having two terminal acetylene groups:

and a dithiol group having two terminal thiol groups (—SH) to form an organic conjugated polymer film having the bond indicated below:

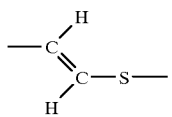

Figure 92:
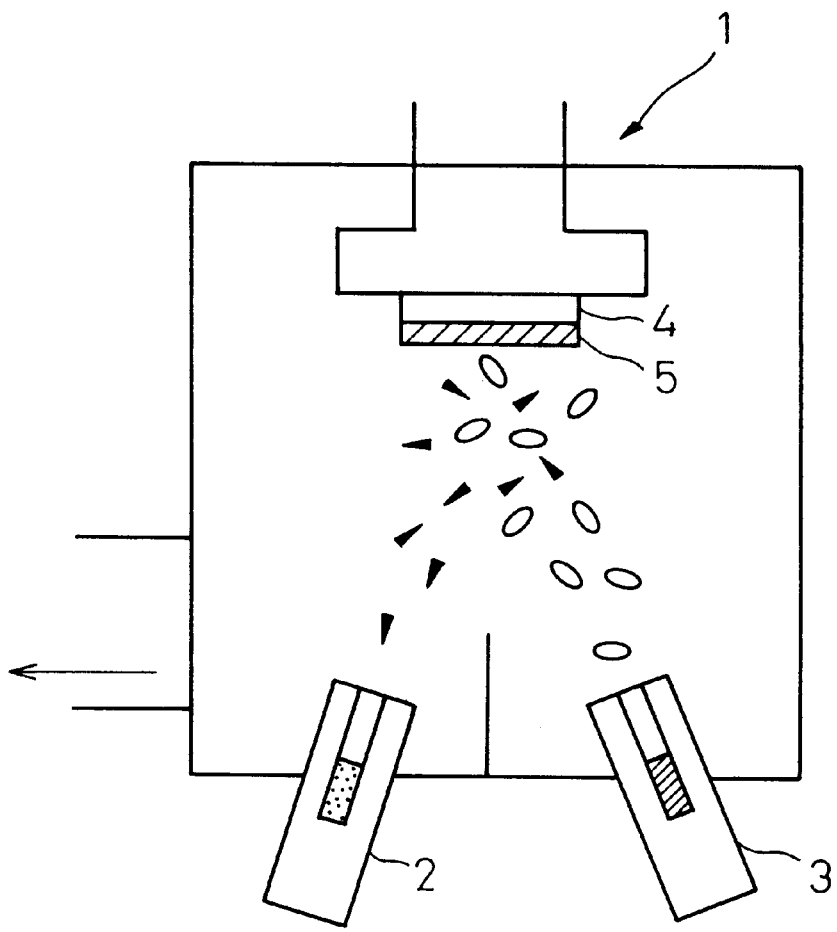
FIG. 92 is a schematic drawing showing an example of a vapor deposition apparatus that can be used in the production process of the opto-electronic device of the present invention.

For example, after using vapor deposition apparatus 1 like that shown in FIG. 92 to perform vapor deposition on molecules of diaminobenzene having the following formula:

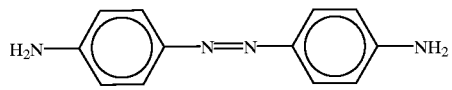

for the diamine compound, and molecules of diphthalaldehyde having the following formula:

for the dialdehyde compound from two molecular vapor deposition cells 2 and 3, respectively, organic conjugated polymer film 5 having a azomethine bond as indicated with the following formula:

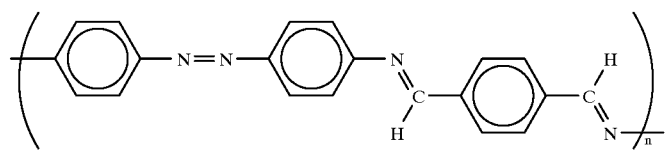

is deposited on substrate 4 while polymerizing in this apparatus.

Those diamine compounds, dialdehyde compounds, diacetonitrile compounds, diacetylene compounds and dithiol compounds that can be used as the starting materials of this vapor deposition polymerization have the basic skeleton structure indicated in the formulas below, and examples of these include compounds having two of the above-mentioned amino, aldehyde, acetonitrile, acetylene or thiol terminal groups bonded to this basic skeleton structure.

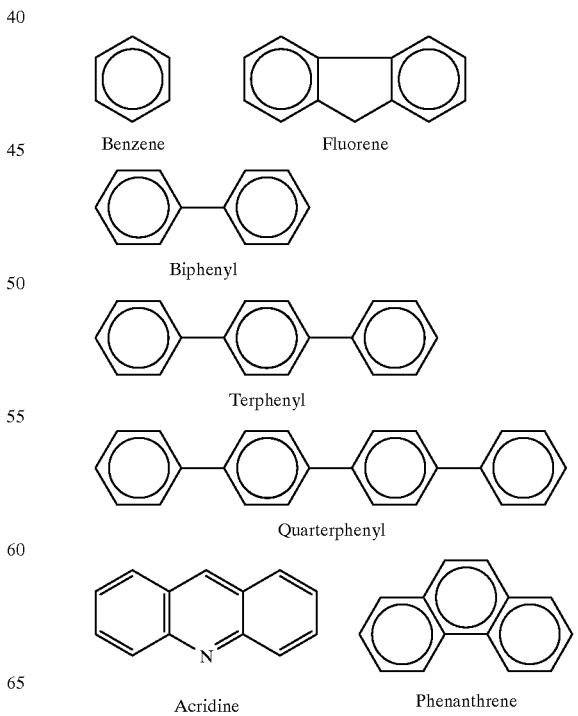

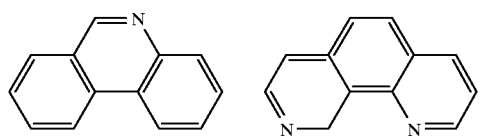
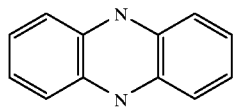 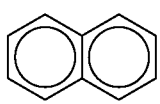
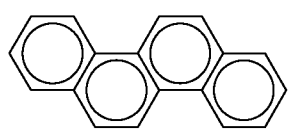
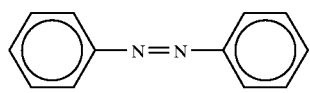
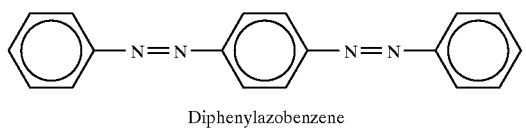
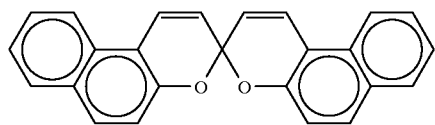
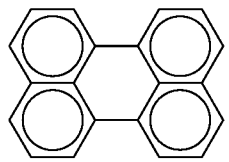 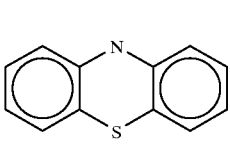
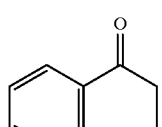 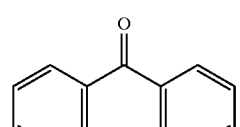
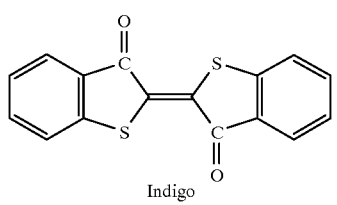
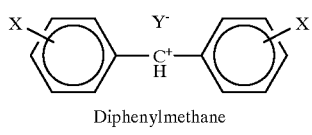
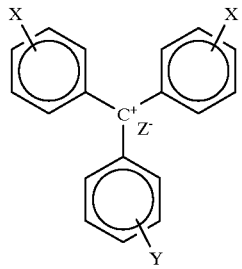 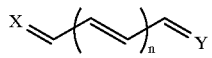
In this formula, this compound is cyanine if X and Y represent compound rings containing nitrogen, azomethine if —CH= is substituted with —N= in a portion of the repeating unit, and these are also included.
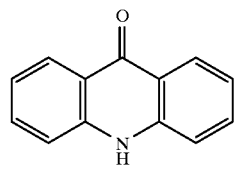
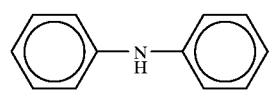
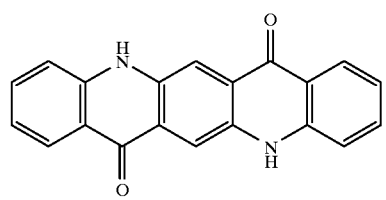
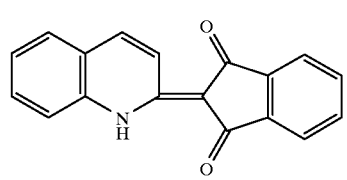
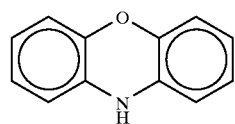

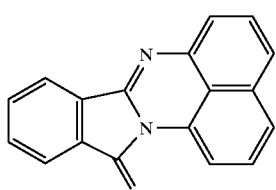
Phthaloperynone

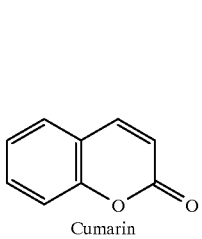
Cumarin

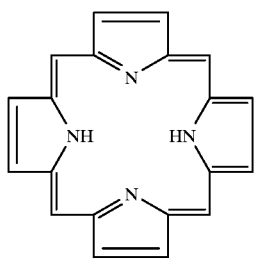
Porphyrin

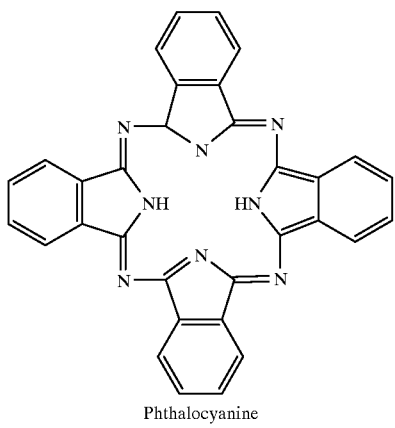
Phthalocyanine

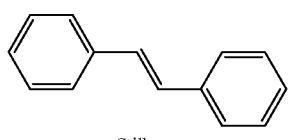
Stilbene

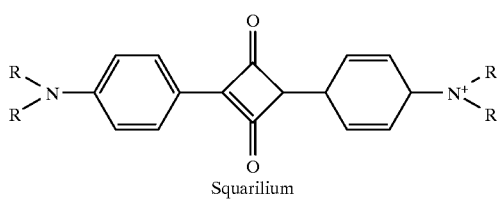
Squarilium

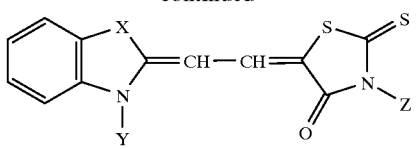
Merocyanine

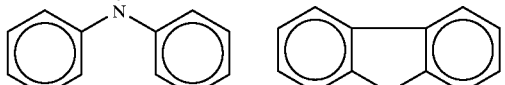
Aryl pyrylium

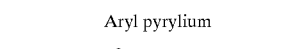
Triphenylamine   Carbazole

In addition, during deposition of the organic conjugated polymer film by vapor deposition polymerization, by performing surface treatment using a technique such as rubbing on the surface of the substrate on which the polymer film is deposited, the molecules of the organic conjugated polymer can be oriented as desired.

Since an organic conjugated polymer film obtained by this type of method can be easily applied to large surface areas, it is advantageous for use in the production of light emitting displays. In addition, since this polymer film has a high degree of surface flatness and film thickness can be easily controlled, it can also be advantageously used in the production of polymer lasers and so forth.

Moreover, the photoelectric device and method for its preparation of the present invention are also advantageous from the viewpoint of not requiring the polymer to be dissolved in solvent or the providing of a solubilized portion during forming of the film, thus eliminating the occurrence of problems caused by residual solvent and decreases in emission efficiency.

The following provides a more detailed explanation of the third aspect of the present invention through its embodiments.

Figure 93:
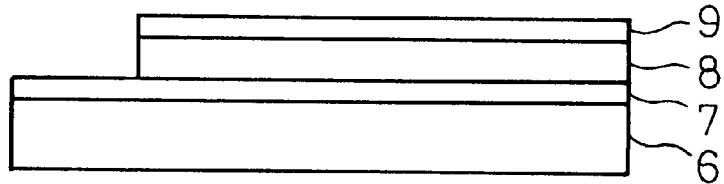
FIG. 93 is a schematic drawing showing an example of the opto-electronic device of the present invention.

An LED device having a structure like that shown in FIGS. 93 was fabricated according to the following procedure. Namely, glass substrate 6, having a thickness of 0.5–1 mm, was used that has ITO electrode 7 having a thickness of 1000 Å. Using diaminofluorene having the following formula:

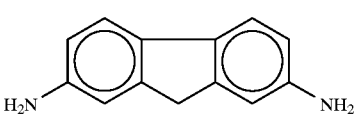

and the previously mentioned terephthalaldehyde for the starting materials, molecules of these compounds were deposited on this ITO electrode 7 by a deposition apparatus like that shown in FIG. 92. Light emitting layer 8 was then deposited composed of a film of the organic conjugated polymer having the following formula:

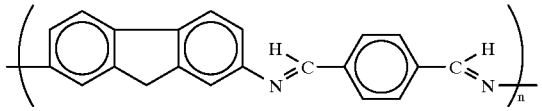

while polymerizing. The temperature of the molecular deposition cell at this time was 90–120° C., the vacuum of the apparatus was $10^{-2}$–$10^{-3}$ Torr, and a polymer film having a film thickness of 2000 Å was obtained during 10 hours of deposition.

Next, upper In electrode layer 9, having a film thickness of 3000 Å, was formed by performing vapor deposition of In at a deposition rate of 10 Å/sec and vacuum of $10^{-6}$–$10^{-7}$ Torr.

The resulting LED device began to emit blue light following application of a voltage of roughly 12 V, and its maximum emission efficiency was roughly 0.5%.

According to the third aspect of the present invention, a photoelectric device is obtained having an organic conjugated polymer film for the functional layer that can easily be applied to large surface areas, has a high degree of flatness, and allows film thickness to be easily controlled, and a sufficiently practical photoelectric device can be realized that uses that organic polymer.

An explanation will now be give regarding various embodiments of the fourth aspect of the present invention which, of course, are not intended to restrict the scope of the invention.

In the optical network of the present invention, the optical path loops may be single lines or multiple lines.

The electronic elements and electronic apparatuses are selected from LSIs, microprocessors, processing elements (PE), MCMs, work stations, personal computers, large scale computers and peripheral terminal units. Alternatively, the electronic elements and electronic apparatuses may be composites of optical devices selected from LDs, LEDs, PDs, phototransistors, nonlinear optical devices, waveguides, holograms, gratings, optical amplifiers and waveguide lasers, with electronic elements or electronic apparatuses.

A transmitter and/or receiver may be provided at the terminals of the optical path loop corresponding to each processing element. Optical switches for switching optical signals between the loops may also be provided.

The optical switches may be either be of the Banyan type or crossbar type. Each of the optical switches is driven by an LSI including an interface circuit incorporated or added to each of the processing elements, or a driving LSI mounted on or incorporated in the board.

Waveguide loops are provided to correspond to each processing element, there is linked thereto a transmitter for each processing element, optical signals from other processing elements are selected by an optical switch provided for each processing element in each waveguide loop, and the optical signal from the desired processing element is guided to the receiver of each processing element, and received. Optical path loops are provided to correspond to each processing element, there is linked thereto a receiver for each processing element, optical signals from the transmitter are introduced to the optical path loops corresponding to each receiving-end processing element by an optical switch, and the optical signals are transmitted to the desired processing element. A filter array or branching filter which branches light of a specific wavelength assigned to each processing element, selectively takes it up, and guides it to the receiver array of each processing element corresponding to each wavelength, is provided in the optical path loop, a transmitter which outputs an optical signal of the assigned wavelength is provided in each processing element, and the optical signal of the wavelength corresponding to the desired transmitting-end processing element is selectively guided to the receiver where the optical signal of the desired processing element is received. A filter or branching filter which selectively takes up light of a specific wavelength assigned to each processing element and guides it to the receiver of each processing element is provided in the optical path loop, a transmitter array which outputs an optical signal of the assigned wavelength is provided in each processing element, and the optical signal of the wavelength corresponding to the desired receiving-end processing element is selectively introduced to the optical path loop where the optical signal is transmitted to the desired processing element. A tunable filter or branching filter which selectively takes up light of a specific wavelength assigned to each processing element and guides it to the receiver of each processing element is provided in the optical path loop, a transmitter which outputs an optical signal of the assigned wavelength is provided in each processing element, and the optical signal of the wavelength corresponding to the desired transmitting-end processing element is selectively guided to the receiver where the optical signal of the desired processing element is received. Alternatively, a filter or branching filter which selectively takes up light of a specific wavelength assigned to each processing element and guides it to the receiver of each processing element is provided in the optical path loop, a wavelength-variable transmitter which outputs an optical signal of the assigned wavelength is provided in each processing element, and the optical signal of the wavelength corresponding to the desired receiving-end processing element is selectively introduced to the optical path loop where the optical signal is transmitted to the desired processing element. A tunable filter or branching filter which selectively takes up light of a specific wavelength assigned to each processing element and guides it to the receiver of each processing element is provided in the optical path loop, a wavelength-variable transmitter which outputs at least an optical signal of the assigned wavelength is provided in each processing element, and the header and data of the transmitted signal are transmitted at different wavelengths.

A tunable filter or branching filter which selectively takes up light of a specific wavelength assigned to each processing element and guides it to the receiver of each processing element is provided in the optical path loop, a wavelength-variable transmitter which outputs an optical signal of the assigned wavelength is provided in each processing element, and the header of the transmitted signal is transmitted at the assigned wavelength of the receiving end while the data is transmitted at the assigned wavelength of the transmitting end, in which case the filter of each processing element is normally tuned to its own assigned frequency, and when the header comes it recognizes the transmitting end and is tuned to that corresponding wavelength, and when reception is complete it may be tuned to its own wavelength. A tunable filter or branching filter which selectively takes up light of a specific wavelength assigned to each processing element and guides it to the receiver of each processing element is provided in the optical path loop, a wavelength-variable transmitter which outputs an optical signal of the assigned wavelength and the header-assigned wavelength is provided in each processing element, and the header of the transmitted signal is transmitted at a wavelength which is different from each assigned wavelength while the data is transmitted at the assigned wavelength of the transmitting end, in which case the filter of each processing element is normally tuned so as to take up at least a portion of the header-assigned wavelength, recognizing the transmitting end and receiving end based on the taken up header, and in cases where itself is the receiving end it is tuned to the wavelength corresponding to the transmitting end, and when reception is complete it is tuned to the header-assigned wavelength. A tunable filter or branching filter which selectively takes up light of a specific wavelength assigned to each processing element and guides it to the receiver of each processing element is provided in the optical path loop, a wavelength-variable transmitter which outputs an optical signal of the assigned wavelength and the header-assigned wavelength is provided in each processing element, and the header of the transmitted signal is transmitted at a wavelength which is different from each assigned wavelength while the data is transmitted at the assigned wavelength of the receiving end which is itself, in which case the filter of each processing element is normally tuned so as to take up at least a portion of the header-assigned wavelength, recognizing the transmitting end and receiving end based on the taken up header, and in cases where itself is the receiving end it is tuned to the wavelength corresponding thereto, and when reception is complete it is tuned to the header-assigned wavelength.

Alternatively, an optical path loop is provided to correspond to each processing element, a transmitter array which outputs a multiplex wavelength optical signal is linked thereto, which selects optical signals from other processing elements by an optical switch provided for each processing element in each optical path loop, and which branches a wavelength-multiplexed optical signal comprising a plurality of wavelengths via a filter or branching filter, is linked to the receiver array of each processing element which corresponds to each wavelength, and the wavelength-multiplexed optical signal is guided from the desired processing element to the receiver array of each element where it is received. An optical path loop is provided to correspond to each processing element, a transmitter array which branches a wavelength-multiplexed optical signal comprising a plurality of wavelengths via a filter or branching filter, links the receiver arrays of each processing element corresponding to each wavelength, and outputs the multiplex wavelength optical signal is provided in each processing element, the optical signal from the transmitter array is merged with the optical path loop corresponding to the receiving-end processing element by an optical switch, and the wavelength-multiplexed optical signal is transmitted to the desired processing element.

The transmitter, receiver and/or tunable filter is driven by an LSI including an interface circuit incorporated or added to each of the processing elements, or a driving LSI mounted on or incorporated in the board. Also, the signal multiplexing is carried out by an LSI including an interface circuit incorporated or added to each of the processing elements, or a driving LSI mounted on or incorporated in the board. The transmitter may include an LD, and the linking with the waveguide is accomplished by a method employing optical solder, grating, hologram, Z-axis waveguide, or SELPIT and SOLNET (see Japanese Patent Application No. HEI 6-140502). The transmitter may include optical wiring which includes a voltage-driven electrooptical switch or light modulator, converts electrical signals into optical signals and transmits the optical signals. The transmitter may include optical wiring which includes a voltage-driven electrooptical switch or light modulator, converts electrical signals into optical signals by picking up at least a portion of the light of an optical waveguide used as a light source or light reservoir, selected from waveguide lasers, waveguide photoamplifiers and the like, and transmits the optical signals. The transmitter may include optical wiring which converts electrical signals to optical signals by modulating light from a waveguide laser which transmits by pumping light, with an electrooptical switch or light modulator, and transmits the optical signals. Alternatively, the transmitter may include optical wiring which converts electrical signals to optical signals by modulating light from an LD or light introduced through a fiber, flexible waveguide or space, with an electrooptical switch or light modulator, and transmits the optical signals.

The receiver includes an LSI, an receiving element formed on a substrate, or an independent receiving element, and the linking with the waveguide is accomplished by a method employing optical solder, grating, hologram or a Z-axis waveguide. The wavelength-variable transmitter may be a tunable LD or tunable waveguide laser.

All or a portion of the electrooptical switches, light modulators and tunable filters are selected from electrooptical polymers and second-order or third-order organic nonlinear optical materials. The wavelength-variable transmitter contains a material selected from electrooptical polymers and secondary or tertiary organic nonlinear optical materials. Alternatively, all or a portion of the electrooptical switches, light modulators and tunable filters comprise a material selected from semiconductor materials and glass. The wavelength-variable transmitter comprises a material selected from semiconductor materials and glass.

A system may be employed whereby the electrooptical switch and light modulator create a refractive index difference in and/or near the optical waveguide by voltage application, and operate utilizing the resulting light reflection. The electrooptical switch and light modulator may also open a refractive index window in the clad by voltage application, and operate utilizing the resulting light leakage.

The receiving element is formed by cutting across the top or bottom of the waveguide or through the waveguide, and is selected from a-Si, poly Si and polymer photodiodes, phototransistors and MSM detectors. The receiving element may be formed in a semiconductor crystal substrate.

The photoelectric source used may be a polymer or glass.

The light source is usually an LD. An organic luminescent element comprising a low molecular crystal and/or polymer may also be used.

The luminescent element may be formed by cutting across the top of the waveguide, the bottom of the waveguide, and/or through the waveguide. The luminescent element may also be formed at the top and/or bottom of the waveguide leaving a space. Alternatively, the luminescent element may be formed in a semiconductor crystal substrate.

The polymer may be formed by the vapor growth method.

The processing elements, optical paths and optical transmitters and receivers may be situated on the optical circuit board or situated off the optical circuit board. The processing elements, optical transmitters and receivers, and optical circuit boards may also be connected by optical fibers or waveguides. The signal exchange between the processing elements, optical transmitters and receivers and the optical circuit board is made with direct light or via an intervening photoelectric conversion element.

The signal light and control light may be of different wavelengths.

The present invention provides self-routing optical switches which are characterized by superimposing switch control light and signal light, and switching the signal light by the control light.

The switching of the signal light may be accomplished by varying the refractive index of a nonlinear optical waveguide by the control light. Alternatively, all or a portion of the control light is detected with a photoelectric conversion element, and the refractive index of the nonlinear optical waveguide is varied by the electrical signal therefrom.

The optical switches may situated in multiple levels.

The present invention also provides an optical memory which is characterized by switching signals to the memory loop end and returning them to the main line, in cases of collision of signals.

The memory loop may be an optical waveguide or optical fiber. An optical amplifier may also be inserted in part or the entirety of the memory loop.

Examples of the fourth aspect of the present invention will now be explained with reference to the attached drawings.

Figure 94:
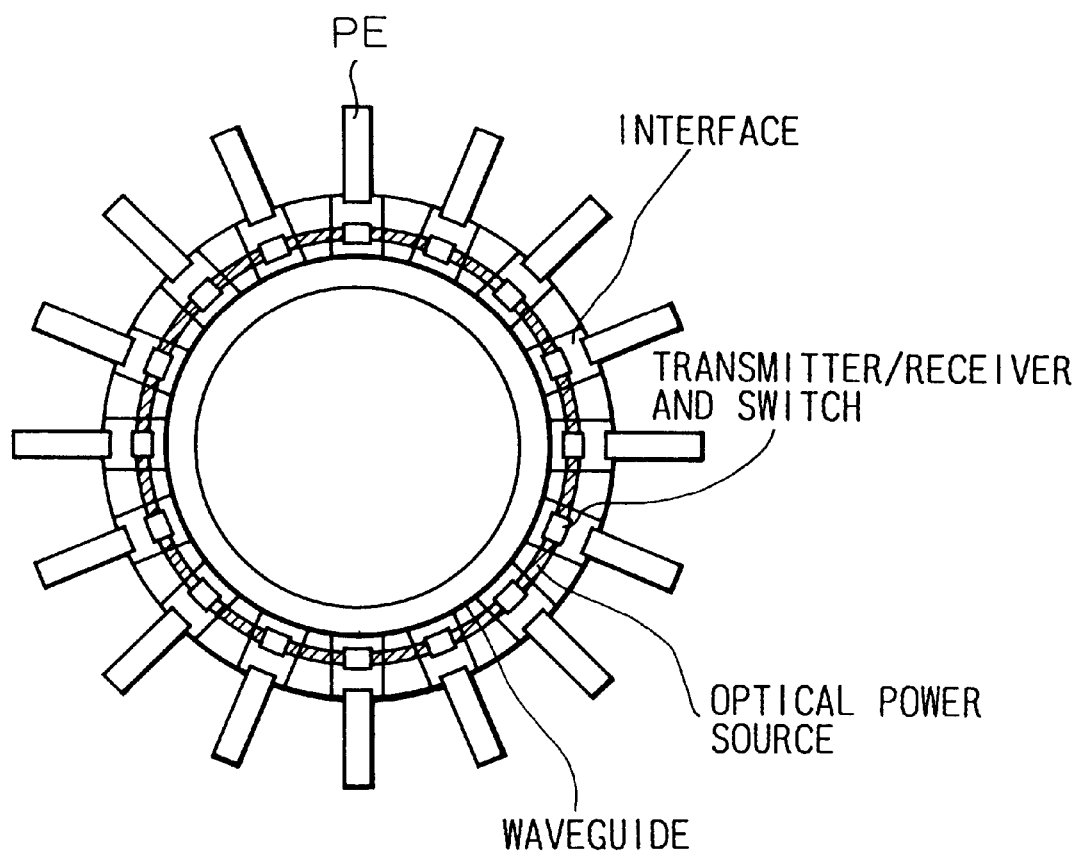
FIG. 94 is an illustrative view showing an example of an image of introduction of an optical network to a parallel processor.
Figure 95:
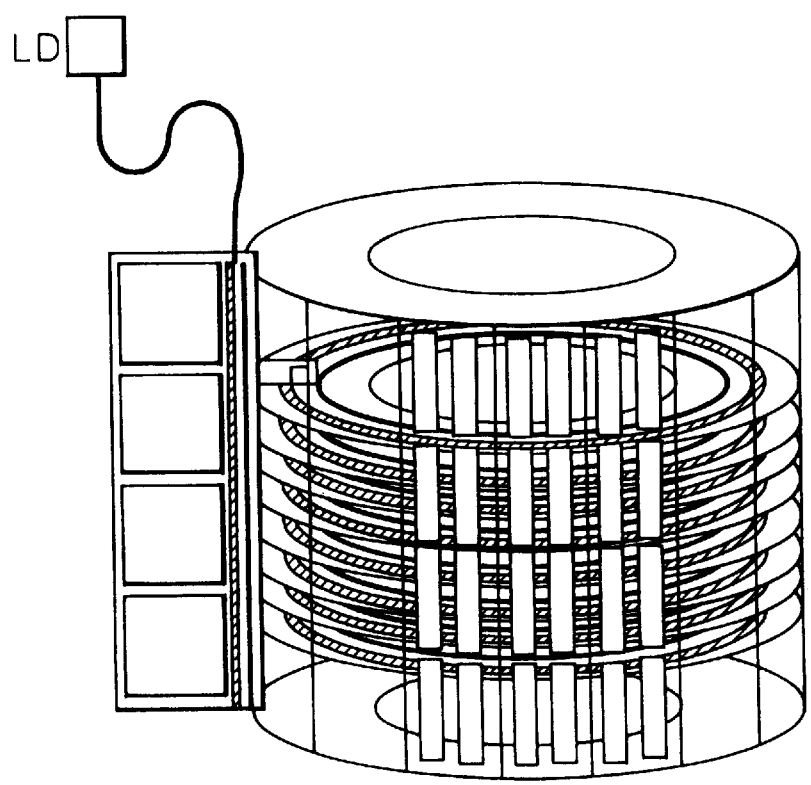
FIG. 95 is an illustrative view showing an example of an image of introduction of an optical network to a parallel processor.
Figure 96:
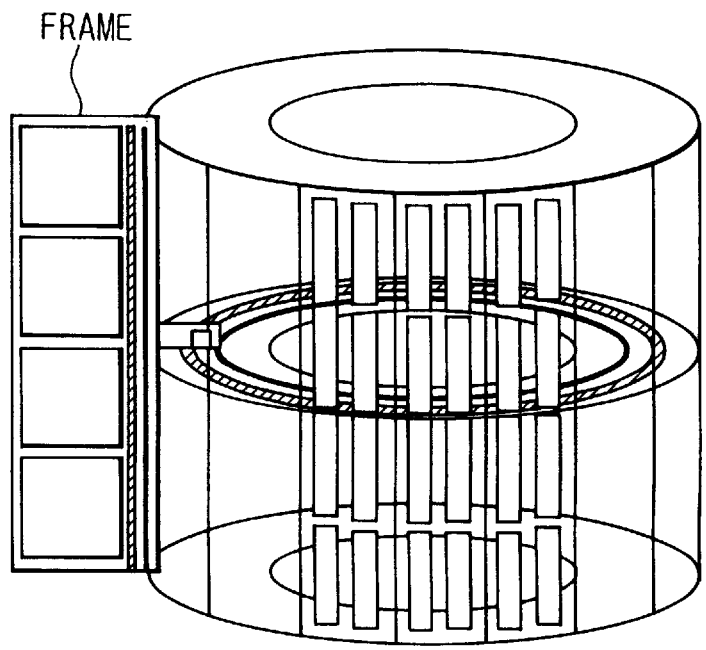
FIG. 96 is an illustrative view showing an example of an image of introduction of an optical network to a parallel processor.

FIGS. 94 to 96 are illustrative views showing examples of images of introduction of optical networks to parallel processors. In these examples, the processing elements (PEs) are linked to the optical network, and the optical paths are formed in loops. In FIG. 94, for example, a multiplexing circuit, amplifying circuit and LD driver, etc. are incorporated into the interface sections, an LD, PD, filter, optical switch and tunable filter, etc. are incorporated into the transmitter/receiver and switch sections, and the optical power source may consist of a waveguide amplifier or waveguide laser or an ordinary waveguide as a photon receiver while the waveguide may be of the optical SMT-type. When it is attempted to accomplish the wiring of each bit with one optical loop, there are 8 optical loops in the case of 8 bits (FIG. 95). The number of optical loops may be reduced by multiplexing the signals by time-division, space-division or wavelength multiplexing (FIG. 96). Also, it is not necessary to have an optical loop corresponding to each bit. Multiplexed signals may be handled with either one or a plurality of loops.

FIGS. 97 to 104 are illustrative views showing examples of optical networks for 16 PEs formed in a Banyan network. In these examples, 16 optical loops are formed. The example in FIG. 97 has formed LD transmitters and PD receivers for each PE. The signal of each PE is transmitted as an optical signal from the corresponding transmitter. The signal is switched to the desired loop by a Banyan network of optical switches, and is converted to an electrical signal at the receiver corresponding to the desired PE and transmitted.

Instead of the LD, there may be used a waveguide laser which transmits by pumping light, or a transmitter which modulates with an electrooptical switch or light modulator. Alternatively, the transmitter may modulate light from an LD or light introduced through a fiber, flexible waveguide or space, with an electrooptical switch or light modulator. This also applies to each of the examples described hereafter.

Figure 98:
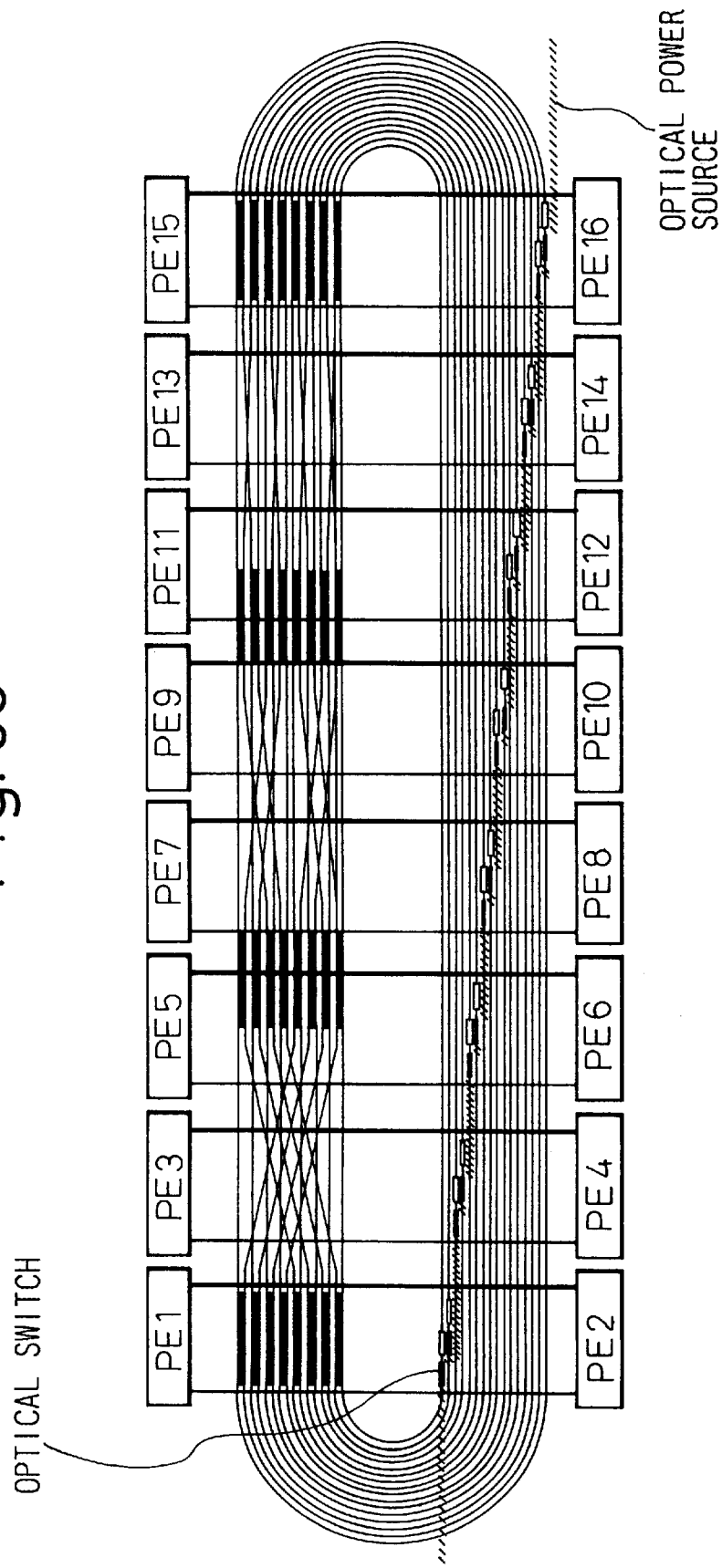
FIG. 98 is an illustrative view showing an example of a Banyan-type optical network.

The example shown in FIG. 98 employs as the transmitter an optical switch or modulator instead of an LD, whereby the light from the optical power source is picked up and an optical signal is transmitted. It is thus possible to reduce the number of LDs required. The pumping light into the optical power source may be introduced by an LD mounted on the board, or from the outside by a fiber, flexible waveguide or space. A system which introduces the light from the outside is particularly effective from the point of view of cooling and maintenance. The optical power source may be either in a linear or loop form. There is no restriction to use an optical power source system (see Japanese Patent Application No. HEI 6-500923), as the transmission may be with an optical pickup from a waveguide serving as a light reservoir, or with a conventional modulating system (see Japanese Unexamined Patent Publication No. 63-229427). These conditions also apply to each of the examples which follow.

Figure 105:
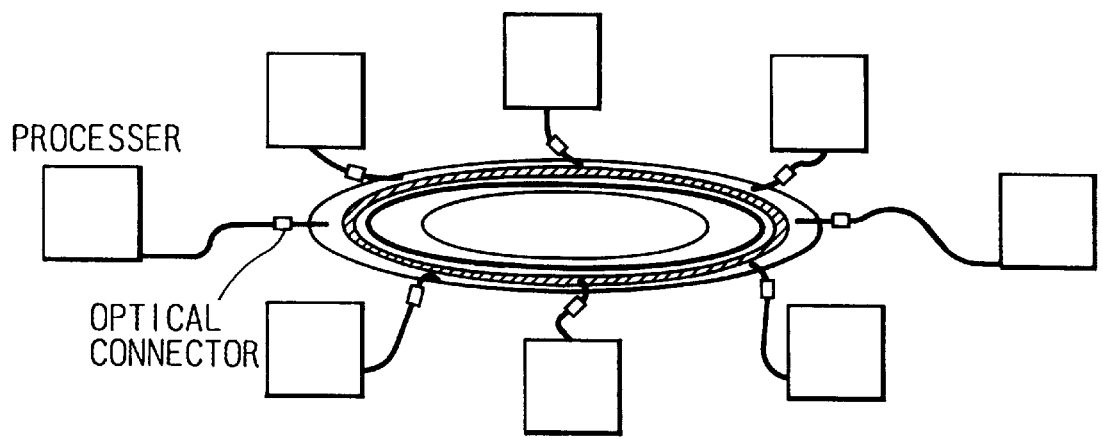
FIG. 105 is an illustrative view showing an example of an optical MCM for a data-exchange network.
Figure 106:
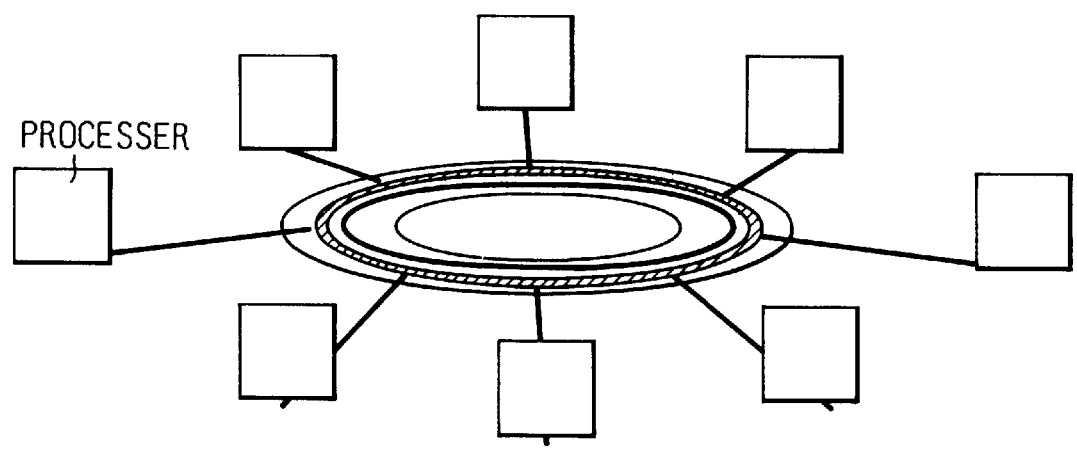
FIG. 106 is an illustrative view showing an example of an optical MCM for a data-exchange network.
Figure 107:
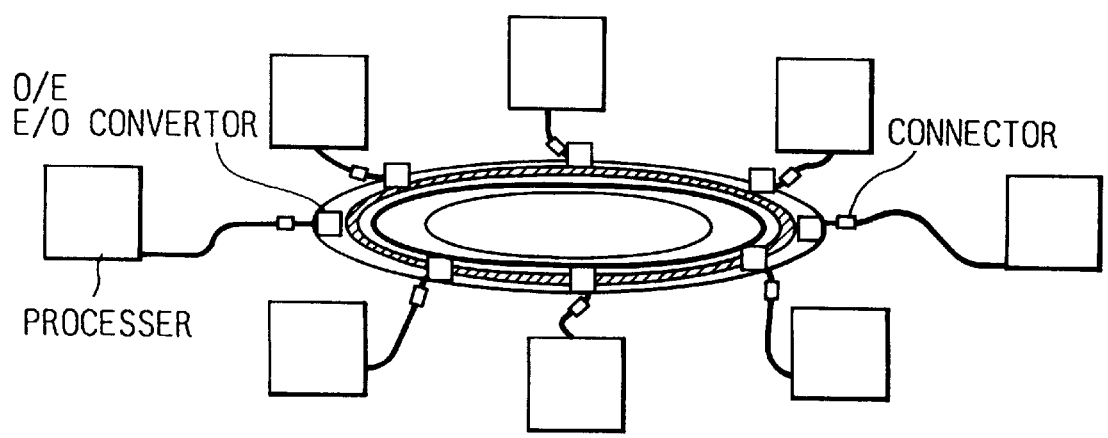
FIG. 107 is an illustrative view showing an example of an optical MCM for a data-exchange network.
Figure 108:
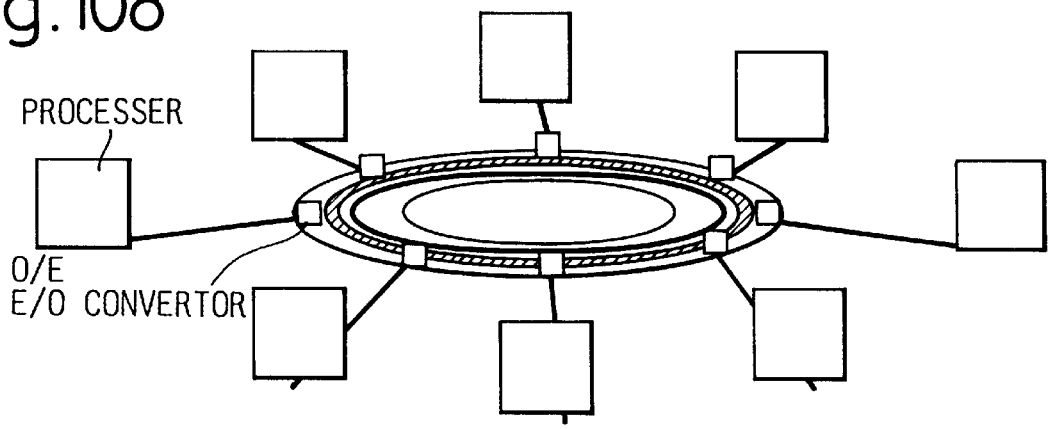
FIG. 108 is an illustrative view showing an example of an optical MCM for a data-exchange network.
Figure 109:
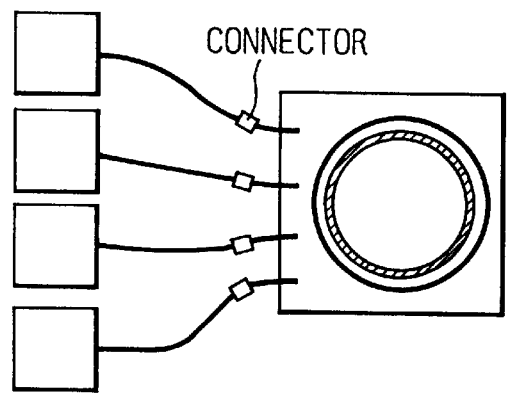
FIG. 109 is an illustrative view showing an example of an optical MCM for a data-exchange network.
Figure 110:
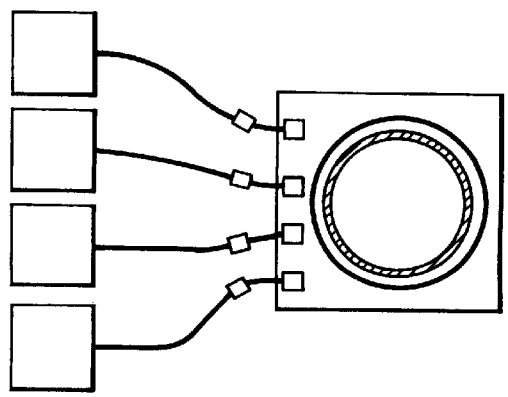
FIG. 110 is an illustrative view showing an example of an optical MCM for a data-exchange network.

The optical network may take any of a variety of forms. For example, the processing elements, optical paths and optical transmitters and receivers may be situated on the optical circuit board. In this case, the optical paths are constructed with the waveguides as cores. In most cases the optical transmitters and receivers are formed on the board in a monolithic or hybrid manner. Alternatively, the processing elements and optical transmitters and receivers may be situated off the optical circuit board. Such a case is shown in FIGS. 105 to 110. In this case, the processing elements and optical transmitters and receivers are connected to the optical circuit board via optical fibers or optical waveguides. FIGS. 105, 106 and 109 are examples in which the signal exchange between the processing elements, optical transmitters and receivers and the optical circuit board is made with direct light. FIGS. 107, 108 and 110 are examples in which the signal exchange between the processing elements, optical transmitters and receivers and the optical circuit board is made via intervening photoelectric conversion elements (E/O or O/E converter).

Figure 111:
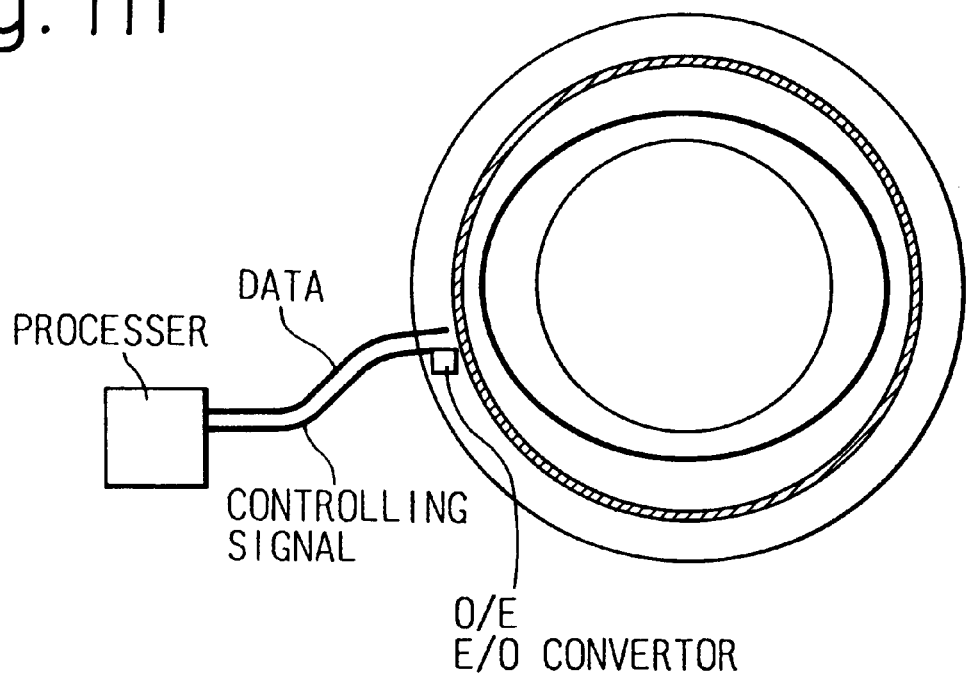
FIG. 111 is an illustrative view showing an example of an optical MCM for a data-exchange network.
Figure 112:
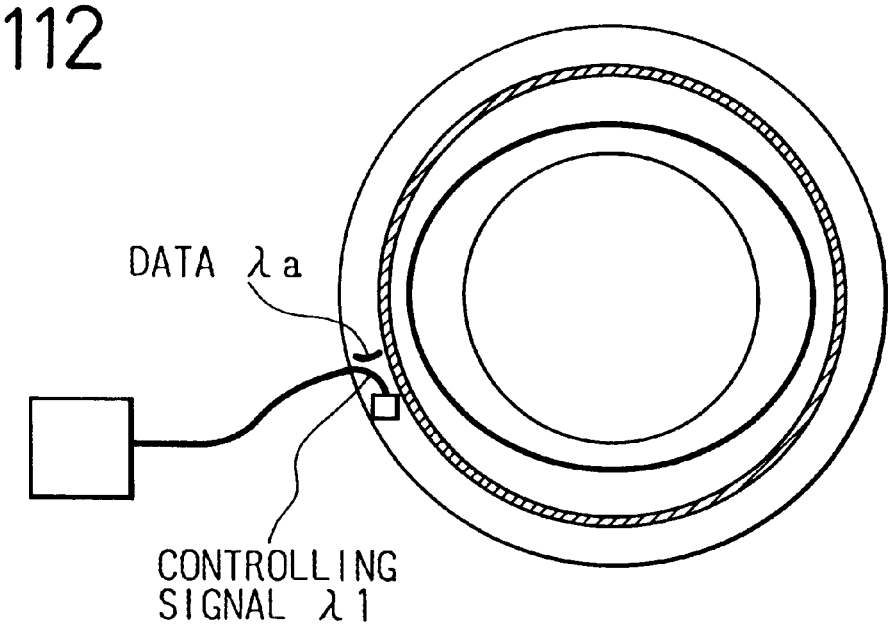
FIG. 112 is an illustrative view showing an example of an optical MCM for a data-exchange network.
Figure 113:
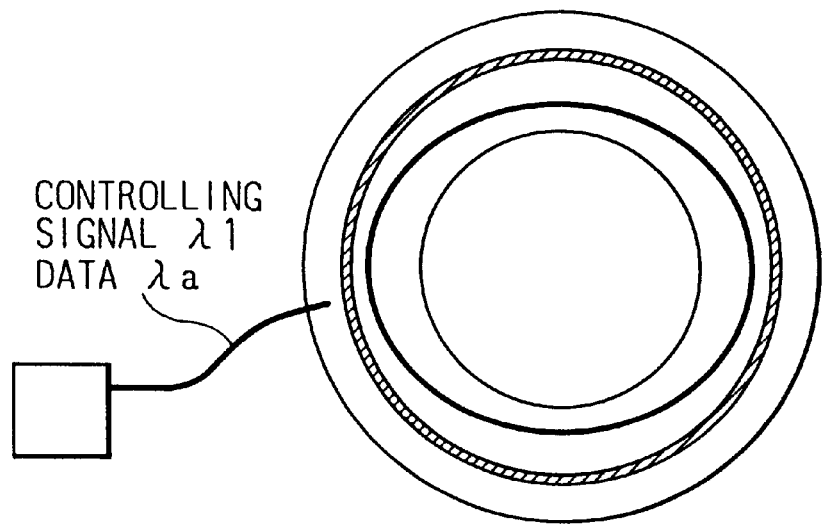
FIG. 113 is an illustrative view showing an example of an optical MCM for a data-exchange network.
Figure 114:
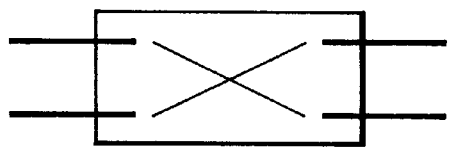
FIG. 114 is an illustrative view showing an example of an all-optical switch.
Figure 115:
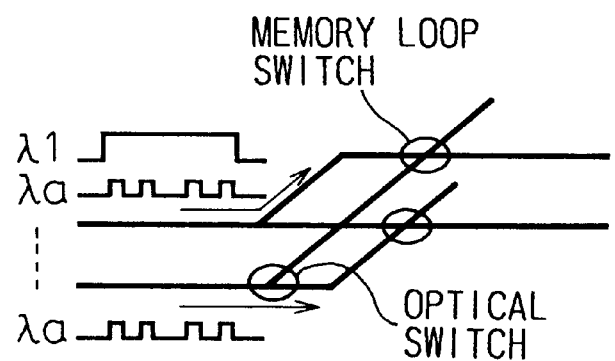
FIG. 115 is an illustrative view showing an example of an all-optical switch.

FIGS. 111 to 114 show examples wherein the signal light and control light are of different wavelengths. In FIG. 111, the data and control signal are sent by separate paths. The control signal is received at the receiving element on the circuit board, and data is switched in accordance therewith. In this case, the signal light and the control light may be of the same wavelength. In FIG. 112, the data and control signal are sent by the same path, and branched at a filter on the circuit board. The control signal is received at the receiving element on the circuit board, and data is switched in accordance therewith. Conversely, the output from the optical circuit board is subjected to E/O conversion, and either sent to the processing element or sent as light. In FIG. 113, the data and control signal are sent by the same path, and signal switching is performed at an all-optical element on the circuit board (for example, an element such as described later with reference to FIGS. 114 to 116).

Figure 116:
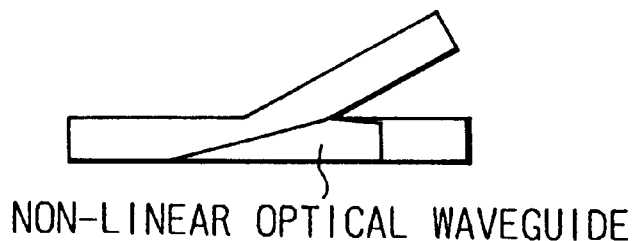
FIG. 116 is an illustrative view showing an example of an all-optical switch.
Figure 117:
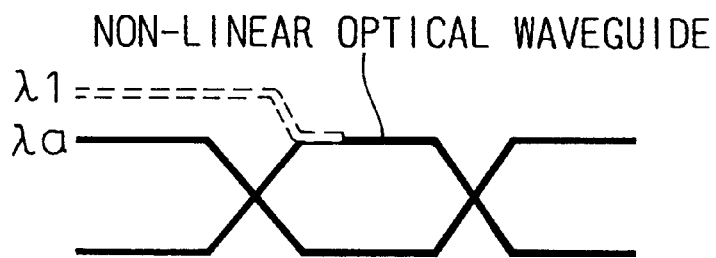
FIG. 117 is an illustrative view showing an example of an all-optical switch.
Figure 118:
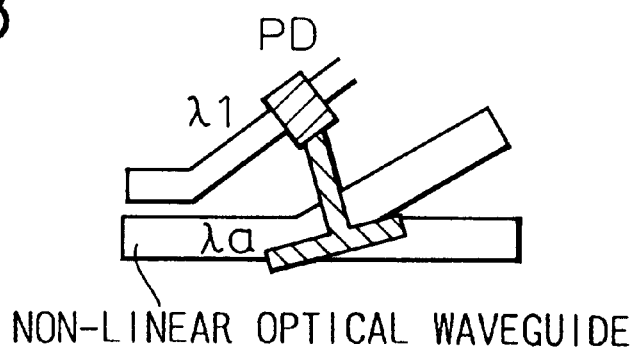
FIG. 118 is an illustrative view showing an example of an all-optical switch.

FIGS. 114 to 118 are examples of all-optical switches. Control light ($\lambda 1$) and signal light ($\lambda a$) are used. The control light and signal light are superimposed, and the signal light is switched by the control light. In FIG. 116, a third-order nonlinear optical material whose refractive index changes depending on the light intensity is inserted near the switching section, and a refractive index difference is created there by the control light, by which the light is reflected. Here, it is better that the third-order NLO material exhibits refractive index change by illumination of light of $\lambda_1$ and that the NLD material exhibits little refractive index change by illumination of light of $\lambda_2$. In FIG. 117, control light is introduced to one arm of the nonlinear optical waveguide, where switching of the light is performed. In FIG. 118, the control light is branched and photoelectrically converted at a PD, etc. and the refractive index of the electrooptical substance is varied by the voltage for switching. The nonlinear optical or electrooptical material may be a polymer, compound semiconductor, multiquantum well (MQW) of a compound semiconductor or a dielectric such as an LN or the like. In the examples in FIGS. 116 and 117, it is preferred that the nonlinear optical substance either react with the control light more notably than the signal light or that the control light be of stronger intensity than the signal light, from the standpoint of noise reduction. By having the wavelength of the control light approach the absorption wavelength of the material, it is possible to increase the refractive index change due to the control light as a result of the resonance effect. In addition, by linking the switches in levels, self-routing, such as a Banyan network, is made possible. Insertion of an optical amplifier is effective in cases where loss of the control light or signal light is a problem.

Figure 119:
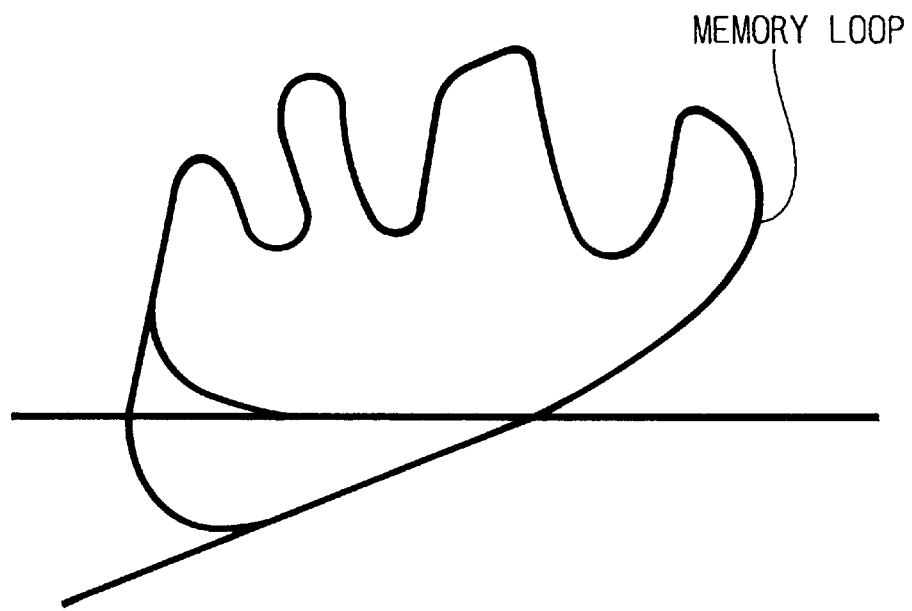
FIG. 119 is an illustrative view showing an example of a memory loop.

An optical memory (FIG. 119) may be employed to switch signals to the memory loop end and return them to the main line, in cases of signal collision. The memory loop used may be an optical waveguide or optical fiber, and depending on the case the memory loop may be an optical amplifier, or an optical amplifier may be inserted in part or the entirety thereof.

In the examples which follow, these may be used as all-optical self-routing optical switches instead of electrooptical switches.

Each optical switch of the Banyan network is either incorporated in the PE or incorporated in the board near the PE, or it is driven by an LSI provided near the PE. The driving LSI determines the signal switch route based on the signal from each PE, and turns each optical switch ON and OFF. The signal from each PE may also be sent electrically, and light may also be sent via an optical path other than the 16 optical loops. The transmitter and receiver are driven by an LSI provided in the same manner. A MUX/DEMUX circuit, amplification circuit, etc. may also be combined therewith. The optical switch may also be driven by the same LSI. It is possible to reduce the number of LSIs by using all-optical self-routing optical switches.

Figure 97:
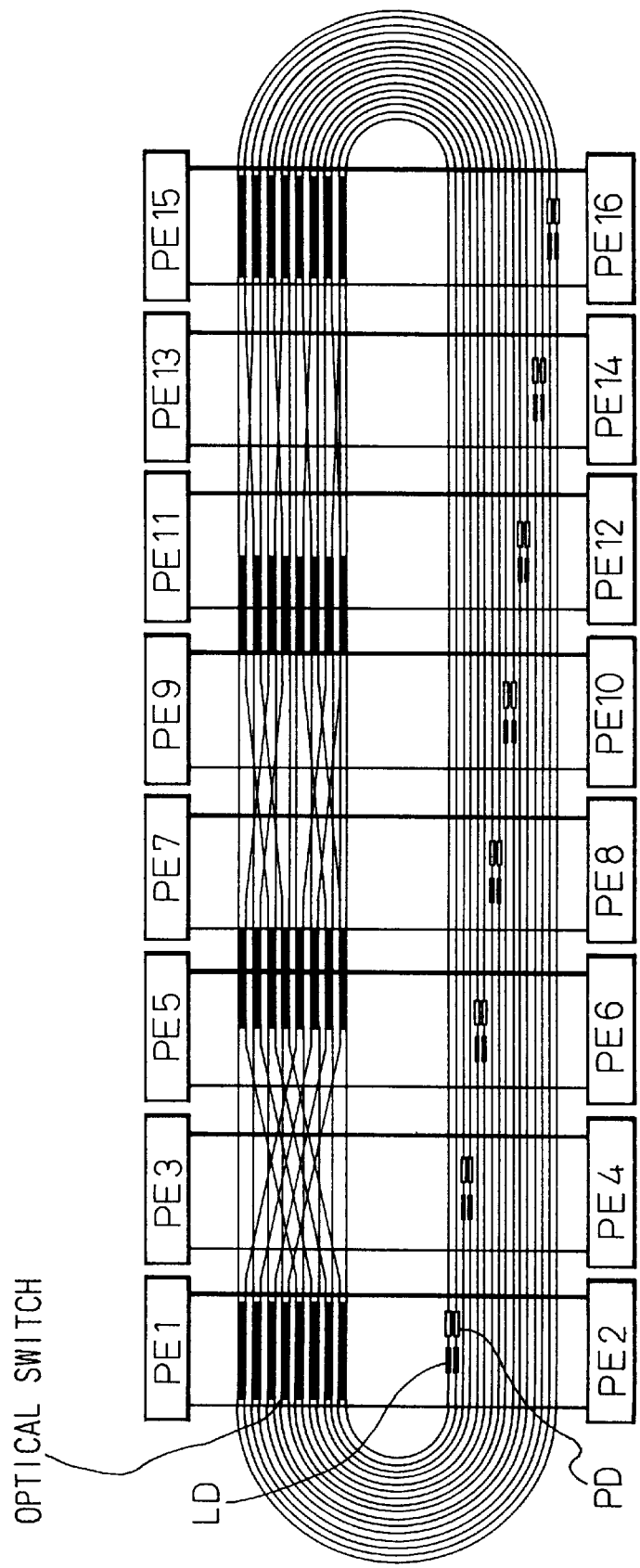
FIG. 97 is an illustrative view showing an example of a Banyan-type optical network.
Figure 99:
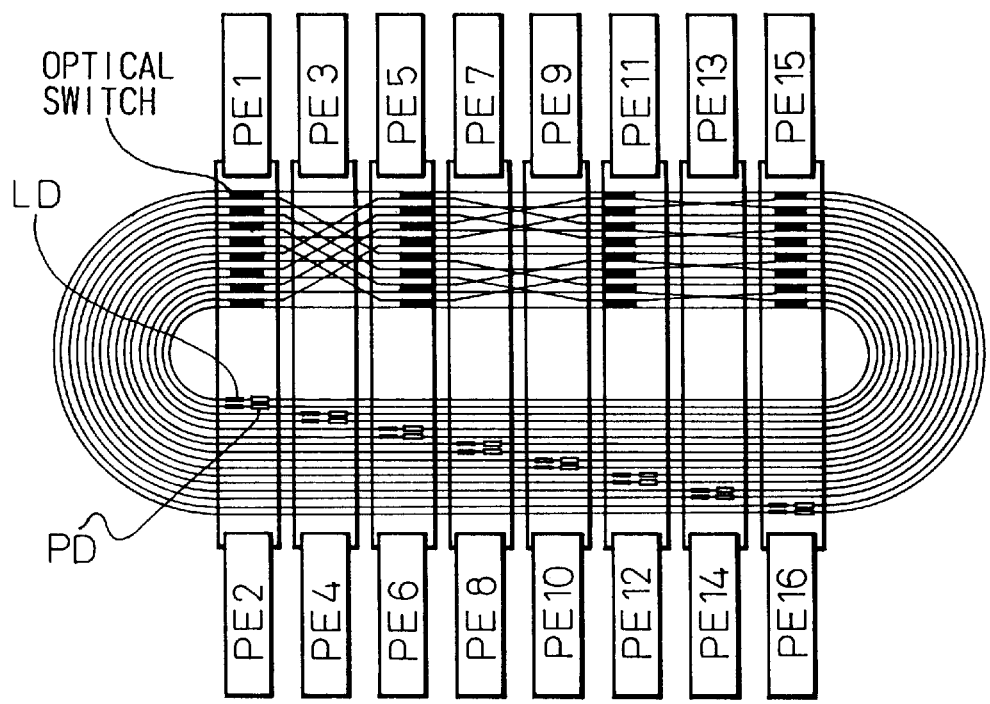
FIG. 99 is an illustrative view showing an example of a Banyan-type optical network.
Figure 100:
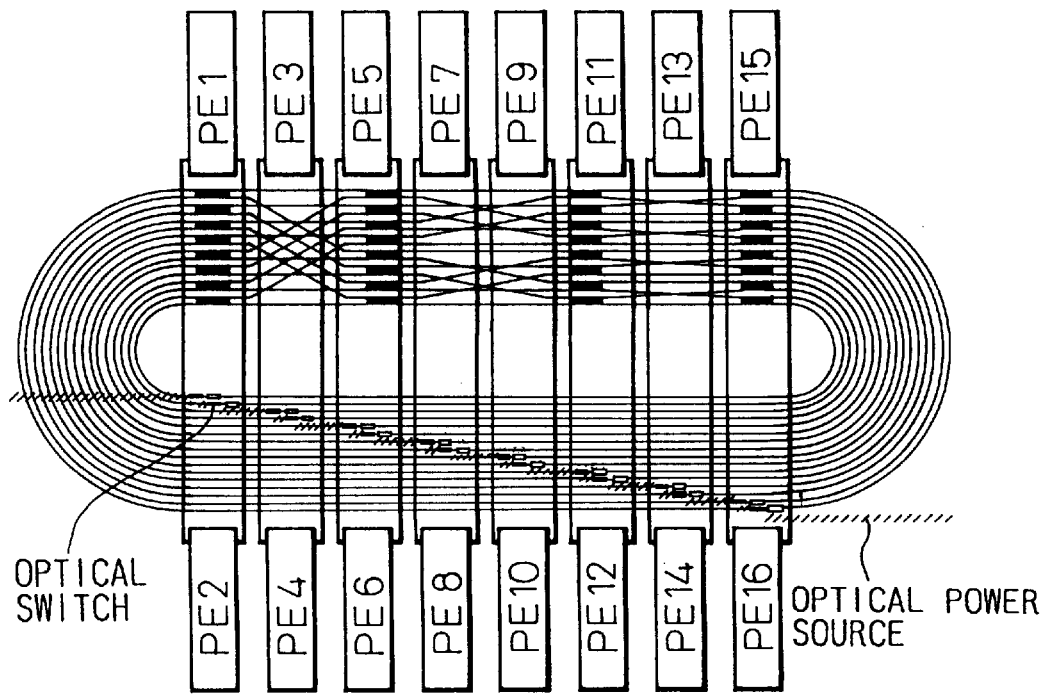
FIG. 100 is an illustrative view showing an example of a Banyan-type optical network.
Figure 101:
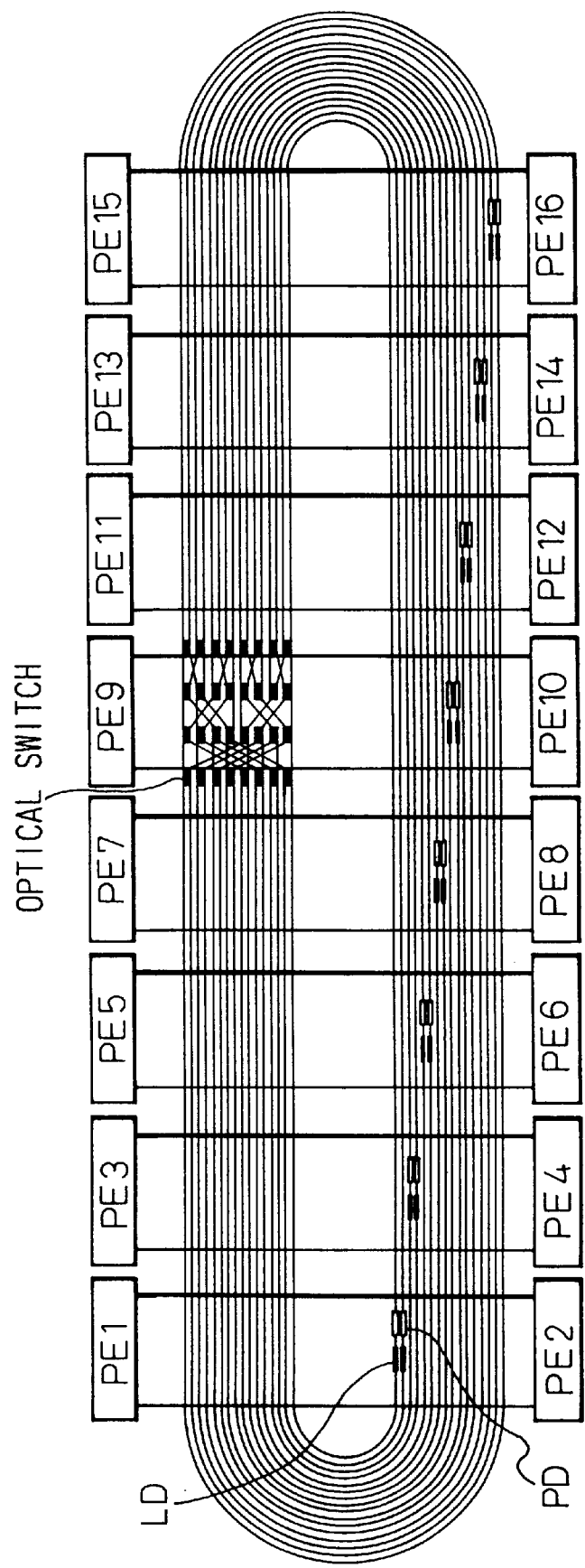
FIG. 101 is an illustrative view showing an example of a Banyan-type optical network.
Figure 102:
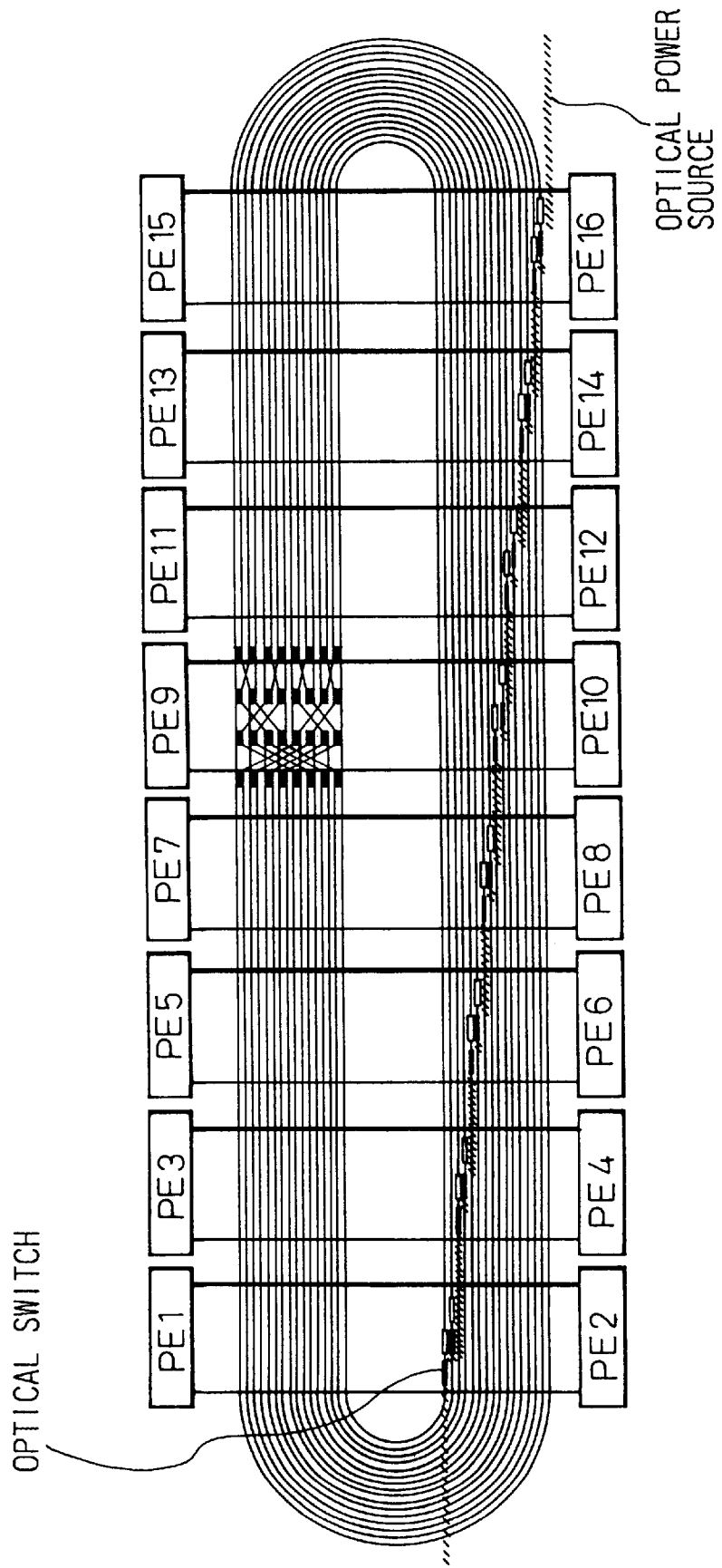
FIG. 102 is an illustrative view showing an example of a Banyan-type optical network.
Figure 103:
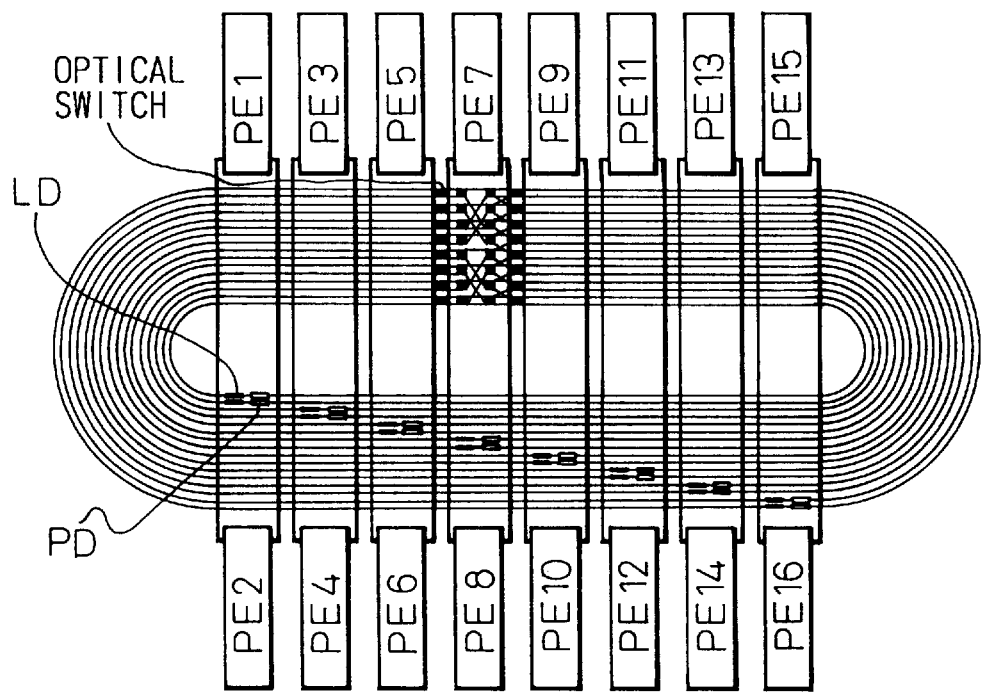
FIG. 103 is an illustrative view showing an example of a Banyan-type optical network.
Figure 104:
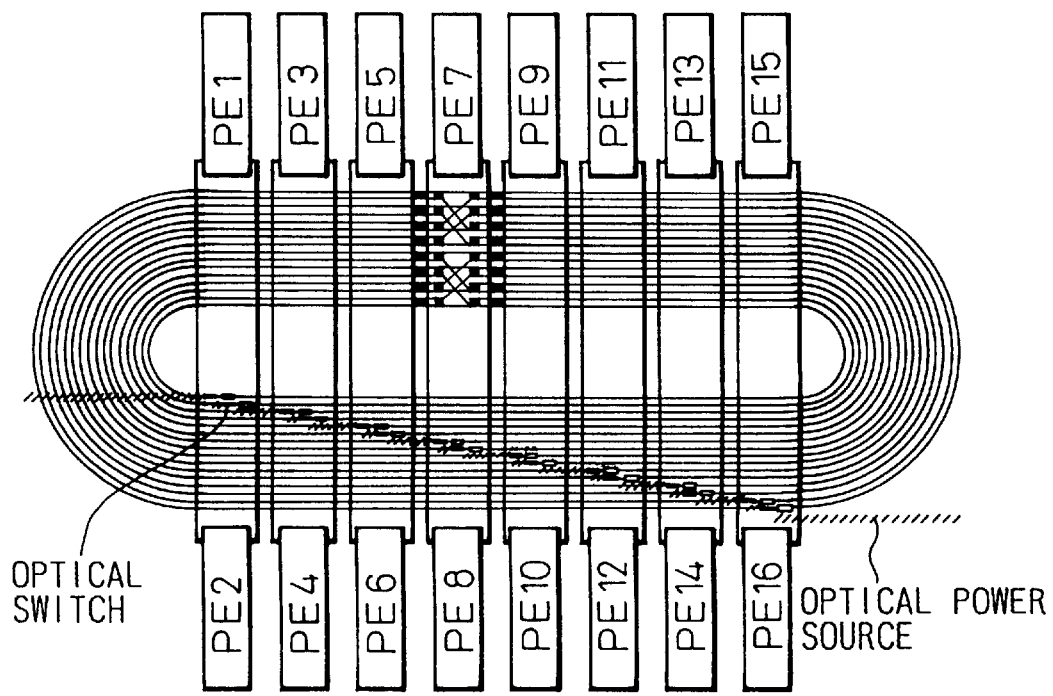
FIG. 104 is an illustrative view showing an example of a Banyan-type optical network.

The examples in FIGS. 99 and 100 are roughly the same as FIGS. 97 and 98, respectively, with only the orientation of the PEs being different.

FIGS. 101 and 102 and FIGS. 103 and 104 are also roughly the same as FIGS. 97 and 98, differing only in that the size of the Banyan network is smaller and it is made to be driven by a single LSI. By replacing the Banyan network with an improved Batcher's-Banyan network, it is possible to reduce the frequency of data collision.

Figure 120:
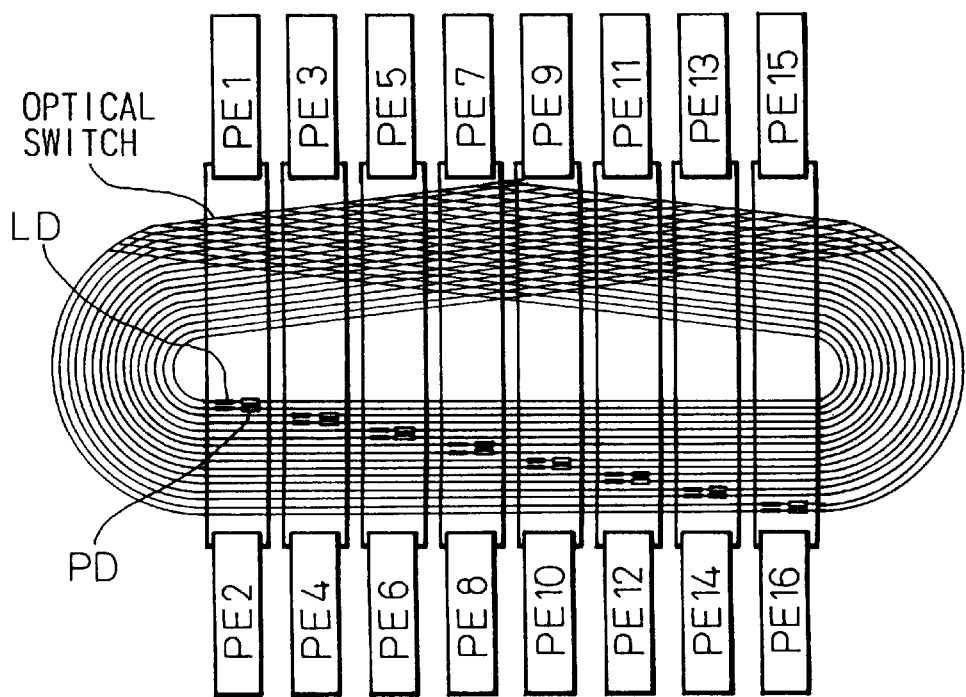
Figure 121:
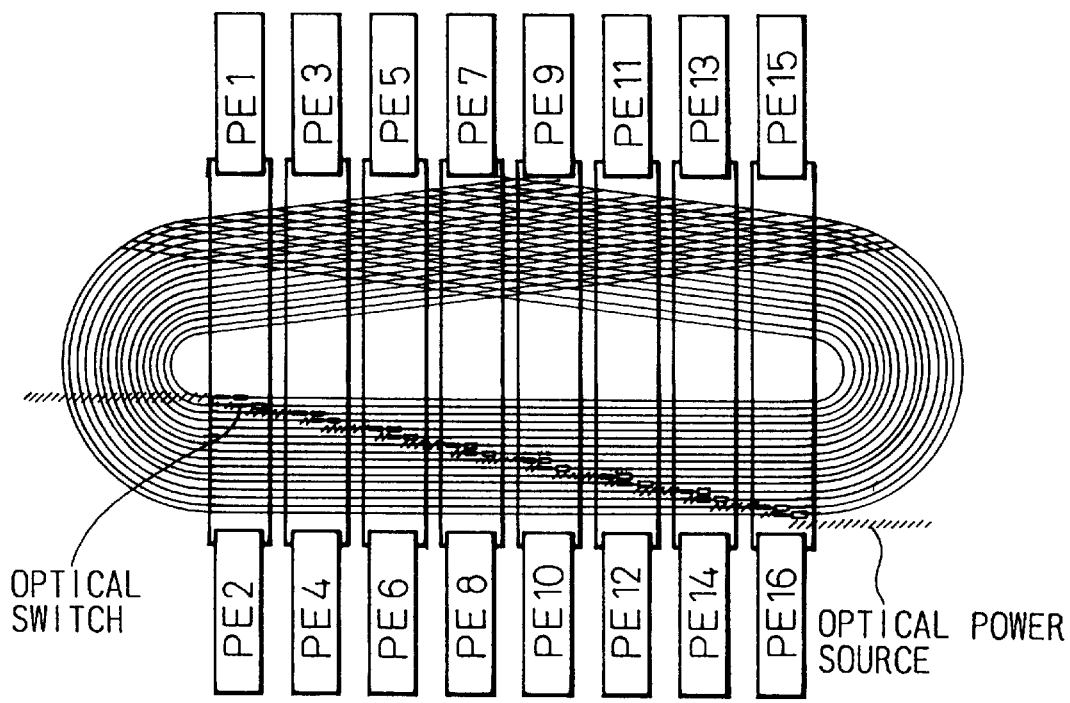
Figure 122:
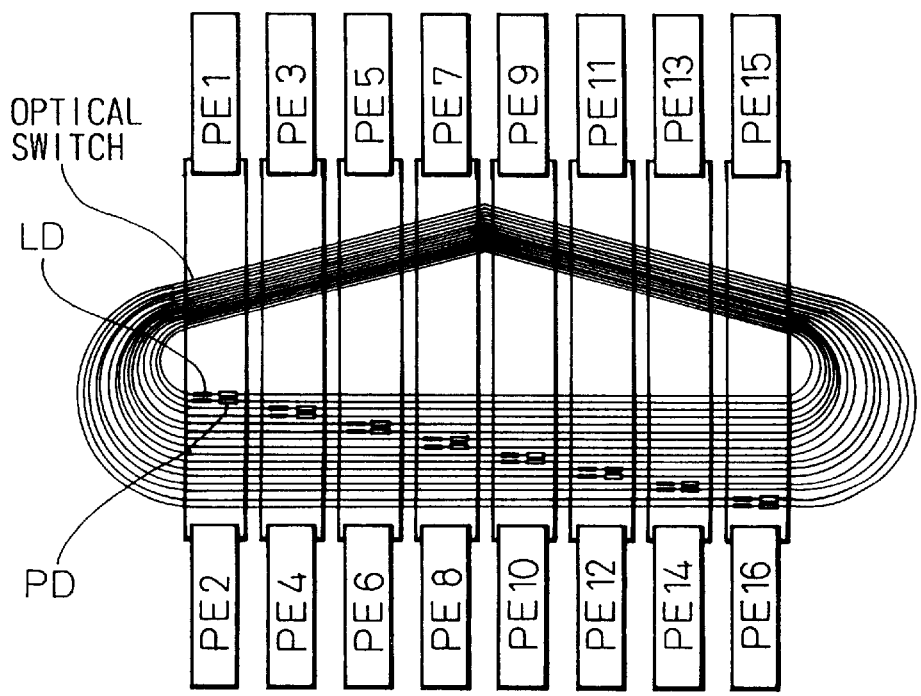
Figure 123:
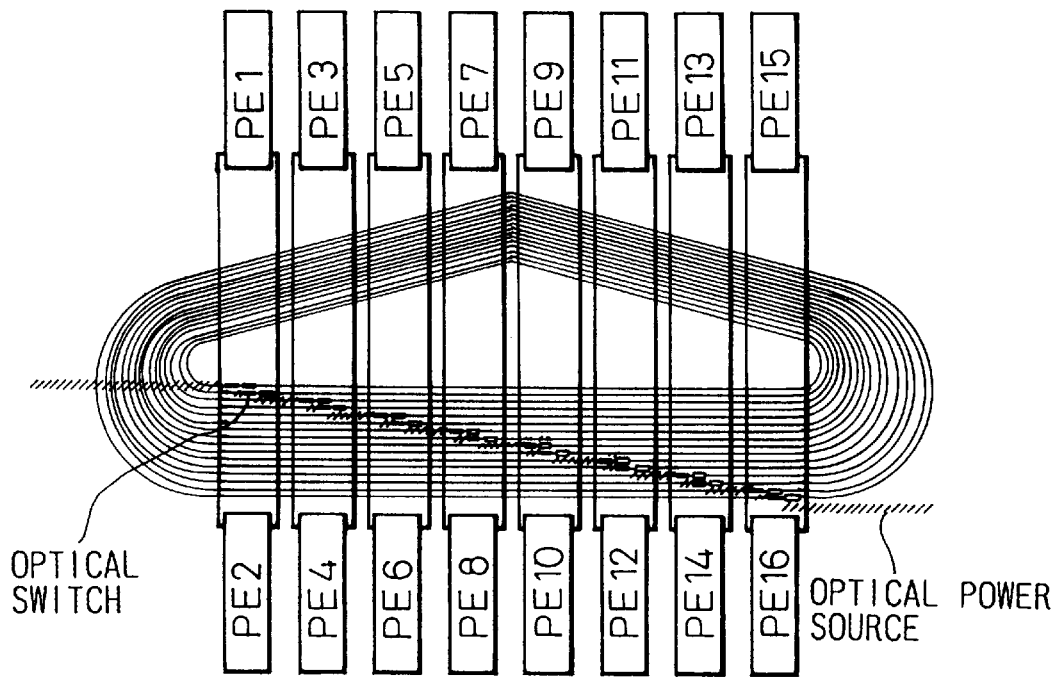
Figure 124:
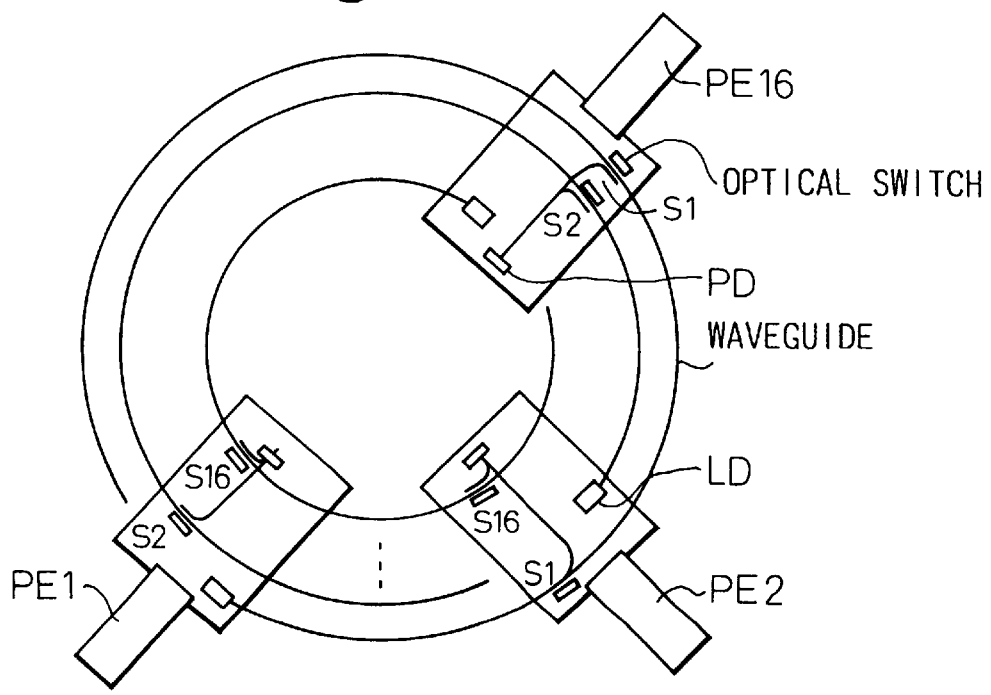

FIGS. 120 to 123 are examples of optical networks formed with crossbars instead of a Banyan network. In FIGS. 120 and 121, the size of the matrix switch is large, and the driving crosspoints straddle a few LSIs. In FIGS. 122 and 123, the size thereof is small, allowing driving by a single LSI.

FIGS. 124 to 133 are examples of loop-type networks for 16 PEs. In the example in FIG. 124, each PE is assigned a single optical loop for sending signals. Therefore, a total of 16 optical loops are necessary. The transmitter of each PE (LD) is linked to the corresponding optical loop. An optical switch is situated in each optical loop, for taking up signals from the optical loop to the PD of each PE. For example, the optical signal from PE1 travels the outermost ring. If this signal is desired by PE2, S1 is activated, and the optical signal is taken up by the PD of PE2. The operation is similar thereafter, but the transmission and reception of signals may be conducted in parallel from one PE. In this case, even more loops may be placed.

Figure 125:
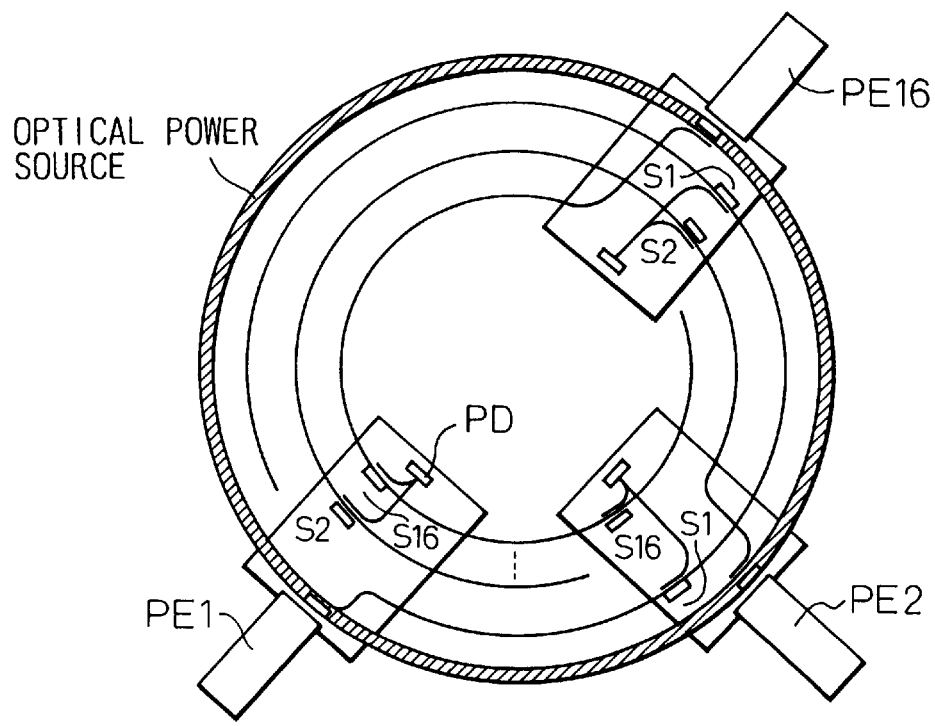

The example in FIG. 125 employs optical switches or modulators as the transmitters, and picks up light from each optical power source and transmits optical signals. It is thus possible to reduce the number of LDs. The pumping light from the photoelectric source may be introduced by an LD mounted on the board, or from the outside by a fiber, flexible waveguide or space. A system which introduces the light from the outside is particularly effective from the point of view of cooling and maintenance. In this case as well, there is no restriction to use the above-mentioned photoelectric system, as the transmission may be with an optical pickup from a waveguide serving as a light reservoir, or with a conventional modulating system. Here, the photoelectric source is drawn as a loop, but it is not necessarily restricted to be so, as it may have any other form such as linear, tablet, etc. (The same applies for the examples which follow).

Each of the optical switches is either incorporated in the PE or incorporated in the board near the PE, or it is driven by an LSI provided near the PE. The driving LSI determines the signal switch route based on the signal from each PE, and turns each optical switch ON and OFF. The signal from each PE may also be sent electrically, and light may also be sent via an optical path other than the 16 optical loops. The transmitter and receiver are driven by an LSI provided in the same manner. A MUX/DEMUX circuit, amplification circuit, etc. may also be combined therewith. The optical switch may also be driven by the same LSI.

Figure 126:
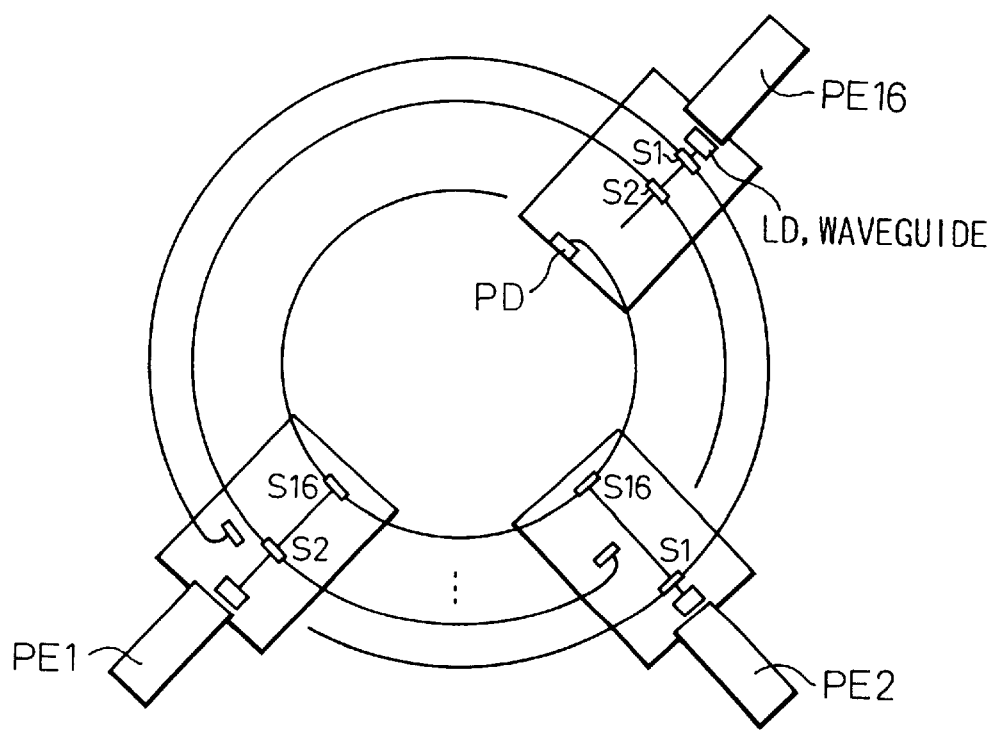

In the example in FIG. 126, each PE is assigned a single optical loop for receiving signals. Therefore, a total of 16 optical loops are necessary. The receiver of each PE (PD) is linked to the corresponding optical loop. An optical switch is situated in each optical loop, for sending out signals to the optical loop from the PD of each PE. For example, if it is desired to send a signal from PE1 to PE16, S16 of PE1 is activated, and the signal is sent out to the waveguide of the innermost ring and transmitted to the PD of PE16.

Figure 127:
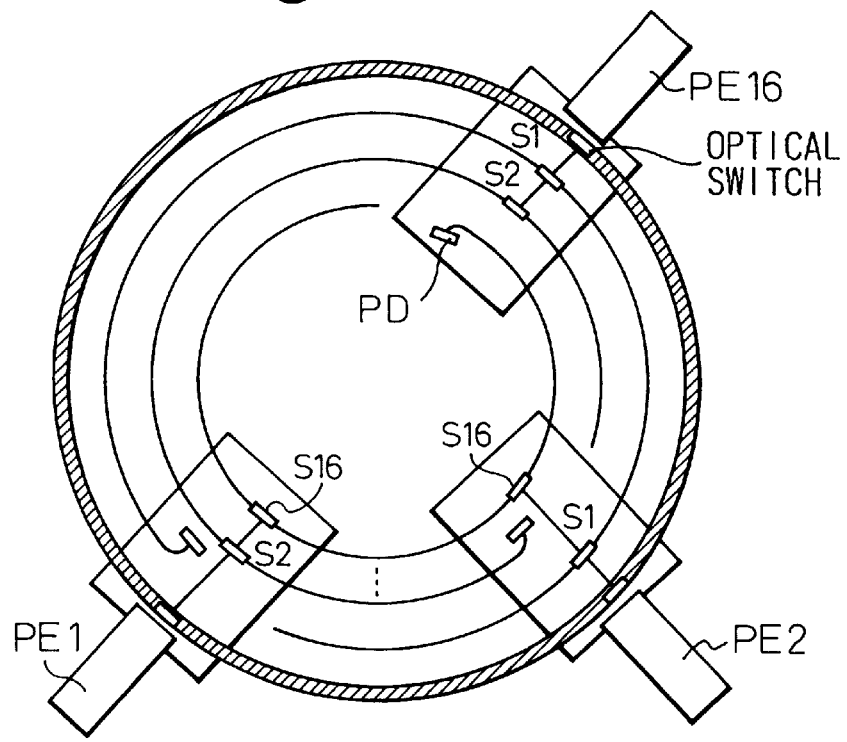

The example in FIG. 127 employs optical switches or modulators as the transmitters, and picks up light from each optical power source and transmits optical signals. It is thus possible to reduce the number of LDs. The pumping light from the outside of the optical power source may be introduced by an LD mounted on the board, or from the outside by a fiber, flexible waveguide or space. A system which introduces the light from the outside is particularly effective from the point of view of cooling and maintenance. In this case as well, there is no restriction to use the above-mentioned photoelectric system, as the transmission may be with an optical pickup from a waveguide serving as a light reservoir, or with a conventional modulating system.

Each of the optical switches is either incorporated in the PE or incorporated in the board near the PE, or it is driven by an LSI provided near the PE. The driving LSI determines the signal switch route based on the signal from each PE, and turns each optical switch ON and OFF. The signal from each PE may also be sent electrically, and light may also be sent via an optical path other than the 16 optical loops. The transmitter and receiver are driven by an LSI provided in the same manner. A MUX/DEMUX circuit, amplification circuit, etc. may also be combined therewith. The optical switch may also be driven by the same LSI.

Wavelength multiplexing is possible by preparing a plurality of transmitter wavelengths. FIGS. 132 and 133 are examples wherein the systems in FIGS. 126 and 127 have been wavelength-multiplexed. The optical signals from an LD array or optical switches with a plurality of optical power sources are merged and wavelength-multiplexed, and then sent out to the desired optical loop. At the receiver end, the signal is branched by a filter or the like, and then transmitted to the array-form PD of each corresponding wavelength.

Figure 128:
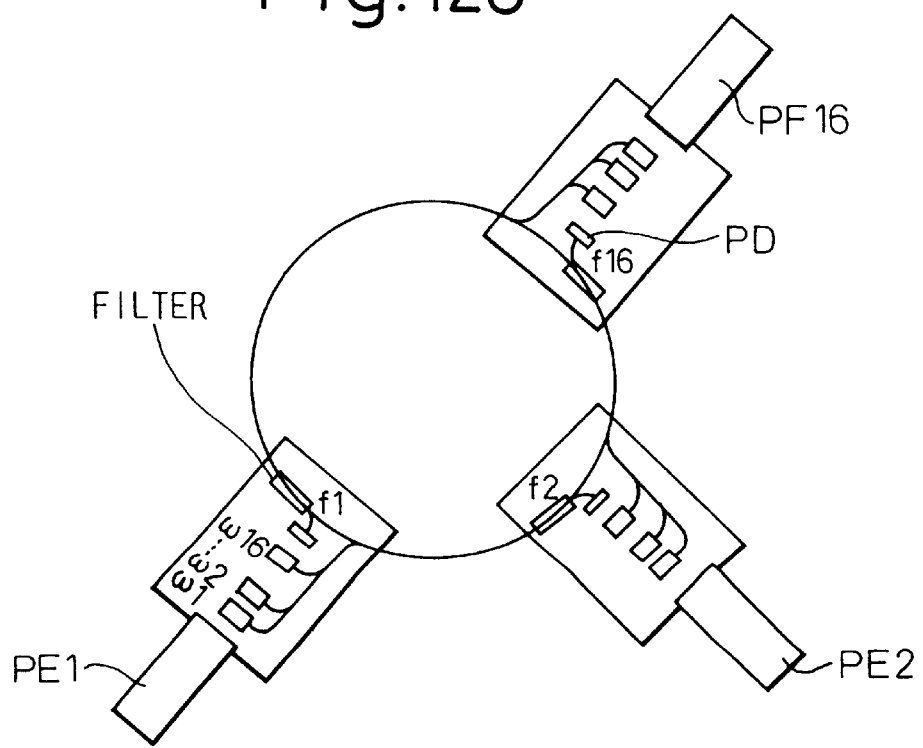

In the example in FIG. 128, each PE is assigned a specific wavelength. Therefore, a total of 16 wavelengths are necessary. Basically one optical loop is sufficient. It is arranged so that transmission of 16 wavelengths is possible from the transmitter of each PE (LD), and each wavelength is transmitted by the desired receiving-end wavelength corresponding to the filter and sent out to the waveguide loop. Filters are provided on the optical loop, and each filter selectively takes up signals of the wavelength corresponding to its own PE, guiding them to the receiver. For example, if it is desired to transmit from PE1 to PE2, the transmitter of PE1 transmits by light of ω2. This is selectively taken up by the filter f2, and transferred to the receiver of PE2. By simultaneously sending signals of a plurality of wavelengths, it is possible to send any signals simultaneously to a plurality of PEs, thus increasing the freedom of the data transfer.

Figure 129:
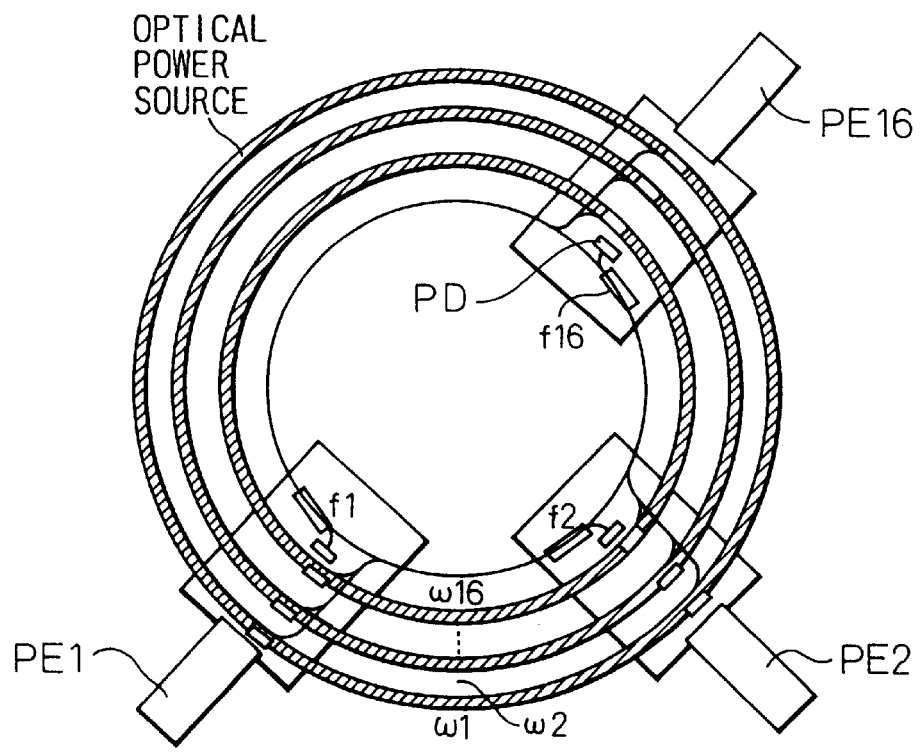

The example in FIG. 129 employs optical switches or modulators as the transmitters, and picks up light from each optical power source and transmits optical signals. It is thus possible to reduce the number of LDs. The pumping light from the optical power source may be introduced by an LD mounted on the board, or from the outside by a fiber, flexible waveguide or space. A system which introduces the light from the outside is particularly effective from the point of view of cooling and maintenance. In this case as well, there is no restriction to use the above-mentioned photoelectric system, as the transmission may be with an optical pickup from a waveguide serving as a light reservoir, or with a conventional modulating system.

The transmitters and receivers are either incorporated in the PE or incorporated in the board near the PE, or they are driven by LSIs provided near the PE. A MUX/DEMUX circuit, amplification circuit, etc. may also be combined therewith.

In the example in FIG. 134, each PE is assigned a specific wavelength. Basically one optical loop is sufficient. The optical signal of the assigned wavelength from the transmitter (LD) of each PE is transmitted and sent out to the optical loop. Tunable filters are situated in the optical loop to correspond to each PE, and electrical tuning is performed to take up the wavelength of the desired transmitting end. For example, if it is desired to receive a signal from PE1 at PE2, the latter is tuned to the wavelength of the ω1 light transmitted from the transmitter of PE1, which is taken up by the receiver.

The example in FIG. 135 employs optical switches or modulators as the transmitters, and picks up light from each optical power source and transmits optical signals. It is thus possible to reduce the number of LDS. The pumped light from the optical power source may be introduced by an LD mounted on the board, or from the outside by a fiber, flexible waveguide or space. A system which introduces the light from the outside is particularly effective from the point of view of cooling and maintenance. In this case as well, there is no restriction to use a photoelectric system, as the transmission may be with an optical pickup from a waveguide serving as a light reservoir, or with a conventional modulating system.

The transmitters and receivers are either incorporated in the PE or incorporated in the board near the PE, or they are driven by LSIs provided near the PE. A MUX/DEMUX circuit, amplification circuit, etc. may also be combined therewith.

In these examples, filter arrays or branching filters may be used instead of tunable filters, and the signals may be guided to receiving element arrays situated to correspond to each signal wavelength (FIGS. 136 and 137). In this case, each branching filter or filter array is preferably made to take up a portion of light.

Figure 130:
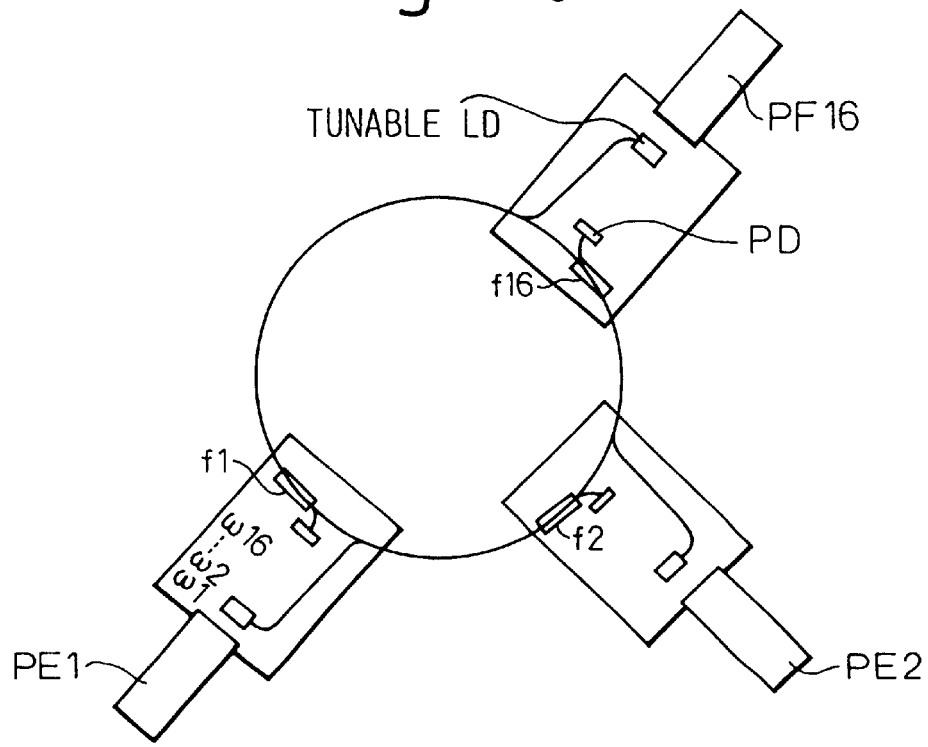
Figure 131:
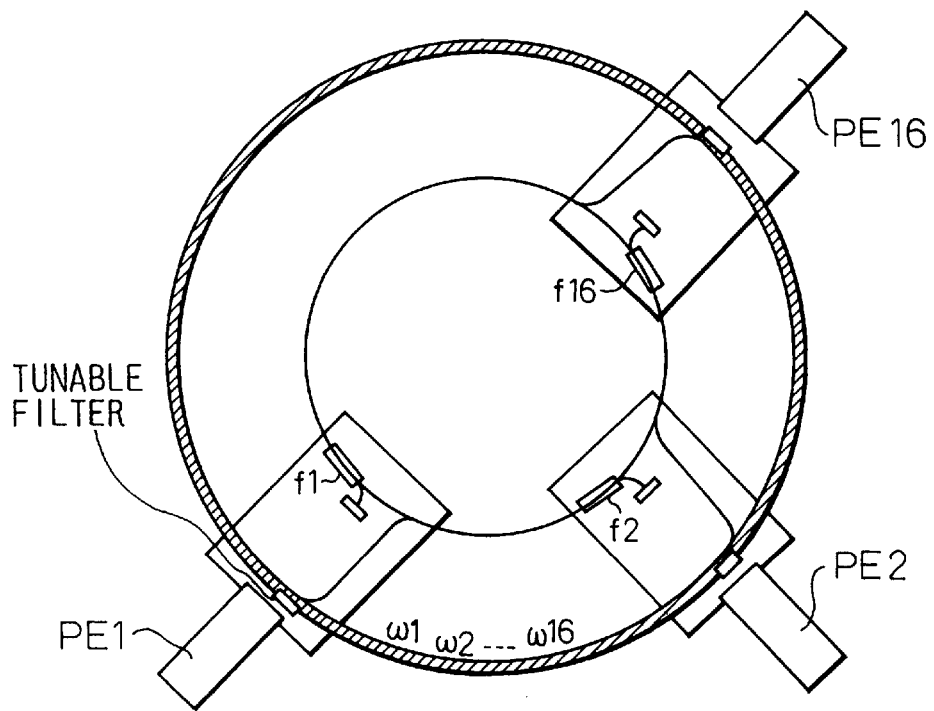

FIGS. 130 and 131 are examples wherein the plurality of light sources in FIGS. 128 and 129 have been replaced with a tunable LD and a tunable filter, respectively, to reduce the number of light sources.

FIGS. 138 and 139 are examples of light networks which employ a tunable LD and tunable filter. A tunable waveguide laser may be used instead of the tunable LD. Each PE is normally tuned to its own assigned frequency. When the header comes it recognizes the transmitting end and is tuned to that corresponding wavelength. When reception is complete it is returned to its own wavelength. During the data reception, other data are automatically refused. Therefore, when the transmitting end has its own signal return from the loop, it recognizes it and retransmits it. Once it is stored in the memory such as an optical memory loop, it may be sent again.

Furthermore, in order to reduce crosstalk, a unique wavelength may be assigned to the header. In this case, each PE is normally tuned to the wavelength of the header. When the header signal enters, it recognizes where the signal is from and where it is headed, and if the signal is for itself it is tuned to the wavelength of the transmitting light to take up the data. After completion, it returns to the header wavelength. Alternatively, in cases where it sends the signal wavelength at the wavelength of the receiving end, it is tuned to its own wavelength when taking up the data.

All or a portion of the electrooptical switches, light modulators or tunable filters are selected from common second-order or third-order organic nonlinear optical materials, for example, electrooptical polymers, conjugated polymers, nonlinear optical glass, semiconductors and the like, which have been made into clads and/or waveguides. The materials may be partially different. When a voltage occurs at the electrodes, a portion or virtually all of the light being supplied is either reflected or moves through the waveguides, is picked up at the signal-transmitting waveguide, and is transmitted. The optical switches used here may be conventional directional coupling switches, but they are preferably light modulator/optical switches which create a refractive index difference in or near the optical waveguide by voltage application, and operate utilizing the resulting light reflection, or light modulator/optical switches which open a refractive index window in the clad by voltage application, and operate utilizing the resulting light leakage. Since the pickup volume is modulated by the voltage, the output voltage becomes the optical signal.

There is no need for the entire waveguide to be made of the nonlinear optical material, as the nonlinear optical material may be used for the switch section only. In such a case, for example, polyimide fluoride, glass, or the like may be used as a passive waveguide. Here, an output electrode and input electrode are not necessarily required, and the voltage of the transistor may be applied directly to the waveguide, or the receiving-end transistor may be driven by the very charge produced at the receiving element.

The optical power source used may be, for example, a waveguide laser/amplifier comprising rare earth metal ion-doped glass, polymer or ceramic. The optical power source and signal waveguide do not necessarily have to be layered, as they may be on the same plane. Also, the signal may pass through not only the optical waveguide, but also a space, medium space or fiber. Depending on the case, it may also be picked up from a waveguide passing through DC laser light, but then it is impossible to avoid the disadvantage of loss of light amount as the signal travels downstream. Consequently, methods using photoelectric sources are much superior. In addition, it is possible to form a tunable transmitter by combining a nonlinear optical element and a waveguide laser. That is, a compound element consisting of a second-order or third-order nonlinear optical material and rare earth metal ion-doped glass or the like.

The receiving element may be formed in a cut through the waveguide. Photodiodes, phototransistors and MSM detectors, etc. made of a-Si, poly Si and conjugated polymers are suitable. The receiving element is not limited to the type mentioned above, as it may be formed in the top or the bottom of the waveguide, to absorb light from the waveguide. Furthermore, light may be received by forming a PD in the LSI or onto the optical circuit board. In this case, a detector made of a compound of Si or a family III element with a family V element. The coupling with the waveguide may be also be accomplished by a method of direct introduction from a waveguide using a hologram, diffraction grating, slope reflection, or the like. Light may also be introduced using a hologram optical element (HOE) or optical solder or SOLNET.

The luminescent element may be, in addition to an LD, an EL, LED or the like. Organic ELs and LEDs using polymers and low molecular weight crystals are particularly suitable to be built into the circuit board. The luminescent element may be formed by cutting through the waveguide, or it may be formed at the top or bottom of the waveguide to introduce light into the waveguide. In cases where a temperature semiconductor is used on the board, the luminescent element may be built-in.

The LD or PD may be mounted on the board in advance by a soldering bump or the like. Furthermore, a sub-board with the LD or PD formed or mounted thereon may be provided. Combinations of these types are also acceptable.

The excitation of the optical power source may be accomplished using light from an LD mounted on the optical circuit board. Alternative methods which may be used include a method of introducing light from a fiber from the outside via a connector, a method of introducing light via a light tab from the waveguide of a circuit board mounted on the optical circuit board, and a method of directly introducing light by using a hologram, diffraction grating or slope reflection from a waveguide on the circuit board. The light may also be introduced using an HOE or optical solder from the surface side of the optical circuit board. Introduction of light from the outside may be said to be a superior method since a heating source is externally attached, which is effective to reduce heat release from the LSI and helps facilitate replacement.

In cases where a polymer material is used, a vapor film formed by evaporation polymerization, CVD (Chemical Vapor Deposition), MLD (Molecular Layer Deposition) or the like is effective, as is the wet method by spin coating, etc. For example, the method described in Japanese Patent Application No. 6-82642 may be used.

As mentioned above, in the fourth aspect, the present invention is aimed at increasing the connectivity between all types of optical/electronic elements and optical/electronic apparatuses, including parallel processors, while reducing their size and cost. Furthermore, although the examples described above concerned connection between PEs, it is to be understood that the present invention may be applied to connection between all types of optical/electronic elements and optical/electronic apparatuses, including LSIs, microprocessors, processing elements (PEs), MCMs, workstations, personal computers and the like, irrespective of their level or type. In addition, it may also be applied to other communication information processing systems, such as optical switchers.

The following are illustrative embodiments of the invention.

What is claimed is:

1. A method of producing an optical waveguide, characterized by irradiating, on a photorefractive material whose refractive index changes with light irradiation, a writing light of a wavelength which changes its refractive index, and forming an optical waveguide or refractive index distribution, which does not correspond to writing light power distribution while inducing self-focusing of the writing light, whose power distribution changes during writing process, to form a self-organized optical waveguide, wherein the writing light is supplied from an optical device which is connected to the self-organized optical waveguide extending in the direction of light propagation from the optical device.

2. The method of claim 1, wherein a refractive index distribution is formed, and further characterized by subjecting the writing light to intensity modulation upon the formation of the refractive index distribution.

3. A method of producing an optical waveguide, characterized by irradiating, on a photosensitive material whose refractive index changes and which is insolubilized with light irradiation, a writing light of a wavelength which changes its refractive index and insolubilizes the material, and forming an optical waveguide or refractive index distribution, which does not correspond to writing light power distribution while inducing self-focusing of the writing light, whose power distribution changes during writing process, and insolubilizing the photosensitive material to form a self-organized optical waveguide, wherein the writing light is supplied from an optical device which is connected to the self-organized optical waveguide extending in the direction of light propagation from the optical device.

4. The method of claim 3, wherein a refractive index distribution is formed, and further characterized by subjecting the writing light to intensity modulation upon the formation of the refractive index distribution.

5. An optical coupling method, characterized by situating a photorefractive material whose refractive index changes with light irradiation in the entirety or part of the area between a plurality of optical devices which are arranged with such positioned relations that light-emitting ends of the optical devices are generally opposed to each other, irradiating the photorefractive material with light from one or a plurality of optical devices of a wavelength at which its refractive index changes, and using an optical waveguide or refractive index distribution, which does not correspond to writing light power distribution, formed while inducing self-focusing, of the writing light, whose power distribution changes during writing process, to accomplish optical coupling between the optical devices wherein, when the light of a wavelength which changes the refractive index of said photorefractive material is irradiated from the two or more optical devices to form the waveguide or refractive index distribution, at least two optical devices are provided in such an orientation that the refractive index changes produced by light therefrom exert an additional influence on each other.

6. The method of claim 5, wherein a refractive index distribution is formed, and further characterized by subjecting the writing light to intensity modulation upon the formation of the refractive index distribution.

7. An optical coupling method, characterized by situating a photosensitive material whose refractive index changes and which is insolubilized with light irradiation, in the entirety or part of the area between a plurality of optical devices which are arranged with such positional relations that light-emitting ends of the optical devices are generally opposed to each other, irradiating the photosensitive material with light from one or a plurality of optical devices of a wavelength at which its refractive index changes and the material is insolubilized, and using an optical waveguide or refractive index distribution, which does not correspond to writing light power distribution, formed while inducing self-focusing of the writing light, whose power distribution changes during writing process, and insolubilizing the photosensitive material, to accomplish optical coupling between the optical devices wherein, when the light of a wavelength sensed by said photosensitive material is irradiated from the two or more optical devices to form the waveguide or refractive index distribution, at least two optical devices are provided in such an orientation that the refractive index changes produced by light therefrom exert an additional influence on each other.

8. The method of claim 7, wherein a refractive index distribution is formed, and further characterized by subjecting the writing light to intensity modulation upon the formation of the refractive index distribution.

9. A method of producing an optical device, characterized by irradiating a writing light on a photorefractive material whose refractive index changes with light irradiation, and forming a refractive index distribution, which does not correspond to writing light power distribution, while inducing self-focusing of the writing light, whose power distribution changes during writing process, to form a self-organized optical waveguide, wherein the writing light is supplied from an optical device which is connected to the self-organized optical waveguide extending in the direction of light propagation from the optical device.

10. The method of claim 9, further characterized by subjecting the writing light to intensity modulation upon the formation of the refractive index distribution.

11. A method of producing an optical device, characterized in that a photorefractive material produces a refractive index change by superimposing light of 2 or more wavelengths which is larger than the sum of the refractive index changes produced by the light of each wavelength alone, and upon superimposing the light of 2 or more wavelengths an optical device is formed in the region including the section of superimposition of the light.

12. A method of producing an optical device, characterized by irradiating a writing light on a photosensitive material whose refractive index changes and which is cured and insolubilized with light irradiation, and forming a refractive index distribution, which does not correspond to writing light power distribution, while inducing self-focusing of the writing light. whose power distribution changes during writing process, and insolubilizing the photosensitive material to form a self-organized optical waveguide, wherein the writing light is supplied from an optical device which is connected to the self-organized optical waveguide extending in the direction of light propagation from the optical device.

13. The method of claim 12, further characterized by subjecting the writing light to intensity modulation upon the formation of the refractive index distribution.

14. A method of producing an optical device, characterized in that a photosensitive material produces a refractive index change by superimposing light of 2 or more wavelengths which is larger than the sum of the refractive index changes produced by the light of each wavelength alone, and upon superimposing the light of 2 or more wavelengths an optical device is formed in the region including the section of superimposition of the light.

15. An optical coupling method, characterized by situating a photorefractive material in the entirety or part of the area between a plurality of optical devices and irradiating the photorefractive material with light from one or a plurality of optical devices to impart a refractive index distribution, so that in the optical coupling method which accomplishes coupling between the optical devices, said photorefractive material produces a refractive index change by superimposing light of 2 or more wavelengths which is larger than the sum of the refractive index changes produced by the light of each wavelength alone, and upon superimposing the light of 2 or more wavelengths a waveguide or refractive index distribution is formed in the region including the section of superimposition of the light, and the light of at least one of said 2 or more wavelengths is light emitted from the optical devices, so that the optical coupling between the optical devices is achieved by the formed optical waveguide or refractive index distribution.

16. The method of claim 15, further characterized by subjecting the light to intensity modulation upon the formation of the refractive index distribution.

17. An optical coupling method, characterized by situating a photosensitive material in the entirety or part of the area between a plurality of optical devices and irradiating the photosensitive material with light from one or a plurality of optical devices to impart a refractive index distribution, so that in the optical coupling method which accomplishes coupling between the optical devices, said photosensitive material produces a refractive index change by superimposing light of 2 or more wavelengths which is larger than the sum of the refractive index changes produced by the light of each wavelength alone, and upon superimposing the light of 2 or more wavelengths a waveguide or refractive index distribution is formed in the region including the section of superimposition of the light, and the light of at least one of said 2 or more wavelengths is light emitted from the optical devices, so that the optical coupling between the optical devices is achieved by the formed optical waveguide or refractive index distribution.

18. The method of claim 17, further characterized by subjecting the light to intensity modulation upon the formation of the refractive index distribution.

19. An optical coupling method, characterized by being an optical coupling for coupling of optical devices by situating a photorefractive material in the entirety or part of the area between a plurality of optical devices and irradiating the photorefractive material with light from the optical devices to impart a refractive index distribution, whereby a refractive index distribution which does not correspond to writing light power distribution. is formed by an emitted writing light whose power distribution changes during writing process, from the devices with a small mode field size owing to a self-focusing effect of the emitted writing light to form a self-organized optical waveguide, wherein the writing light is supplied from optical devices which are connected to the self-organized optical waveguide extending in the direction of light propagation from the optical devices.

20. The method of claim 5, further characterized by being an optical coupling for coupling of optical devices by situating a photorefractive material in the entirety or part of the area between a plurality of optical devices and irradiating the photorefractive material with light from the plurality of optical devices to impart a refractive index distribution, whereby the wavelengths of emitted light of at least 2 of the optical devices are different.

21. The method of claim 7, further characterized by being an optical coupling for coupling of optical devices by situating a photosensitive material in the entirety or part of the area between a plurality of optical devices and irradiating the photosensitive material with light from the plurality of optical devices to impart a refractive index distribution, whereby the wavelengths of emitted light of at least 2 of the optical devices are different.

22. An optical coupling method, characterized by providing a photorefractive material on all areas of an optical device or a partial area thereof including a light-emitting end and forming a refractive index distribution, which does not correspond to writing light power distribution, or waveguide in the photorefractive material by light, whose power distribution changes during writing process, emitted from an emitting end of the optical device owing to a self-focusing effect of the emitted light, said refractive index distribution or waveguide extending in the direction of propagation of the emitted light with gradually-increasing diameter.

23. An optical coupling method, characterized by providing a photosensitive material on all areas of an optical device or a partial area thereof including a light-emitting end and forming a refractive index distribution, which does not correspond to writing light power distribution. or waveguide in the photosensitive material by light, whose power distribution changes during writing process, emitted from an emitting end of the optical device owing to a self-focusing effect of the emitted light, said refractive index distribution or waveguide extending in the direction of propagation of the emitted light with gradually increasing diameter.

24. An optical coupling module, characterized by providing a photorefractive material on all areas of a plurality of optical devices or a partial area thereof including light-emitting ends and forming a refractive index distribution, which does not correspond to writing light power distribution, or waveguide in the photorefractive material by light, whose power distribution changes during writing process, emitted from an emitting end of the optical device owing to a self-focusing effect of the emitted light, said refractive index distribution or waveguide extending in the direction of propagation of the emitted light with gradually-increasing diameter.

25. An optical coupling module, characterized by providing a photosensitive material on all areas of a plurality of optical devices or a partial area thereof including a light-emitting end and forming a refractive index distribution, which does not correspond to writing light power distribution, or waveguide in the photosensitive material by light, whose power distribution changes during writing process, emitted from an emitting end of the optical device owing to a self-focusing effect of the emitted light, said refractive index distribution or waveguide extending in the direction of propagation of the emitted light with gradually-increasing diameter.

* * * * *